United States Patent
Kim et al.

(10) Patent No.: US 11,195,836 B2
(45) Date of Patent: Dec. 7, 2021

(54) SEMICONDUCTOR MEMORY DEVICES

(71) Applicant: Samsung Electronics Co., Ltd., Suwon-si (KR)

(72) Inventors: Hui-Jung Kim, Seongnam-si (KR); Min Hee Cho, Suwon-si (KR); Junsoo Kim, Seongnam-si (KR); Taehyun An, Seoul (KR); Dongsoo Woo, Seoul (KR); Yoosang Hwang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 127 days.

(21) Appl. No.: 16/732,925

(22) Filed: Jan. 2, 2020

(65) Prior Publication Data
US 2020/0227418 A1 Jul. 16, 2020

(30) Foreign Application Priority Data
Jan. 11, 2019 (KR) ........................ 10-2019-0003845

(51) Int. Cl.
*H01L 27/108* (2006.01)
*H01L 29/06* (2006.01)
(Continued)

(52) U.S. Cl.
CPC .. *H01L 27/10832* (2013.01); *H01L 21/02603* (2013.01); *H01L 27/108* (2013.01); *H01L 27/10844* (2013.01); *H01L 27/10867* (2013.01); *H01L 27/10873* (2013.01); *H01L 29/0673* (2013.01); *H01L 29/42392* (2013.01); *H01L 29/66742* (2013.01); *H01L 29/78696* (2013.01)

(58) Field of Classification Search
CPC ............. H01L 21/02603; H01L 27/108; H01L 27/10844; H01L 29/0673; H01L 29/78696
See application file for complete search history.

(56) References Cited

U.S. PATENT DOCUMENTS

| | | | |
|---|---|---|---|
| 7,983,065 B2 * | 7/2011 | Samachisa | ......... G11C 13/0007 365/51 |
| 8,378,403 B2 | 2/2013 | Kato | |

(Continued)

FOREIGN PATENT DOCUMENTS

| KR | 10-0324025 | 5/2002 |
|---|---|---|
| KR | 10-0532393 | 4/2006 |

*Primary Examiner* — Victoria K. Hall
(74) *Attorney, Agent, or Firm* — Harness, Dickey & Pierce, P.L.C.

(57) ABSTRACT

A semiconductor memory device includes a stack structure having a plurality of layers vertically stacked on a substrate, each layer including, a first bit line and a gate line extending in a first direction, a first semiconductor pattern extending in a second direction between the first bit line and the gate line, the second direction intersecting the first direction, and a second semiconductor pattern adjacent to the gate line across a first gate insulating layer, the second semiconductor pattern extending in the first direction, a first word line adjacent to the first semiconductor pattern and vertically extending in a third direction from the substrate, a second bit line connected to an end of the second semiconductor pattern and vertically extending in the third direction from the substrate, and a second word line connected to another end of the second semiconductor pattern and vertically extending in the third direction.

20 Claims, 52 Drawing Sheets

(51) Int. Cl.
*H01L 29/423* (2006.01)
*H01L 29/786* (2006.01)
*H01L 29/66* (2006.01)
*H01L 21/02* (2006.01)

(56) References Cited

U.S. PATENT DOCUMENTS

| | | | |
|---|---|---|---|
| 8,501,609 B2* | 8/2013 | Roizin | H01L 27/11578 438/591 |
| 8,503,213 B2* | 8/2013 | Chen | G11C 17/16 365/63 |
| 8,513,725 B2* | 8/2013 | Sakuma | H01L 29/785 257/314 |
| 8,687,416 B2 | 4/2014 | Kurokawa | |
| 8,780,602 B2* | 7/2014 | Lue | H01L 27/11582 365/63 |
| 8,928,149 B2* | 1/2015 | Chen | H01L 21/76838 257/774 |
| 8,951,862 B2* | 2/2015 | Chen | H01L 27/11582 438/258 |
| 8,970,040 B1* | 3/2015 | Chen | H01L 21/76816 257/758 |
| 8,987,914 B2* | 3/2015 | Shih | H01L 27/11582 257/773 |
| 8,993,429 B2* | 3/2015 | Chen | H01L 21/76805 438/599 |
| 9,041,077 B2* | 5/2015 | Chen | H01L 29/40117 257/288 |
| 9,117,526 B2* | 8/2015 | Lai | G11C 16/0483 |
| 9,136,277 B2* | 9/2015 | Lai | H01L 21/76877 |
| 9,202,750 B2* | 12/2015 | Chen | H01L 27/11575 |
| 9,324,728 B2* | 4/2016 | Hu | H01L 27/11578 |
| 9,331,204 B2* | 5/2016 | Lue | H01L 29/7856 |
| 9,343,322 B2* | 5/2016 | Chen | G11C 7/00 |
| 9,349,745 B2* | 5/2016 | Lue | H01L 27/11573 |
| 9,356,037 B2* | 5/2016 | Lee | G11C 16/06 |
| 9,368,507 B2* | 6/2016 | Chen | H01L 27/11556 |
| 9,379,129 B1* | 6/2016 | Lue | H01L 21/26586 |
| 9,455,265 B2* | 9/2016 | Chen | H01L 27/11565 |
| 9,478,259 B1* | 10/2016 | Yeh | H01L 27/11573 |
| 9,490,017 B2* | 11/2016 | Chang | G11C 16/0483 |
| 9,490,249 B2* | 11/2016 | Lue | H01L 21/823871 |
| 9,508,446 B1* | 11/2016 | Chen | G11C 7/04 |
| 9,595,530 B1* | 3/2017 | Zhou | H01L 27/11521 |
| 9,607,702 B2* | 3/2017 | Chang | G11C 16/14 |
| 9,660,107 B1 | 5/2017 | Colinge et al. | |
| 9,711,407 B2* | 7/2017 | Or-Bach | H01L 23/544 |
| 9,741,569 B2* | 8/2017 | Hu | H01L 27/11578 |
| 9,799,761 B2* | 10/2017 | Or-Bach | G11C 11/404 |
| 9,825,042 B2 | 11/2017 | Takemura | |
| 9,859,338 B2* | 1/2018 | Chen | H01L 27/2454 |
| 10,056,131 B2* | 8/2018 | Atsumi | G11C 11/4096 |
| 10,074,576 B2 | 9/2018 | Kato | |
| 10,777,566 B2* | 9/2020 | Lue | H01L 27/0688 |
| 11,088,167 B2* | 8/2021 | Wang | H01L 21/02532 |
| 11,100,958 B2* | 8/2021 | Kim | G11C 8/14 |
| 11,101,283 B2* | 8/2021 | Kim | H01L 27/1157 |
| 2009/0184360 A1* | 7/2009 | Jin | H01L 27/11568 257/319 |
| 2010/0226195 A1* | 9/2010 | Lue | H01L 27/11565 365/230.06 |
| 2012/0007167 A1* | 1/2012 | Hung | H01L 27/0688 257/324 |
| 2012/0051137 A1* | 3/2012 | Hung | H01L 21/76838 365/185.17 |
| 2012/0181580 A1* | 7/2012 | Lue | H01L 27/0688 257/208 |
| 2012/0181654 A1* | 7/2012 | Lue | H01L 21/8221 257/506 |
| 2012/0182801 A1* | 7/2012 | Lue | G11C 11/4097 365/185.05 |
| 2012/0182802 A1* | 7/2012 | Hung | H01L 27/11565 365/185.11 |
| 2012/0182806 A1* | 7/2012 | Chen | H01L 27/11578 365/185.17 |
| 2012/0327714 A1* | 12/2012 | Lue | H01L 27/11578 365/185.17 |
| 2013/0003434 A1* | 1/2013 | Lue | H01L 27/0688 365/51 |
| 2013/0100743 A1* | 4/2013 | Lue | G11C 16/0416 365/185.18 |
| 2013/0176781 A1* | 7/2013 | Hung | G11C 16/04 365/185.05 |
| 2014/0048867 A1* | 2/2014 | Toh | G11C 16/10 257/324 |
| 2014/0054538 A1* | 2/2014 | Park | H01L 45/1253 257/5 |
| 2014/0197469 A1* | 7/2014 | Lee | H01L 27/11556 257/296 |
| 2015/0263173 A1* | 9/2015 | Lue | H01L 29/7851 257/401 |
| 2015/0357342 A1* | 12/2015 | Lee | H01L 27/11582 257/324 |
| 2015/0364196 A1* | 12/2015 | Lin | H01L 21/266 365/185.11 |
| 2016/0049201 A1* | 2/2016 | Lue | G11C 16/16 365/185.11 |
| 2016/0049203 A1* | 2/2016 | Alrod | G06F 11/073 714/2 |
| 2016/0141299 A1* | 5/2016 | Hong | H01L 27/11578 257/324 |
| 2016/0351572 A1* | 12/2016 | Atsumi | G11C 11/4094 |
| 2017/0053906 A1* | 2/2017 | Or-Bach | H01L 27/11578 |
| 2017/0092371 A1* | 3/2017 | Harari | H01L 29/66833 |
| 2017/0117291 A1* | 4/2017 | Or-Bach | H01L 27/11565 |
| 2018/0218765 A1 | 8/2018 | Derner et al. | |
| 2018/0301191 A1* | 10/2018 | Widjaja | H01L 27/11521 |
| 2018/0350823 A1* | 12/2018 | Or-Bach | H01L 27/11529 |
| 2019/0067327 A1* | 2/2019 | Herner | H01L 27/11582 |
| 2019/0103407 A1* | 4/2019 | Kim | H01L 28/86 |
| 2019/0164985 A1* | 5/2019 | Lee | H01L 23/53295 |
| 2019/0206869 A1* | 7/2019 | Kim | H01L 29/45 |
| 2020/0013800 A1* | 1/2020 | Or-Bach | H01L 27/2481 |

* cited by examiner

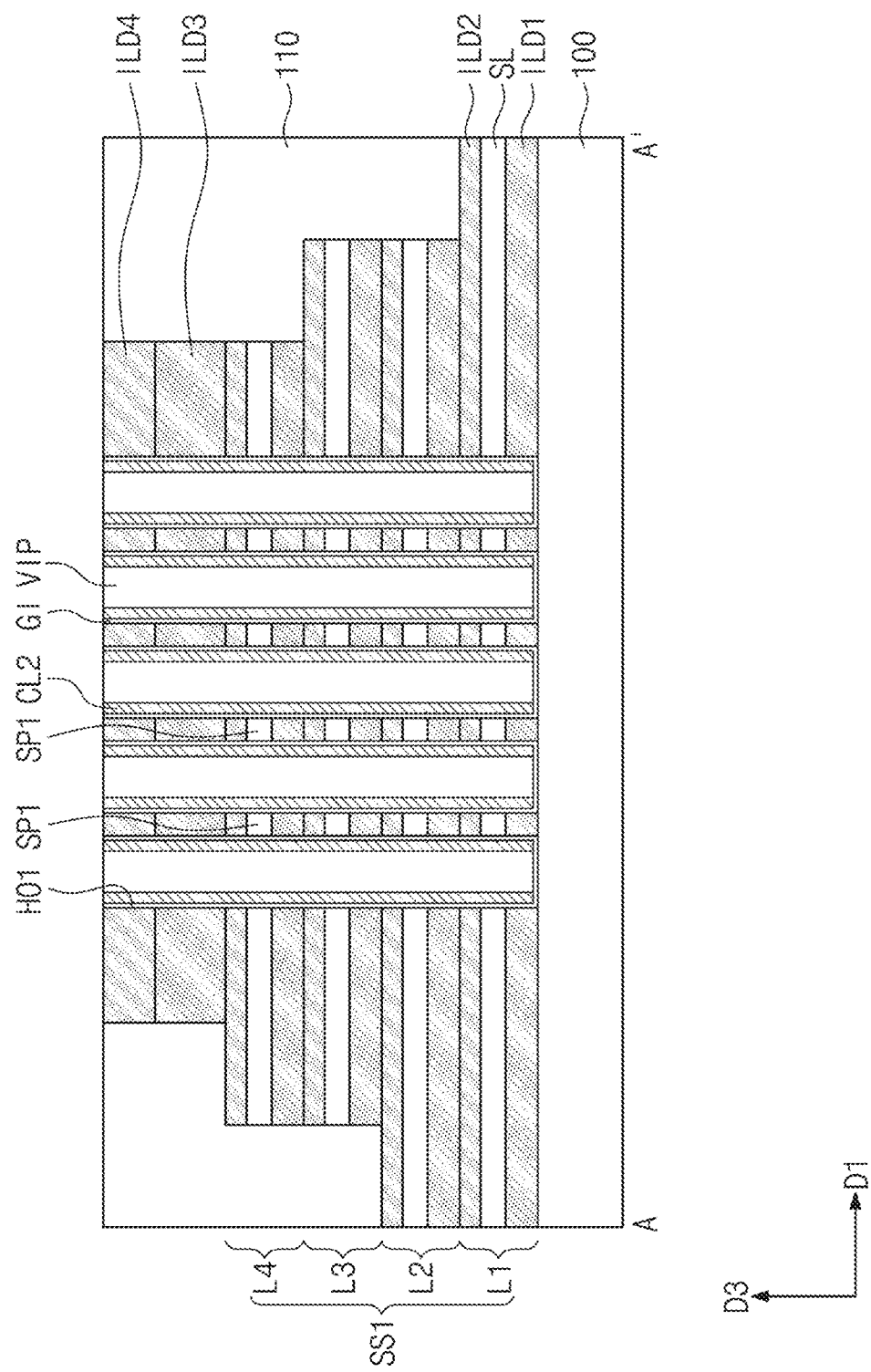

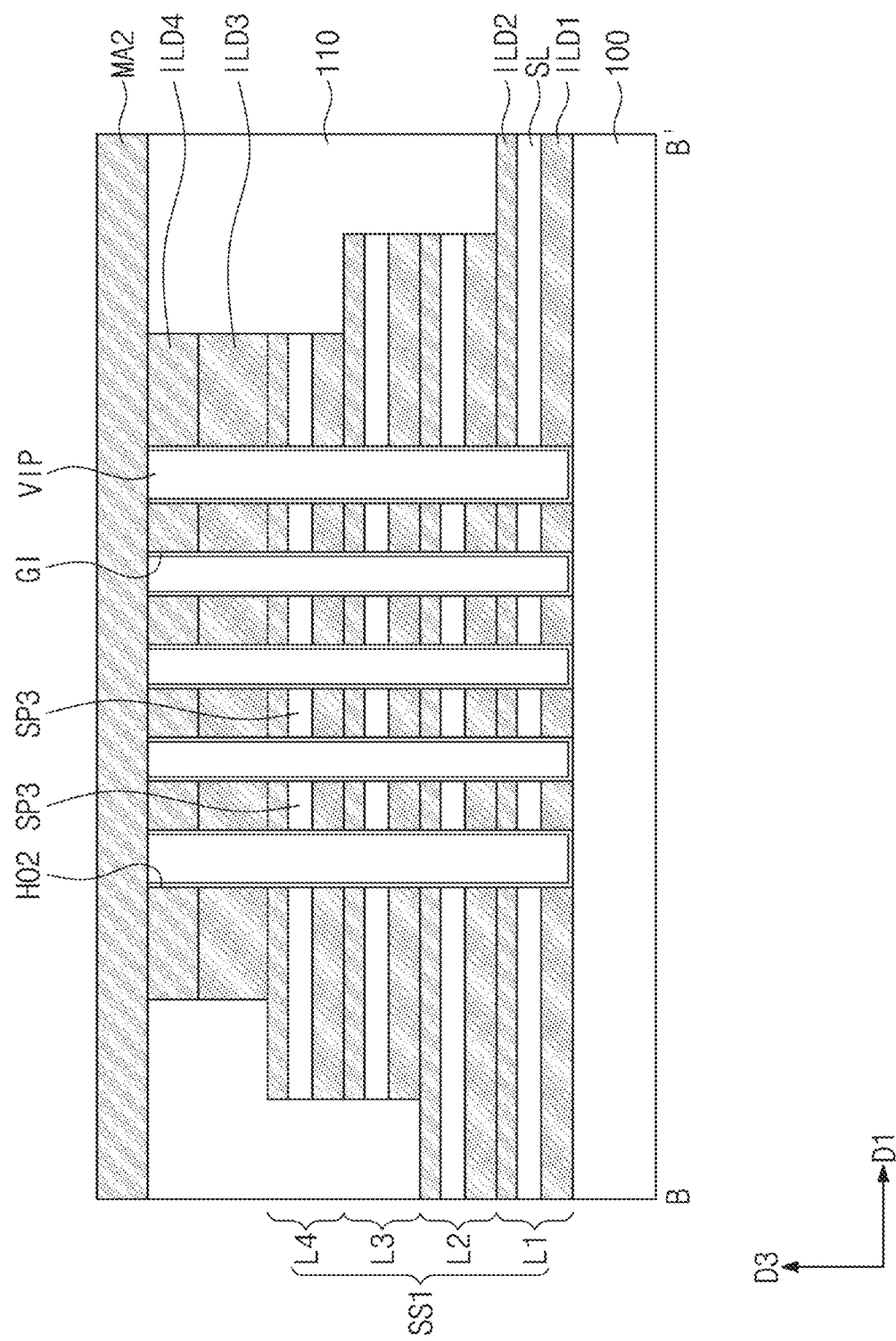

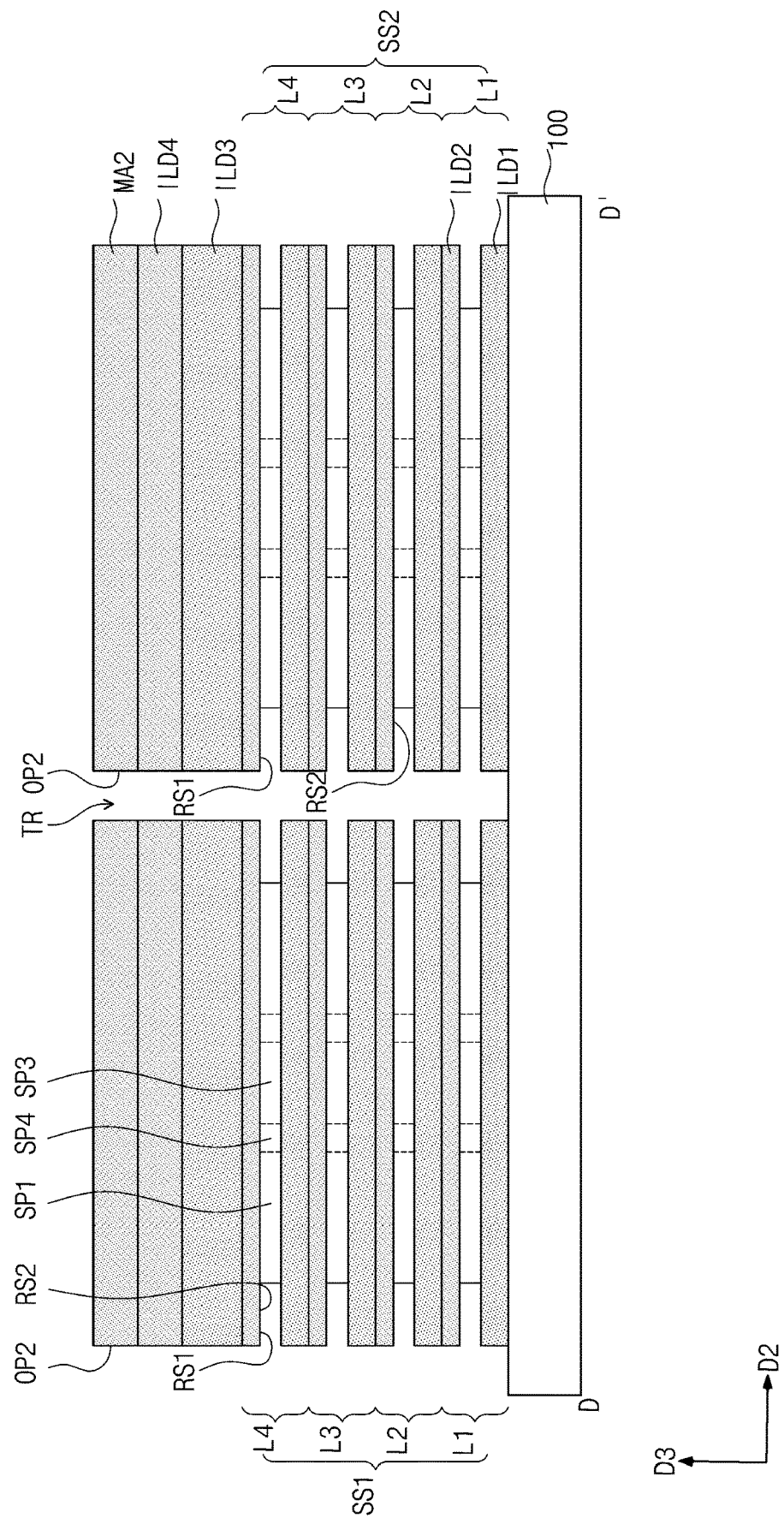

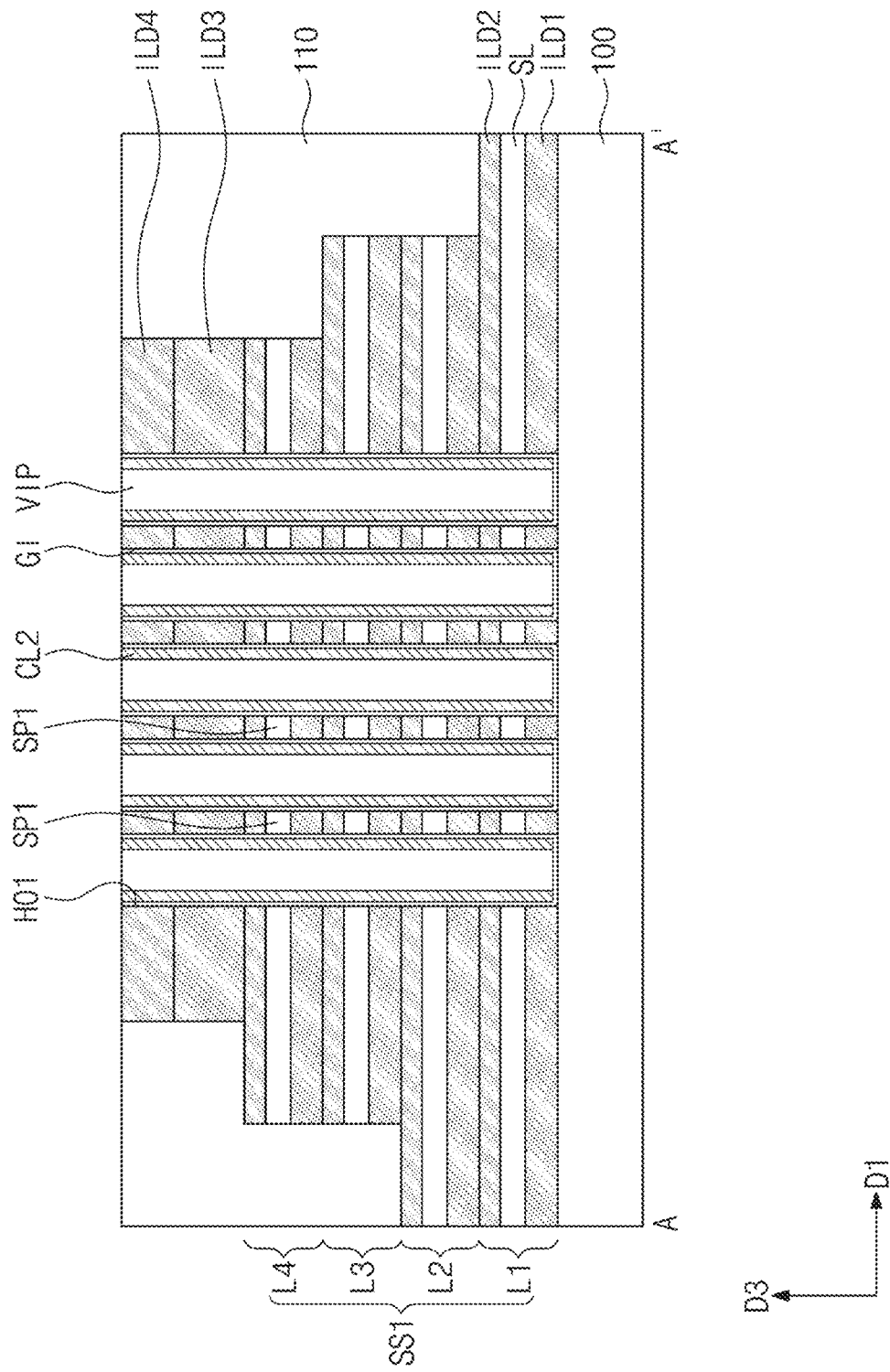

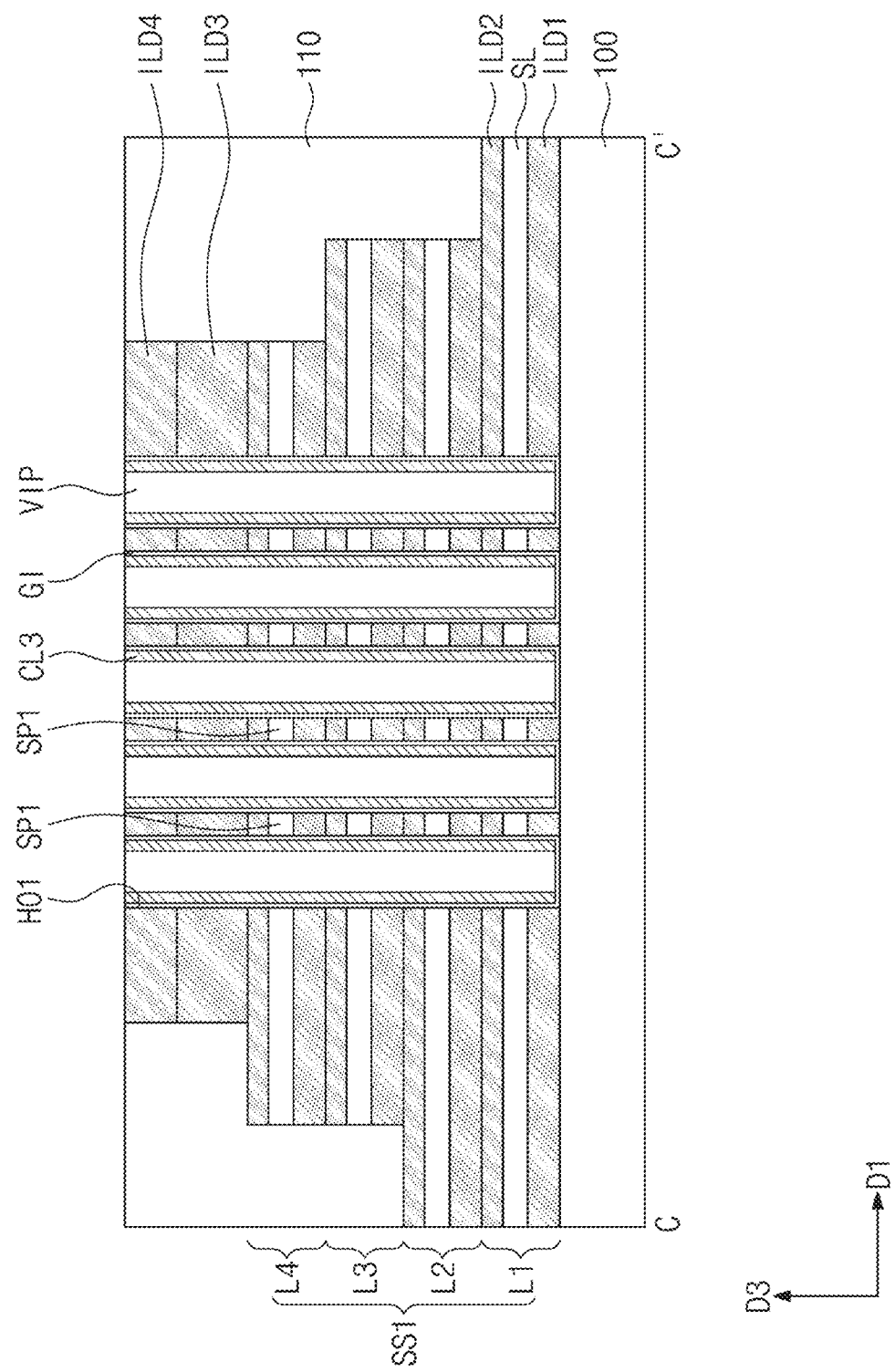

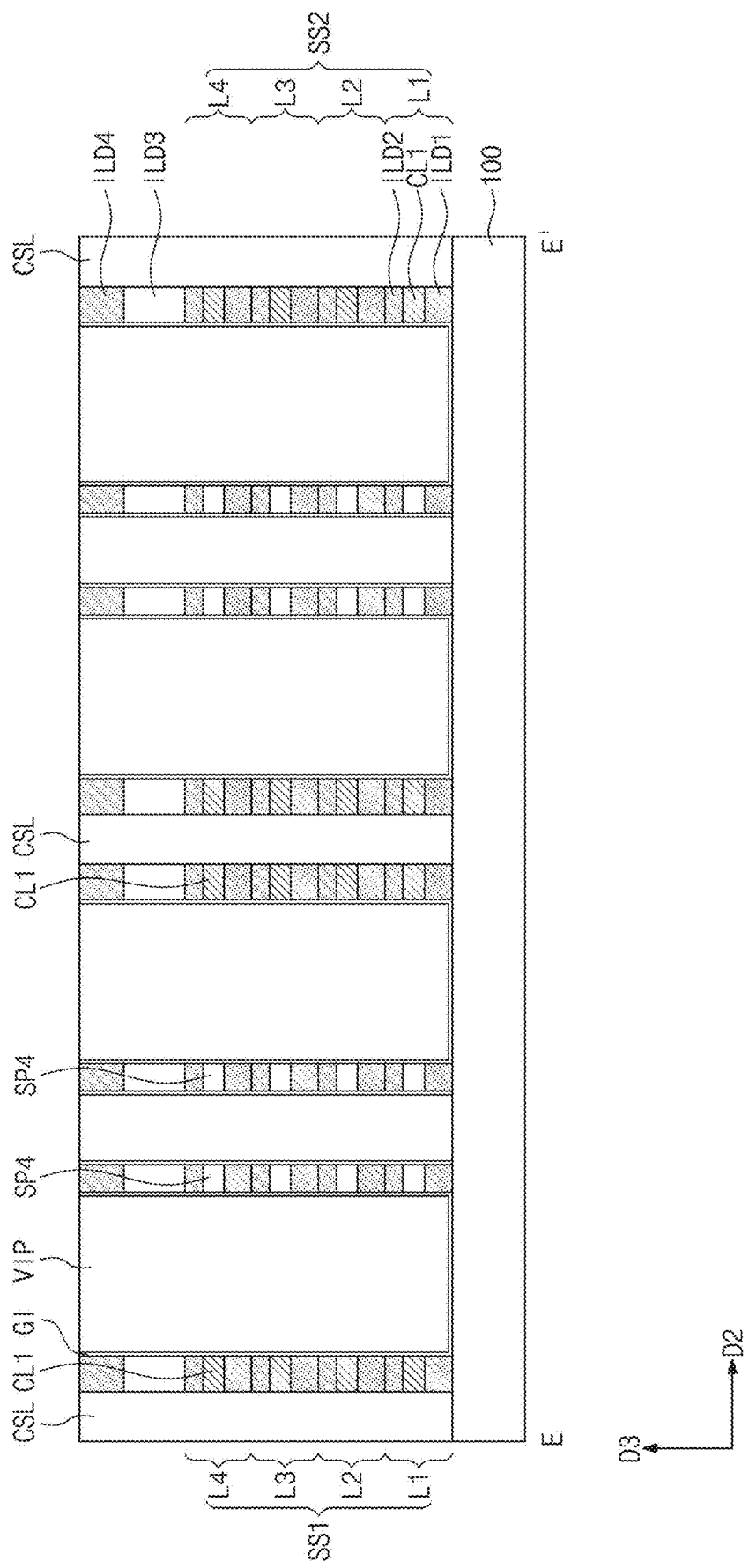

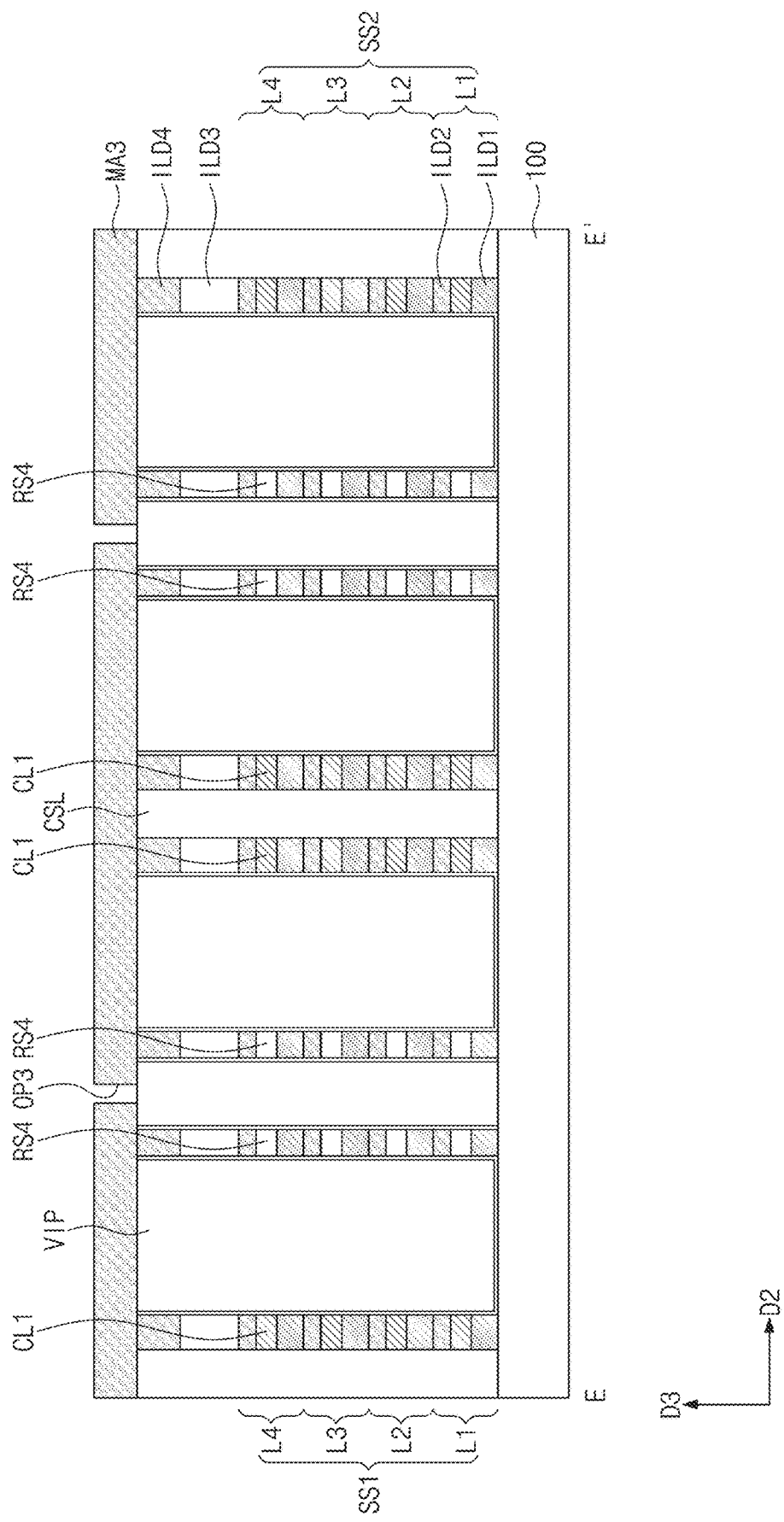

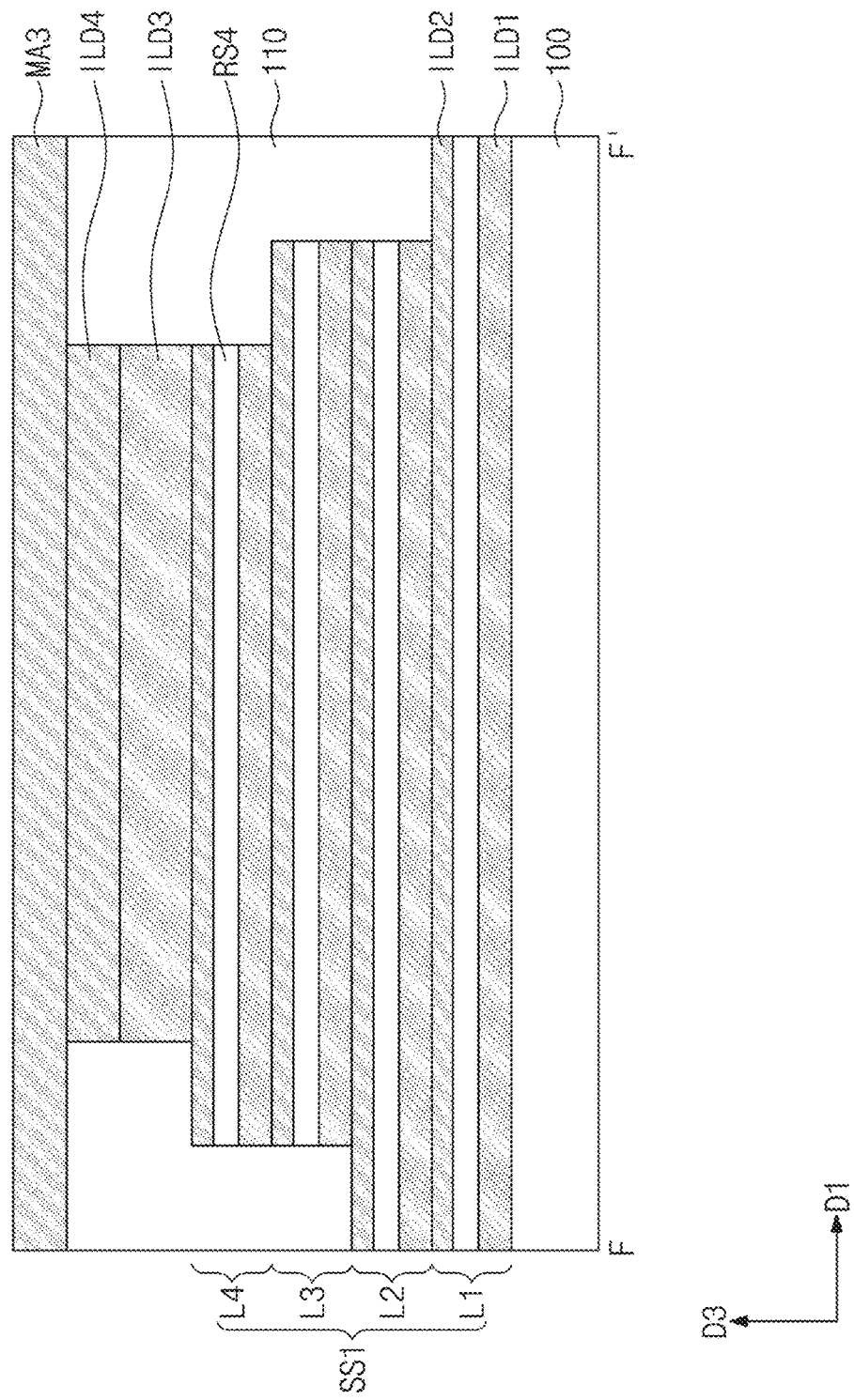

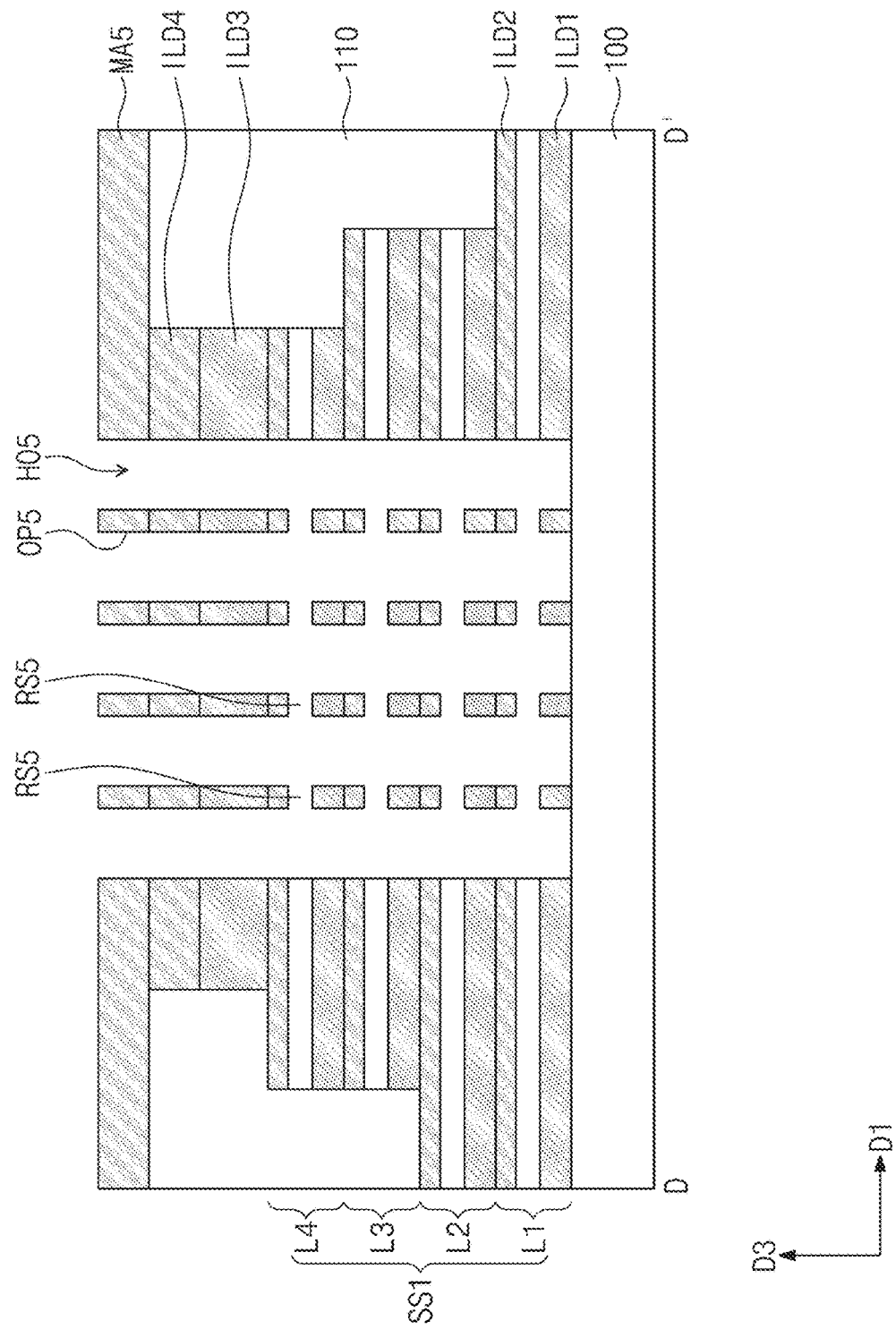

SEMICONDUCTOR MEMORY DEVICES

CROSS-REFERENCE TO RELATED APPLICATION

This U.S. nonprovisional application claims priority under 35 U.S.C § 119 to Korean Patent Application No. 10-2019-0003845 filed on Jan. 11, 2019 in the Korean Intellectual Property Office, the entire contents of which are hereby incorporated by reference herein in its entirety.

BACKGROUND

The some example embodiments relate to semiconductor devices, and more particularly, to three-dimensional semiconductor memory devices with increased integration.

Semiconductor devices have been highly integrated, improving performance and reducing manufacturing costs of semiconductor devices to meet the demands of customers. Since integration density of semiconductor devices is an important factor in determining product price, highly integrated semiconductor devices are increasingly demanded. Integration of typical two-dimensional or planar semiconductor devices is primarily determined by the area occupied by a unit memory cell, such that it is influenced by the level of technology for forming fine patterns. However, the expensive processing equipment used to increase pattern fineness sets a practical barrier on increasing the integration of the two-dimensional or planar semiconductor devices. Therefore, there have been proposed three-dimensional semiconductor memory devices having three-dimensionally arranged memory cells for implementing the highly integrated semiconductor devices without adopting the expensive processing equipment.

SUMMARY

Some example embodiments provide three-dimensional semiconductor memory devices with increased integration.

According to some example embodiments, a semiconductor memory device may include a stack structure including a plurality of layers vertically stacked on a substrate, each of the plurality of layers including, a first bit line extending in a first direction, a gate line extending in the first direction, a first semiconductor pattern extending in a second direction between the first bit line and the gate line, the second direction intersecting the first direction, and a second semiconductor pattern adjacent to the gate line across a first gate insulating layer, the second semiconductor pattern extending in the first direction, a first word line adjacent to a side of the first semiconductor pattern and vertically extending in a third direction from the substrate, the third direction being perpendicular to the first and the second directions, a second bit line connected to a first end of the second semiconductor pattern and vertically extending in the third direction from the substrate, and a second word line connected to a second end of the second semiconductor pattern and vertically extending in the third direction, the second end being opposite to the first end.

According to some example embodiments, a semiconductor memory device may include a stack structure including a plurality of layers vertically stacked on a substrate, each of the plurality of layers including, a first bit line extending in a first direction, a gate line extending in the first direction, a first semiconductor pattern connected to the first bit line and the gate line, and a second semiconductor pattern adjacent to the gate line across a first gate insulating layer, a first word line adjacent to a side of the first semiconductor pattern across a second gate insulating layer, the first word line extending from the substrate, a capacitor electrode adjacent to a contact across a dielectric layer, the capacitor electrode vertically extending from the substrate, the contact connected to the first semiconductor pattern, a second bit line connected to a first end of the second semiconductor pattern and vertically extending from the substrate, and a second word line connected to a second end of the second semiconductor pattern and vertically extending from the substrate, the second end being opposite to the first end.

According to some example embodiments, a semiconductor memory device may include a stack structure including a plurality of layers vertically stacked on a substrate, each of the plurality of layers including, a first conductive line extending in a first direction, a second conductive line extending in the first direction, first semiconductor patterns extending in a second direction between the first and second conductive lines, each of the first semiconductor patterns being disposed in the first direction, the second direction intersecting the first direction, and a second semiconductor pattern adjacent to the second conductive line, each of the second semiconductor patterns disposed in the first direction, third conductive lines between the first and second conductive lines and extending in a third direction from the substrate, the third direction being perpendicular to the first and the second directions, a pair of the third conductive lines provided on opposite sides of one of the first semiconductor patterns therebetween.

BRIEF DESCRIPTION OF THE DRAWINGS

FIGS. 3B, 3C, 3D, 3E, 3F, and 3G illustrate cross-sectional views respectively taken along lines A-A', B-B', C-C', D-D', E-E', and F-F' of FIG. 3A.

FIGS. 4B, 5B, 6B, 7B, 8B, 9B, 10B, and 11B illustrate cross-sectional views taken along line A-A' of FIGS. 4A, 5A, 6A, 7A, 8A, 9A, 10A, and 11A, respectively.

FIGS. 5C, 6C, 7C, 8C, 9C, 10C, and 11C illustrate cross-sectional views taken along line B-B' of FIGS. 5A, 6A, 7A, 8A, 9A, 10A, and 11A, respectively.

FIGS. 7D, 8D, 9D, 10D, and 11D illustrate cross-sectional views taken along line C-C' of FIGS. 7A, 8A, 9A, 10A, and 11A, respectively.

FIGS. 8E, 9E, 10E, and 11E illustrate cross-sectional views taken along line D-D' of FIGS. 8A, 9A, 10A, and 11A, respectively.

FIGS. 8F, 9F, 10F, and 11F illustrate cross-sectional views taken along line E-E' of FIGS. 8A, 9A, 10A, and 11A, respectively.

FIGS. 10G and 11G illustrate cross-sectional views taken along line F-F' of FIGS. 10A and 11A, respectively.

FIGS. 12B, 12C, 12D, and 12E illustrate cross-sectional views respectively taken along lines A-A', B-B', C-C', and D-D' of FIG. 12A.

DETAILED DESCRIPTION

Figure 1:
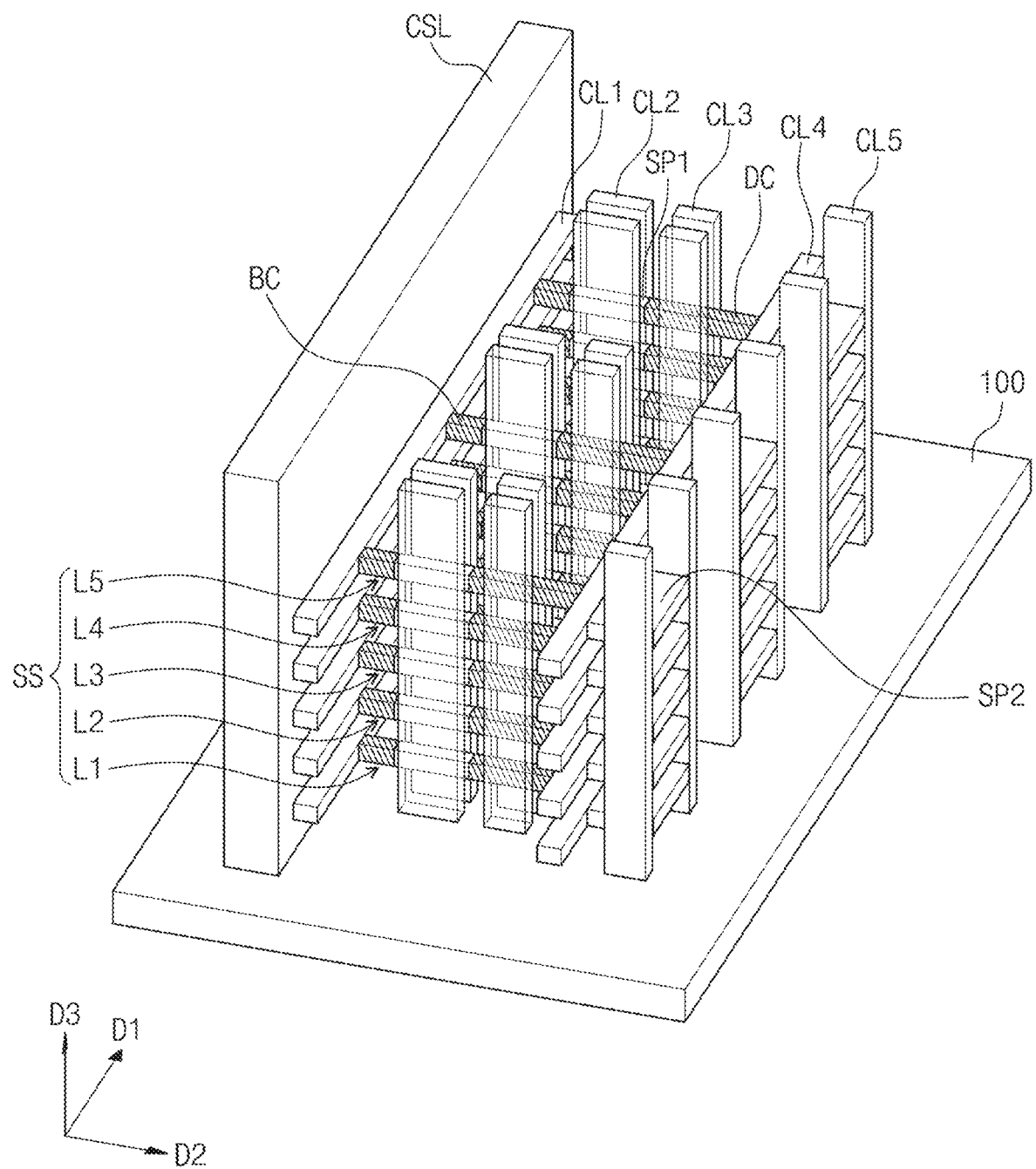
FIG. 1 illustrates a perspective view showing a three-dimensional semiconductor memory device according to some example embodiments.

FIG. 1 illustrates a perspective view showing a three-dimensional semiconductor memory device according to some example embodiments.

Referring to FIG. 1, a three-dimensional semiconductor memory device according to some example embodiments may be a 2 transistor-1 capacitor dynamic random access memory, or 2T-1C DRAM. Of the two transistors, a first transistor of the two transistors and a second transistor may be write transistor. The first transistor may have a source (or drain) connected to a first bit line and also have a gate connected to a first word line. The second transistor may have a source (or drain) connected to a second bit line and also have a drain (or source) connected to a second word line. The drain (or source) of the first transistor may be connected through a storage node to a gate of the second transistor. A capacitor may be connected to the storage node.

In some example embodiments, a cell array of the three-dimensional semiconductor memory device may include a stack structure SS. The stack structure SS may be provided on a substrate 100. The substrate 100 may be a single crystalline silicon substrate, a single crystalline germanium substrate, and/or a single crystalline silicon-germanium substrate.

The stack structure SS may include a plurality of first conductive lines CL1, a plurality of second conductive lines CL2, a plurality of first semiconductor patterns SP1, a plurality of third conductive lines CL3, a plurality of fourth conductive lines CL4, a plurality of second semiconductor patterns SP2, and/or a plurality of fifth conductive lines CL5.

The stack structures SS may include first, second, third, fourth, and/or fifth layers L1, L2, L3, L4, and/or L5. The first, second, third, fourth, and/or fifth layers L1, L2, L3, L4, and/or L5 of the stack structure SS may be stacked spaced in a vertical direction (e.g., a third direction D3). Each of the first, second, third, fourth, and/or fifth layers L1, L2, L3, L4, and/or L5 may include a plurality of first semiconductor patterns SP1, a plurality of second semiconductor patterns SP2, one first conductive line CL1, and/or one fourth conductive line CL4.

The first layer L1, which is selected as a representative from the first to fifth layers L1 to L5, may be configured such that the first semiconductor layers SP1 are arranged spaced apart from each other in a first direction D1. The first semiconductor patterns SP1 of the first layer L1 may extend in a second direction D2 intersecting the first direction D1. The first semiconductor patterns SP1 of the first layer L1 may be located at the same first level or a similar first level(s). The first semiconductor patterns SP1 of the first layer L1 may include a semiconductor material. For example, the semiconductor material may include one or more of silicon, germanium, silicon-germanium, and/or indium gallium zinc oxide (IGZO). Each of the first semiconductor patterns SP1 of the first layer L1 may include impurity regions and a channel between the impurity regions. The first semiconductor patterns SP1 of the first layer L1 may be semiconductor patterns included in a first transistor of the 2T-1C DRAM.

The first conductive line CL1 of the first layer L1 may extend in the first direction D1. The first conductive line CL1 of the first layer L1 may be connected (e.g., electrically connected) through bit contacts BC to the first semiconductor patterns SP1 of the first layer L1. The first conductive line CL1 of the first layer L1 may be located at the first level. The first conductive line CL1 of the first layer L1 may include a conductive material. For example, the conductive material may include one or more of doped semiconductors (doped silicon, doped germanium, etc.), conductive metal nitrides (titanium nitride, tantalum nitride, etc.), metals (tungsten, titanium, tantalum, etc.), and/or metal-semiconductor compounds (tungsten silicide, cobalt silicide, titanium silicide, etc.). The first conductive line CL1 of the first layer L1 may be a first bit line of the 2T-1C DRAM.

The second semiconductor patterns SP2 of the first layer L1 may be arranged spaced apart from each other in the first direction D1. The second semiconductor patterns SP2 of the first layer L1 may extend in the first direction D1. The second semiconductor patterns SP2 of the first layer L1 may be located at the first level. The second semiconductor patterns SP2 of the first layer L1 may include a semiconductor material. Each of the second semiconductor patterns SP2 of the first layer L1 may include impurity regions and a channel between the impurity regions. The second semiconductor patterns SP2 of the first layer L1 may be semiconductor patterns included in a second transistor of the 2T-1C DRAM.

The fourth conductive line CL4 of the first layer L1 may extend in the first direction D1. The fourth conductive line CL4 of the first layer L1 may be connected (e.g., electrically connected) through drain contacts DC of the first layer L1 to the first semiconductor patterns SP1 of the first layer L1. The fourth conductive line CL4 of the first layer L1 may be located at the first level. The fourth conductive line CL4 of the first layer L1 may be placed between the first and second semiconductor patterns SP1 and SP2 of the first layer L1. The fourth conductive line CL4 of the first layer L1 may include a conductive material. The fourth conductive line CL4 of the first layer L1 may be a gate line of the 2T-1C DRAM.

Turning back to the discussion of the stack structure SS, the first semiconductor patterns SP1 in one stack structure SS may be spaced apart from each other in a vertical direction (e.g., the third direction D3). The second semiconductor patterns SP2 in one stack structure SS may be spaced apart from each other in a vertical direction (e.g., the third direction D3). The first conductive lines CL1 in one stack structure SS may be spaced apart from each other in a vertical direction (e.g., the third direction D3). The fourth conductive lines CL4 in one stack structure SS may be spaced apart from each other in a vertical direction (e.g., the third direction D3).

The second conductive lines CL2 may extend in a vertical direction (e.g., the third direction D3). The second conductive lines CL2 may be spaced apart from each other in the first direction D1. A pair of second conductive lines CL2 may be provided spaced apart from each other in the first direction D1 across the first semiconductor patterns SP1. The second conductive lines CL2 may be word lines of the first semiconductor patterns SP1. The second conductive lines CL2 may include a conductive material. The second conductive line CL2 may be a first word line of the 2T-1C DRAM.

The third conductive lines CL3 may extend in a vertical direction (e.g., the third direction D3). The third conductive lines CL3 may be spaced apart from each other in the first direction D1. A pair of third conductive lines CL3 may be provided spaced apart from each other in the first direction D1 across the drain contacts DC. The third conductive lines CL3 may include one or more of a metallic material, a metal nitride layer, and/or a metal silicide layer. For example, the third conductive lines CL3 may include a refractory metal layer, such as a cobalt layer, a titanium layer, a nickel layer, a tungsten layer, and/or a molybdenum layer. The third conductive lines CL3 may include a metal nitride layer, such as a titanium nitride layer, a titanium silicon nitride layer, a titanium aluminum nitride layer, a tantalum nitride layer, a tantalum silicon nitride layer, a tantalum aluminum nitride layer, and/or a tungsten nitride layer. The third conductive lines CL3 may include a noble metal layer containing at least one selected from the group consisting of platinum (Pt), ruthenium (Ru), and/or iridium (Ir). The third conductive lines CL3 may include a conductive noble metal oxide layer, such as PtO, $RuO_2$, and/or $IrO_2$. The third conductive lines CL3 may include a conductive oxide layer, such as SRO ($SrRuO_3$), BSRO(($Ba,Sr)RuO_3$), CRO($CaRuO_3$), and/or LSCo. The conductive line CL3 may be a capacitor electrode of the 2T-1C DRAM. A dielectric layer (not shown) may be interposed between the third conductive line CL3 and the drain contact DC.

The fifth conductive lines CL5 may extend in a vertical direction (e.g., the third direction D3). The fifth conductive lines CL5 may be spaced apart from each other in the first direction D1. A pair of fifth conductive lines CL5 may be provided spaced apart from each other in the first direction D1 across the second semiconductor patterns SP2. The fifth conductive lines CL5 may include a conductive material. One of the pair of fifth conductive lines CL5 may be a second bit line of the 2T-1C DRAM. The other of the pair of fifth conductive lines CL5 may be a second word line of the 2T-1C DRAM. The second bit line may be connected to a first end of the second semiconductor pattern SP2, and the second word line may be connected to a second end of the second semiconductor pattern SP2, which second end is opposite to the first end.

One first semiconductor pattern SP1 may be disposed between one first conductive line CL1 and two second conductive lines CL2. A first gate insulating layer (not shown) may be interposed between the first semiconductor pattern SP1 and the second conductive line CL2. One second semiconductor pattern SP2 may be disposed between one fourth conductive line CL4 and two fifth conductive lines CL5. A second gate insulating layer (not shown) may be interposed between the second semiconductor pattern SP2 and the fourth conductive line CL4.

The substrate 100 may be provided thereon with a common source line CSL that extends in the first direction D1 along one lateral surface of the stack structure SS. One ends of the first semiconductor patterns SP1 (e.g., one end of each of the first semiconductor patterns SP1) may be coupled to the common source line CSL through the bit contacts BC and the first conductive lines CL1. The common source line CSL may include a conductive material.

Although not shown, a dielectric material may fill empty spaces in the stack structure SS. The dielectric material may include, for example, one or more of a silicon oxide layer, a silicon nitride layer, and/or a silicon oxynitride layer.

Although not shown, a plurality of stack structures SS may be included in the three-dimensional semiconductor memory device according to some example embodiments. The plurality of stack structures SS may be arranged in the second direction D2. A pair of stack structures SS may be mirror-symmetrical to each other about the common source line CSL.

Figure 2:
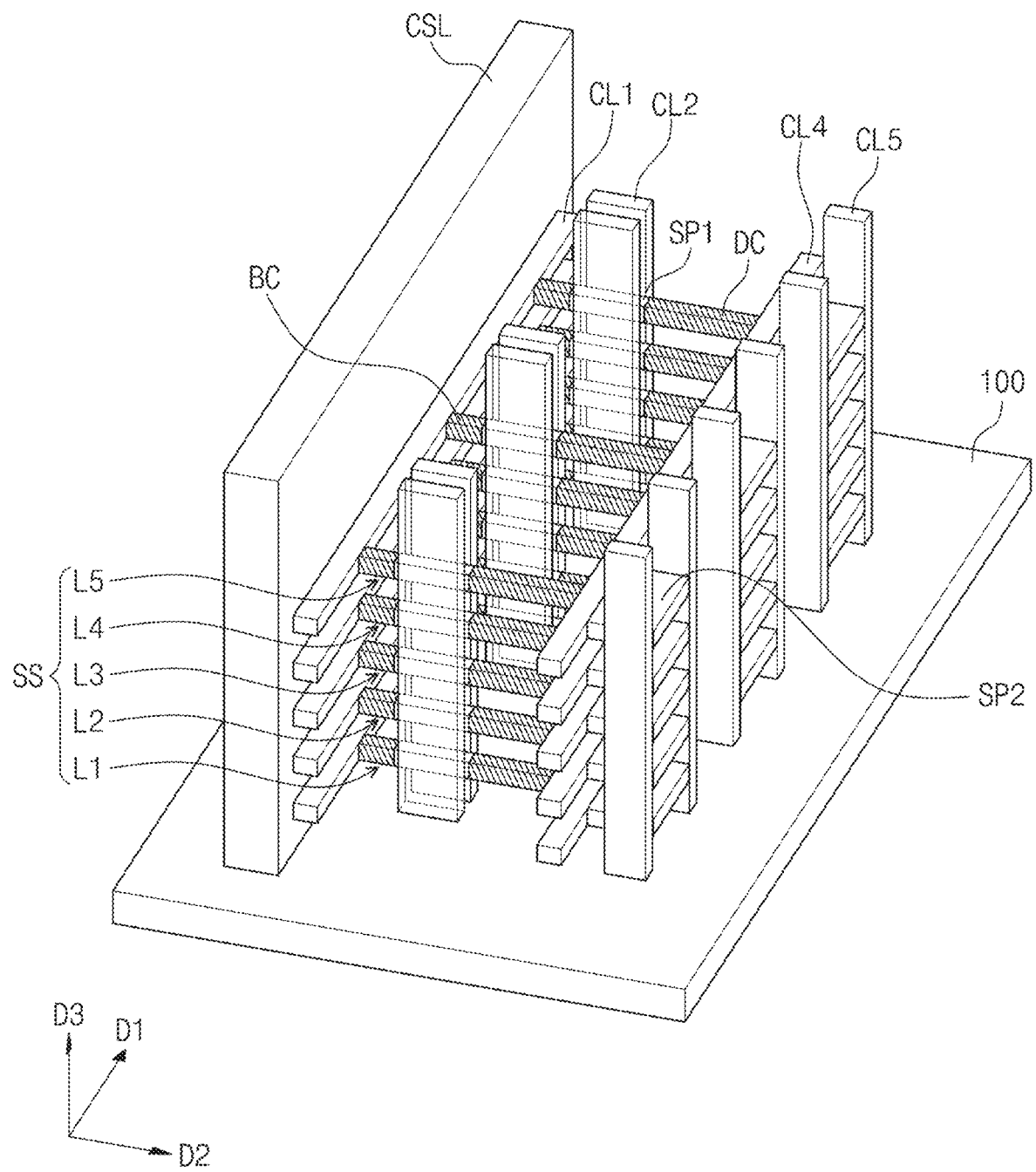
FIG. 2 illustrates a perspective view showing a three-dimensional semiconductor memory device according to some example embodiments.

FIG. 2 illustrates a perspective view showing a three-dimensional semiconductor memory device according to some example embodiments. In the discussion that follows, a detailed description of technical features repetitive to those discussed above with reference to FIG. 1 will be omitted, and a difference thereof will be discussed in detail.

Referring to FIG. 2, a three-dimensional semiconductor memory device according to some example embodiments may include a cell array consisting of a stack structure SS. The stack structures SS according to the illustrated example may correspond to the stack structure SS devoid of the third conductive lines CL3 as discussed in association with FIG. 1.

Figure 3A:
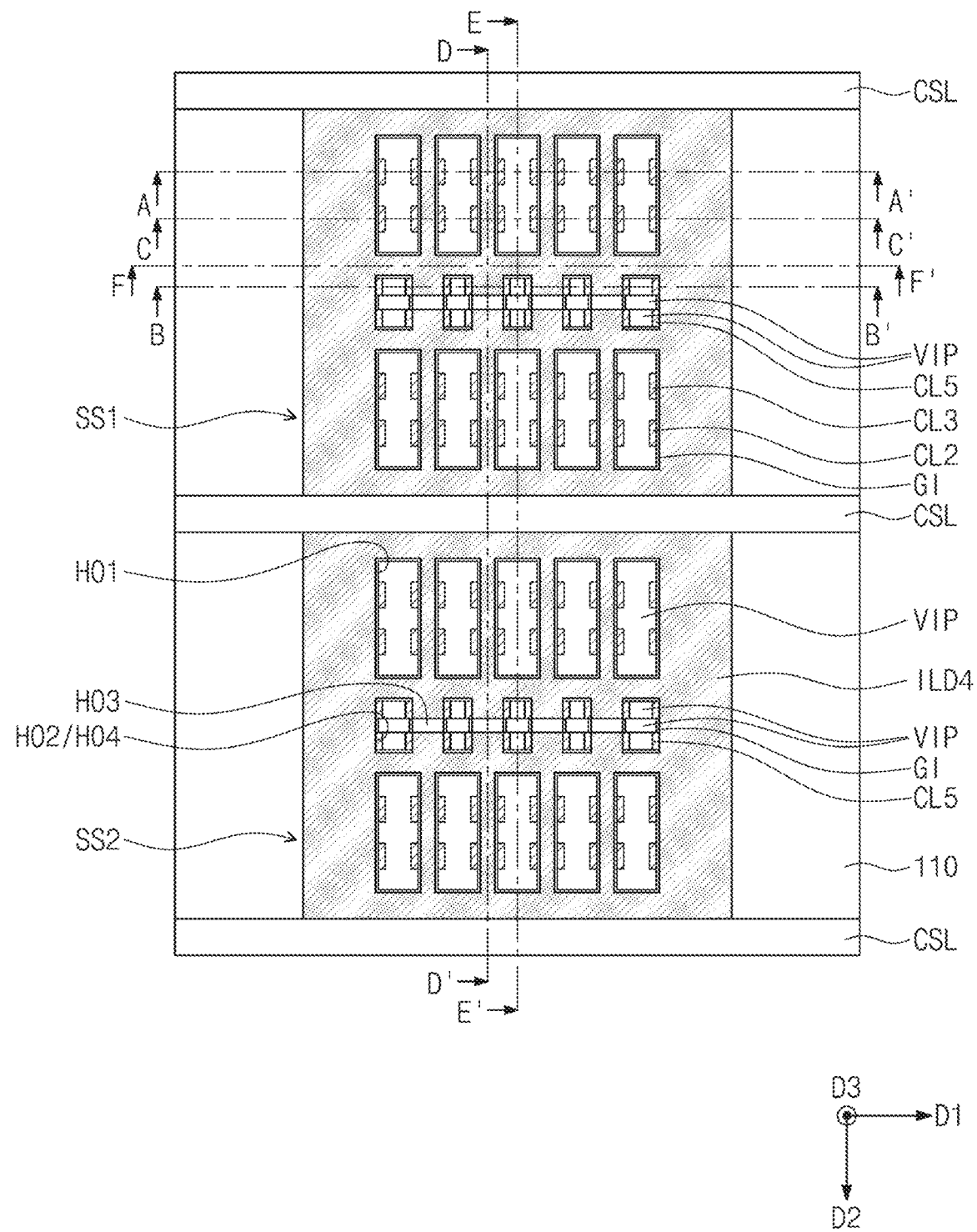
FIG. 3A illustrates a plan view showing a three-dimensional semiconductor memory device according to some example embodiments.
Figure 3C:
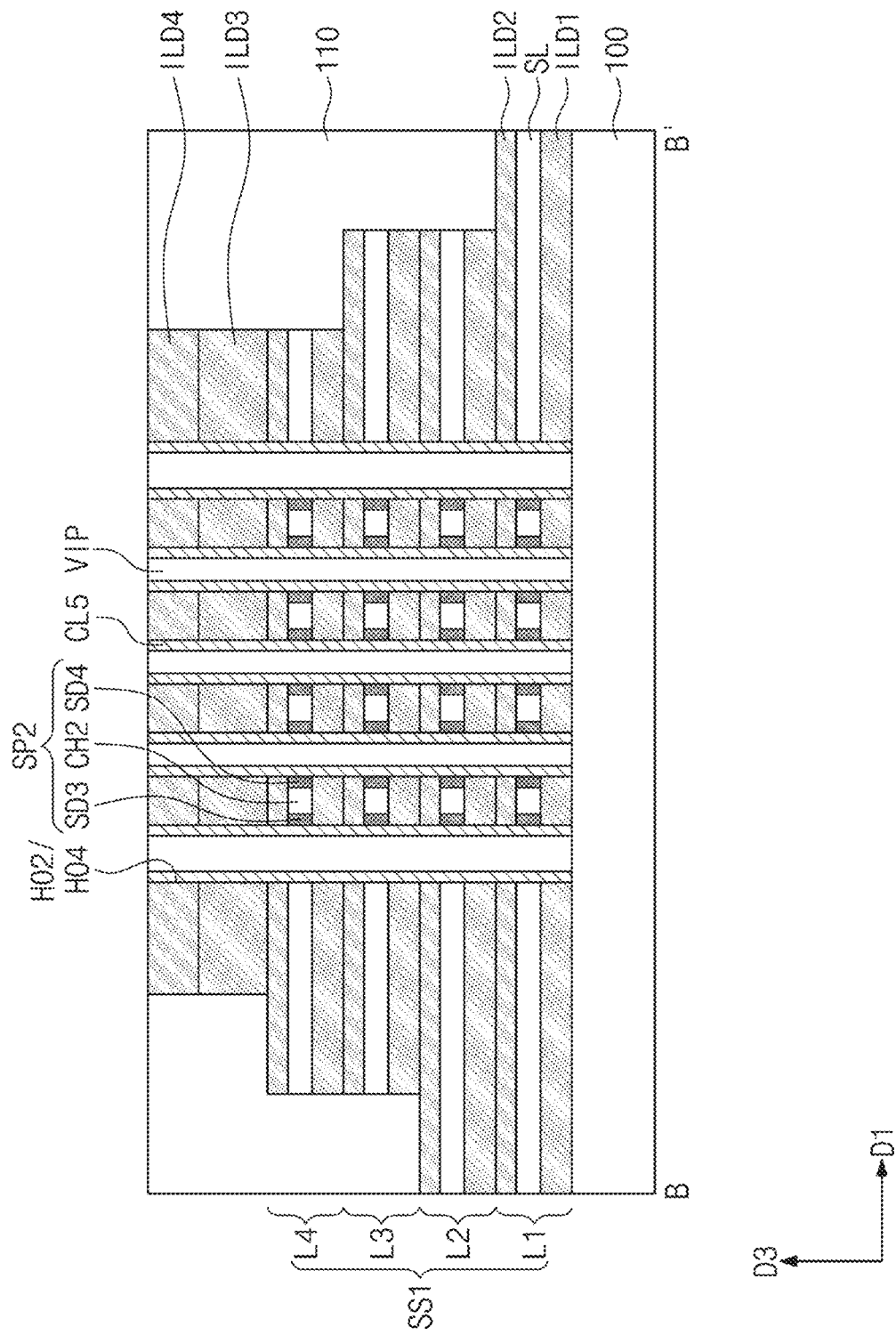
Figure 3D:
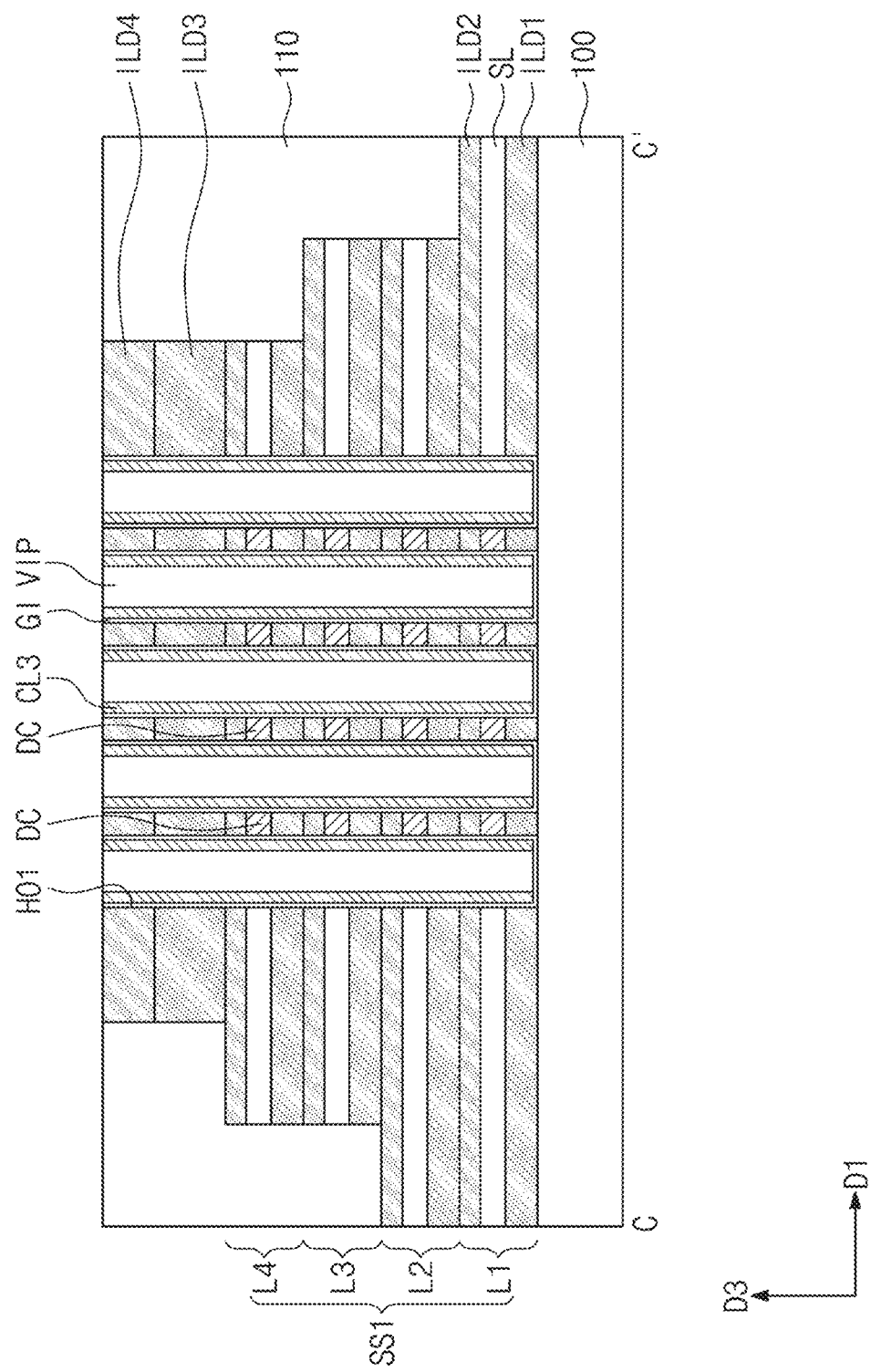
Figure 3E:
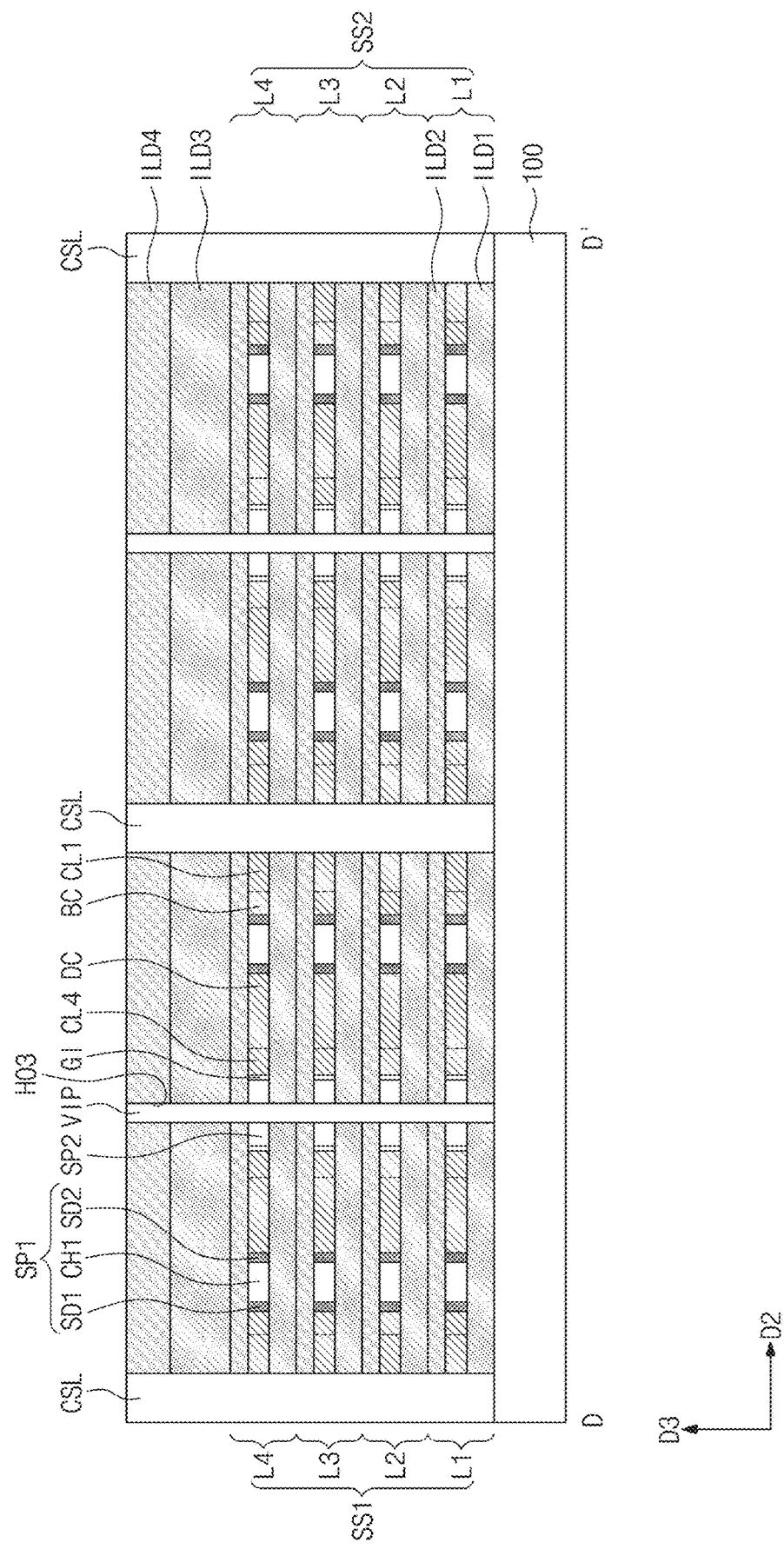
Figure 3F:
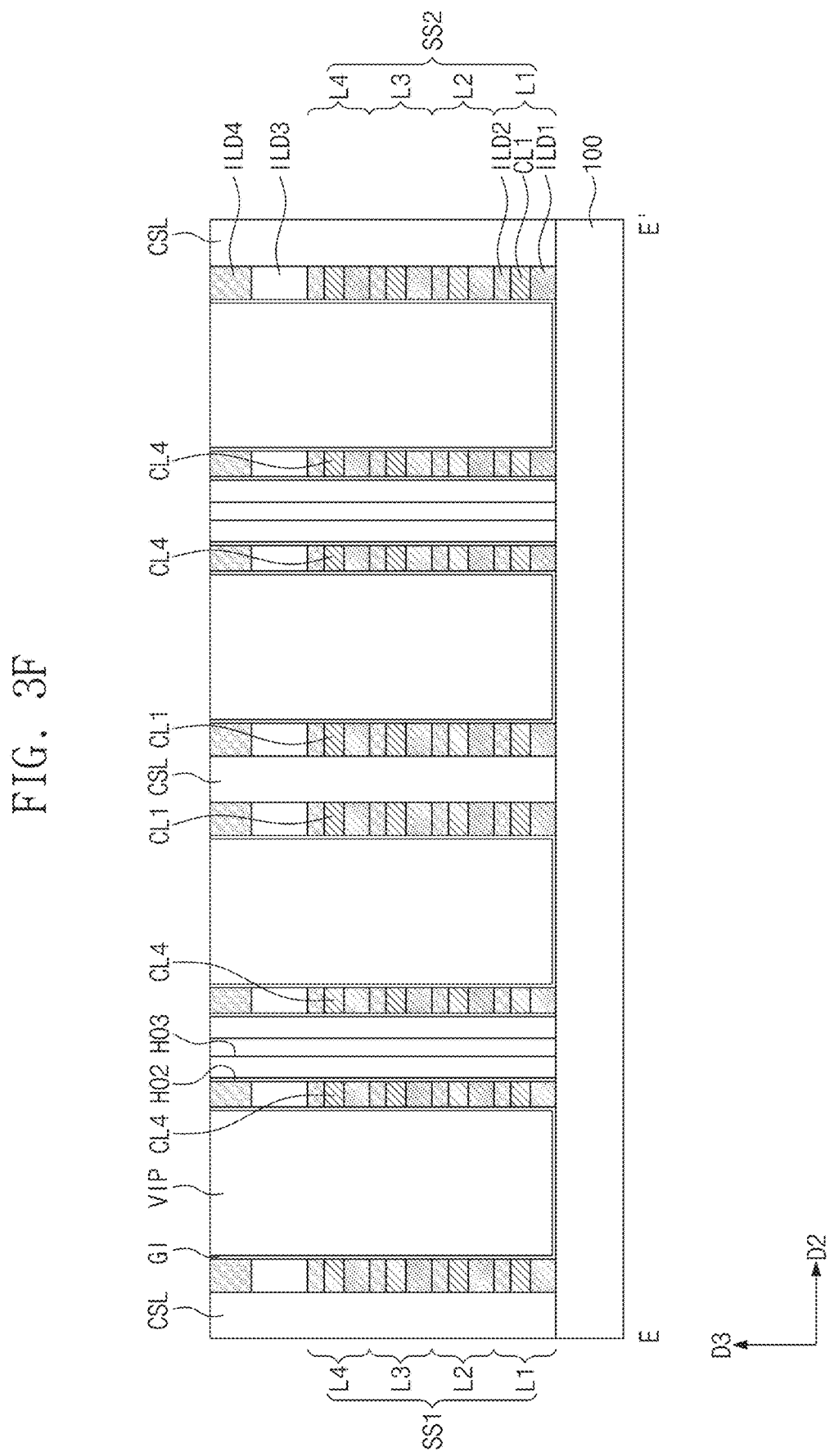
Figure 3G:
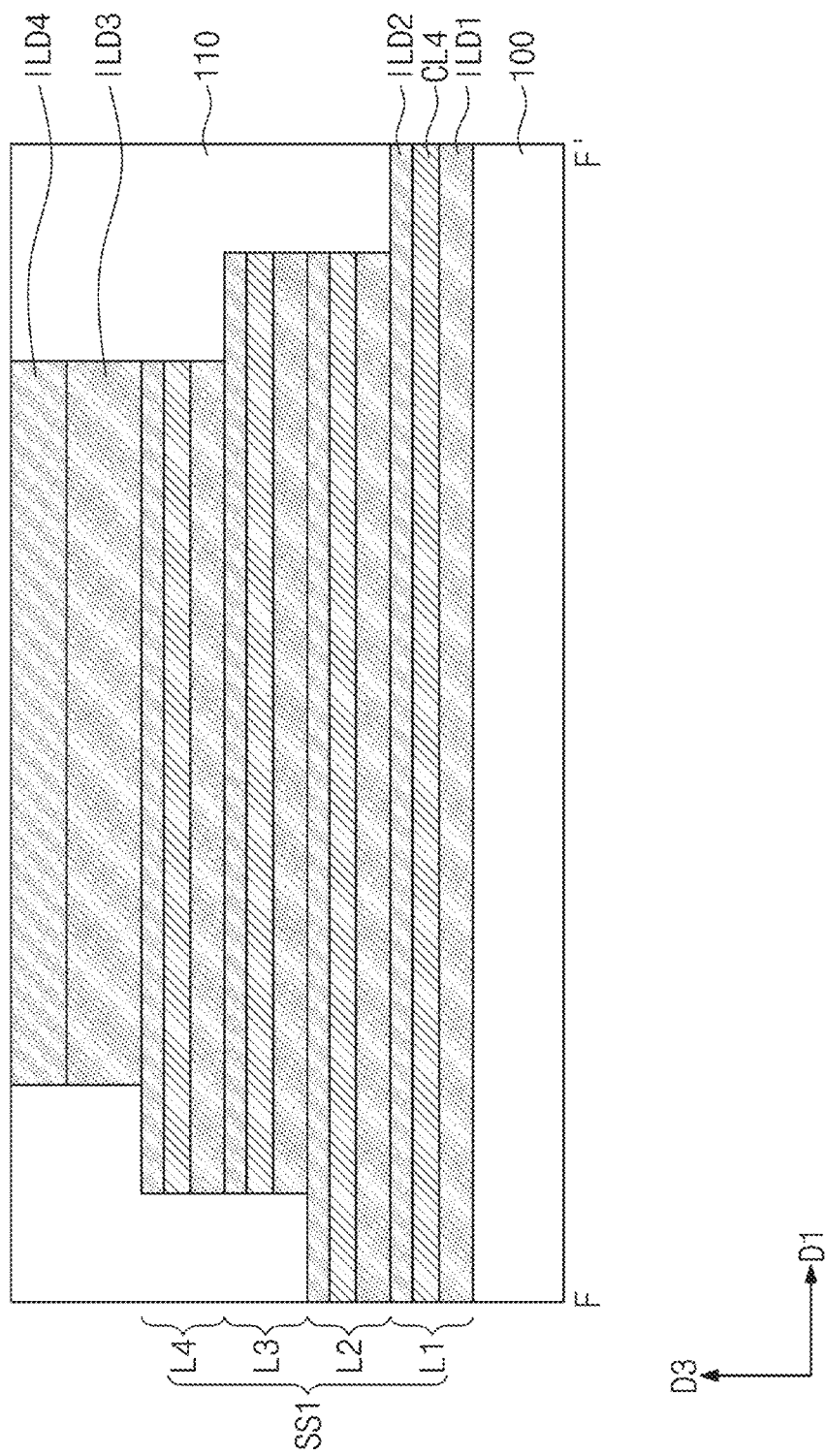

FIG. 3A illustrates a plan view showing a three-dimensional semiconductor memory device according to some example embodiments. FIGS. 3B, 3C, 3D, 3E, 3F, and 3G illustrate cross-sectional views respectively taken along lines A-A', B-B', C-C', D-D', E-E', and F-F' of FIG. 3A. In the discussion that follows, a detailed description of technical features repetitive to those discussed above with reference to FIG. 1 will be omitted, and a difference thereof will be discussed in detail.

Referring to FIGS. 3A, 3B, 3C, 3D, 3E, 3F, and 3G, a plurality of stack structures SS1 and SS2 may be provided on a substrate 100. The stack structures SS1 and SS2 may include a first stack structure SS1 and a second stack structure SS2. The first and second stack structures SS1 and SS2 may extend in a first direction D1. The first and second stack structures SS1 and SS2 may be arranged spaced apart from each other in a second direction D2.

Each of the first and second stack structures SS1 and SS2 may be provided with common source lines CSL on opposite sides thereof. One common source line CSL may be interposed between the first and second stack structures SS1 and SS2. The common source lines CSL may extend in the first direction D1 along the first and second stack structures SS1 and SS2.

Each of the first and second stack structures SS1 and SS2 may include first, second, third, and/or fourth layers L1, L2, L3, and/or L4 sequentially stacked on the substrate 100. Each of the first, second, third, and/or fourth layers L1, L2, L3, and/or L4 may include a first insulating layer ILD1, a semiconductor layer SL, and/or a second insulating layer ILD2. The first insulating layer ILD1, the semiconductor layer SL, and/or the second insulating layer ILD2 may be sequentially stacked. The first and second insulating layers ILD1 and ILD2 may vertically separate the semiconductor layer SL therebetween from other semiconductor layers SL.

Each of the first, second, third, and/or fourth layers L1, L2, L3, and/or L4 may further include a first conductive line CL1 extending in the first direction D1. For example, each of the first, second, third, and/or fourth layers L1, L2, L3, and/or L4 may include two first conductive lines CL1 spaced apart from each other in the second direction D2. The first conductive line CL1 may be located at the same level or a similar level as that of the semiconductor layer SL. The first conductive line CL1 may be disposed between the first and second insulating layers ILD1 and ILD2. The first conductive line CL1 may be disposed adjacent to the common source line CSL.

Each of the first, second, third, and/or fourth layers L1, L2, L3, and/or L4 may further include a fourth conductive line CL4 extending in the first direction D1. For example, each of the first, second, third, and/or fourth layers L1, L2, L3, and/or L4 may include two fourth conductive lines CL4 spaced apart from each other in the second direction D2. The fourth conductive line CL4 may be located at the same level or a similar level as that of the semiconductor layer SL. The fourth conductive line CL4 may be disposed between the first and second insulating layers ILD1 and ILD2. For example, two fourth conductive lines CL4 of the first layer L1 included in the first stack structure SS1 may be disposed between two first conductive lines CL1 of the first layer CL1 included in the first stack structure SS1.

The semiconductor layer SL may include a semiconductor material. The first and second insulating layers ILD1 and ILD2 may include different dielectric materials from each other. The first and second insulating layers ILD1 and ILD2 may independently include one or more of a silicon oxide layer, a silicon nitride layer, a silicon oxynitride layer, a carbon-containing silicon oxide layer, a carbon-containing silicon nitride layer, and/or a carbon-containing silicon oxynitride layer. For example, the first insulating layer ILD1 may be a carbon-containing silicon oxide layer (e.g., SiOC), and the second insulating layer ILD2 may be a silicon nitride layer (e.g., SiN).

Each of the first and second stack structures SS1 and SS2 may be configured such that one end of each of the second and third layers L2 and L3 may protrude more in the first direction D1 than one end of the fourth layer L4. The one end of the second layer L2 and the one end of the third layer L3 may be vertically aligned with each other (e.g., protrude the same amount or a similar amount in the first direction D1). One end of the first layer L1 may protrude more in the first direction D1 than the one end of each of the second and third layers L2 and L3. Other ends of each of the first and second layers L1 and L2 may protrude more in an opposite direction to the first direction D1 than other ends of each of the third and fourth layers L3 and L4. The other end of the first layer L1 and the other end of the second layer L2 may be vertically aligned with each other. The other end of the third layer L3 and the other end of the fourth layer L4 may be vertically aligned with each other.

A first hole HO1 may be provided to penetrate each of the first and second stack structures SS1 and SS2. Each of the semiconductor layers SL may include first semiconductor patterns SP1 defined by the first hole HO1.

Each of the first semiconductor patterns SP1 may include a first channel CH1, a first impurity region SD1, and a second impurity region SD2. The first channel CH1 may be interposed between the first and second impurity regions SD1 and SD2. The first semiconductor patterns SP1 may extend in the second direction D2 intersecting the first direction D1.

Each of the first semiconductor patterns SP1 may be connected through a bit contact BC (e.g., via an electrical connection to the first impurity region SD1) to the first conductive line CL1. The bit contact BC may be disposed between the first holes HO1. The bit contact BC may be disposed between the first and second insulating layers ILD1 and ILD2.

Each of the first semiconductor patterns SP1 may be connected through a drain contact DC (e.g., via an electrical connection to the second impurity region SD2) to the fourth conductive line CL4. The drain contact DC may be disposed between the first holes HO1. The drain contact DC may be disposed between the first and second insulating layers ILD1 and ILD2.

Second conductive lines CL2 may be provided to extend in a vertical direction (e.g., a third direction D3) in each of the first holes HO1 penetrating the stack structures SS1 and SS2. For example, the second conductive lines CL2 may penetrate each of the first and second stack structures SS1 and SS2. A pair of second conductive lines CL2 may be provided on opposite sides of each of the first semiconductor patterns SP1. For example, the pair of second conductive lines CL2 may constitute one word line. For another example, one of the pair of second conductive lines CL2 may be a word line, and the other of the pair of second conductive lines CL2 may be a back gate.

Third conductive lines CL3 may be provided to extend in a vertical direction (e.g., the third direction D3) in each of the first holes HO1 penetrating the stack structures SS1 and SS2. For example, the third conductive lines CL3 may penetrate each of the first and second stack structures SS1 and SS2. A pair of third conductive lines CL3 may be provided on opposite sides of each of the drain contacts DC. For example, the pair of third conductive lines CL3 may be capacitor electrodes.

A gate insulating layer GI may be provided on each inner sidewall of the stack structures SS1 and SS2 that is exposed to the first hole HO1. The gate insulating layer GI may be interposed between each of the first semiconductor patterns SP1 and each of the second conductive lines CL2. A first gate insulating layer may be defined to refer to the gate insulating layer GI between the first semiconductor pattern SP1 and the second conductive line CL2. A gate insulating layer GI may be interposed between each of the drain contacts DC and each of the third conductive lines CL3. A dielectric layer may be defined to refer to the gate insulating layer GI between the drain contact DC and the third conductive line CL3. According to some example embodiments, the first gate insulating layer and the dielectric layer may include the same material or similar materials.

Each of the first holes HO1 may be provided therein with a vertical insulating pattern VIP covering the second and third conductive lines CL2 and CL3. The vertical insulating pattern VIP may be interposed between a pair of second conductive lines CL2 adjacent to each other. The vertical insulating pattern VIP may be interposed between a pair of third conductive lines CL3 adjacent to each other. The vertical insulating pattern VIP may be interposed between a pair of first semiconductor patterns SP1 adjacent to each other. The vertical insulating pattern VIP may be interposed between a pair of bit contacts BC adjacent to each other. The vertical insulating pattern VIP may be interposed between a pair of drain contacts DC adjacent to each other. The vertical insulating pattern VIP may have a pillar shape extending in the third direction D3. For example, the vertical insulating pattern VIP may include one or more of a silicon oxide layer, a silicon nitride layer, and/or a silicon oxynitride layer.

A second hole HO2 and a third hole HO3 may be provided to penetrate each of the first and second stack structures SS1 and SS2. When viewed in plan, the third hole HO3 may be disposed between the second holes HO2 adjacent to each other. Each of the semiconductor layers SL may include second semiconductor patterns SP2 defined by the second hole HO2 and the third hole HO3.

Each of the second semiconductor patterns SP2 may include a second channel CH2, a third impurity region SD3, and a fourth impurity region SD4. The second channel CH2 may be interposed between the third and fourth impurity regions SD3 and SD4. The second semiconductor patterns SP2 may be spaced apart in the second direction D2 from the fourth conductive line CL4 across the gate insulating layer GI. A second gate insulating layer may be defined to refer to the gate insulating layer GI between the second semiconductor pattern SP2 and the fourth conductive line CL4. The second semiconductor patterns SP2 may extend in the first direction D1.

Fifth conductive lines CL5 may be provided to extend in a vertical direction (e.g., the third direction D3) in each of the second holes HO2 penetrating the stack structures SS1 and SS2. For example, the fifth conductive lines CL5 may penetrate each of the first and second stack structures SS1 and SS2. A pair of fifth conductive lines CL5 may be provided on opposite sides of each of the second semiconductor patterns SP2. According to some example embodiments, the pair of fifth conductive lines CL5 may be connected to the third and fourth impurity regions SD3 and SD4, respectively.

A gate insulating layer GI may be partially provided on each inner sidewall of the stack structures SS1 and SS2 that is exposed to the second hole HO2. No gate insulating layer GI may be provided on each lateral surface of the second semiconductor patterns SP2 that is exposed to the second hole HO2. For example, no gate insulating layer GI may be provided on the third and fourth impurity regions SD3 and SD4 of each of the second semiconductor patterns SP2. A gate insulating layer GI may be provided on each lateral surface of the fourth conductive lines CL4 that is exposed to the second hole HO2.

The second holes HO2 may be provided therein with vertical insulating patterns VIP covering the fifth conductive lines CL5. The vertical insulating pattern VIP may be interposed between a pair of fifth conductive lines CL5 adjacent to each other. The vertical insulating pattern VIP may be interposed between a pair of second semiconductor patterns SP2 adjacent to each other.

The third holes HO3 may be provided therein with vertical insulating patterns VIP.

An interlayer dielectric layer 110 may be provided to cover the first and second stack structures SS1 and SS2. For example, the interlayer dielectric layer 110 may include one or more of a silicon oxide layer, a silicon nitride layer, and/or a silicon oxynitride layer. A third insulating layer ILD3 and/or a fourth insulating layer ILD4 may be provided on each of the first and second stack structures SS1 and SS2. The fourth insulating layer ILD4 may be provided on the third insulating layer ILD3. The interlayer dielectric layer 110, the fourth insulating layers ILD4, the second conductive lines CL2, the third conductive lines CL3, the fifth conductive lines CL5, and the common source lines CSL may have their top surfaces coplanar with each other.

Figure 11A:
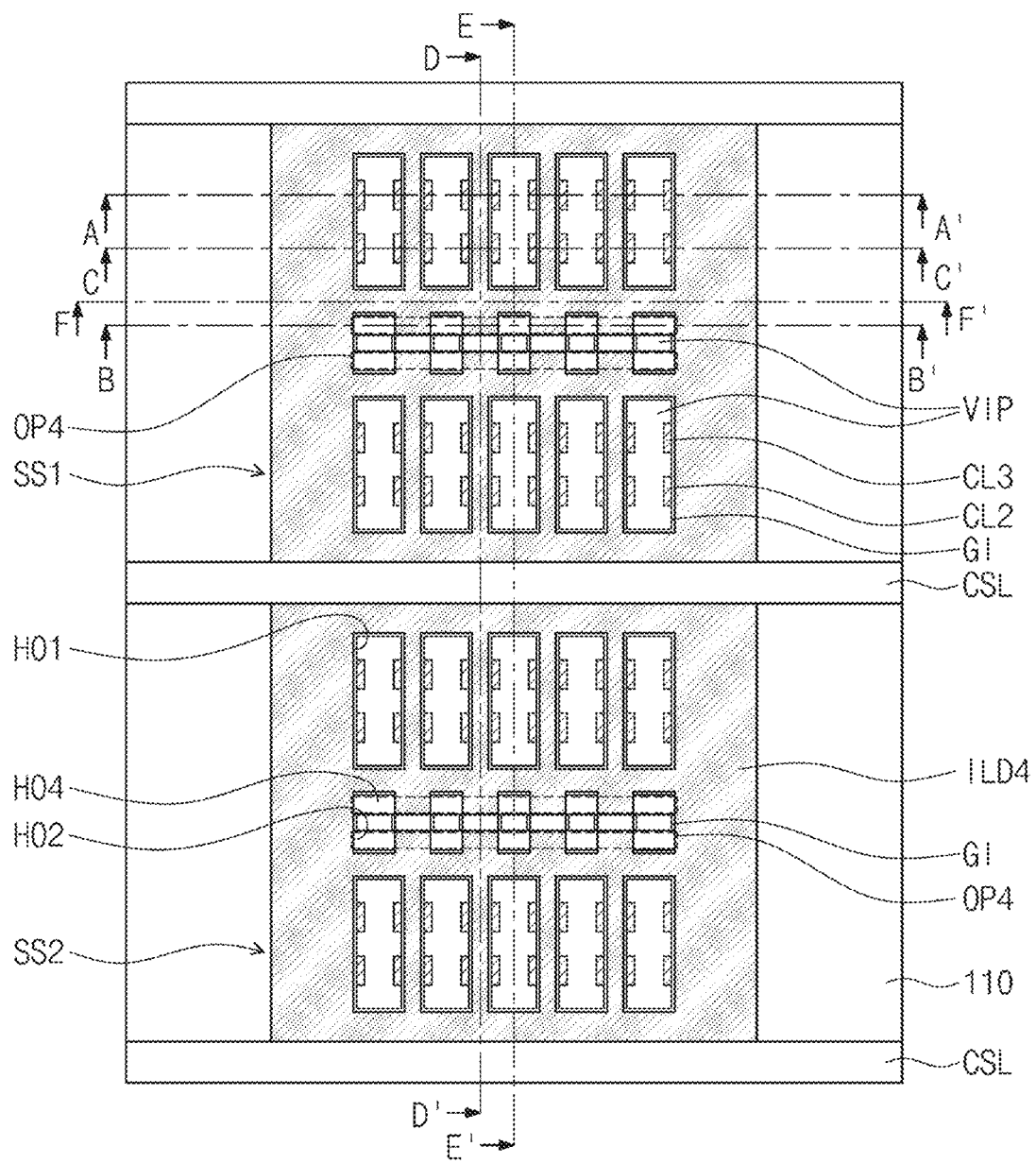
Figure 11A:
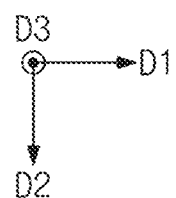
Figure 11B:
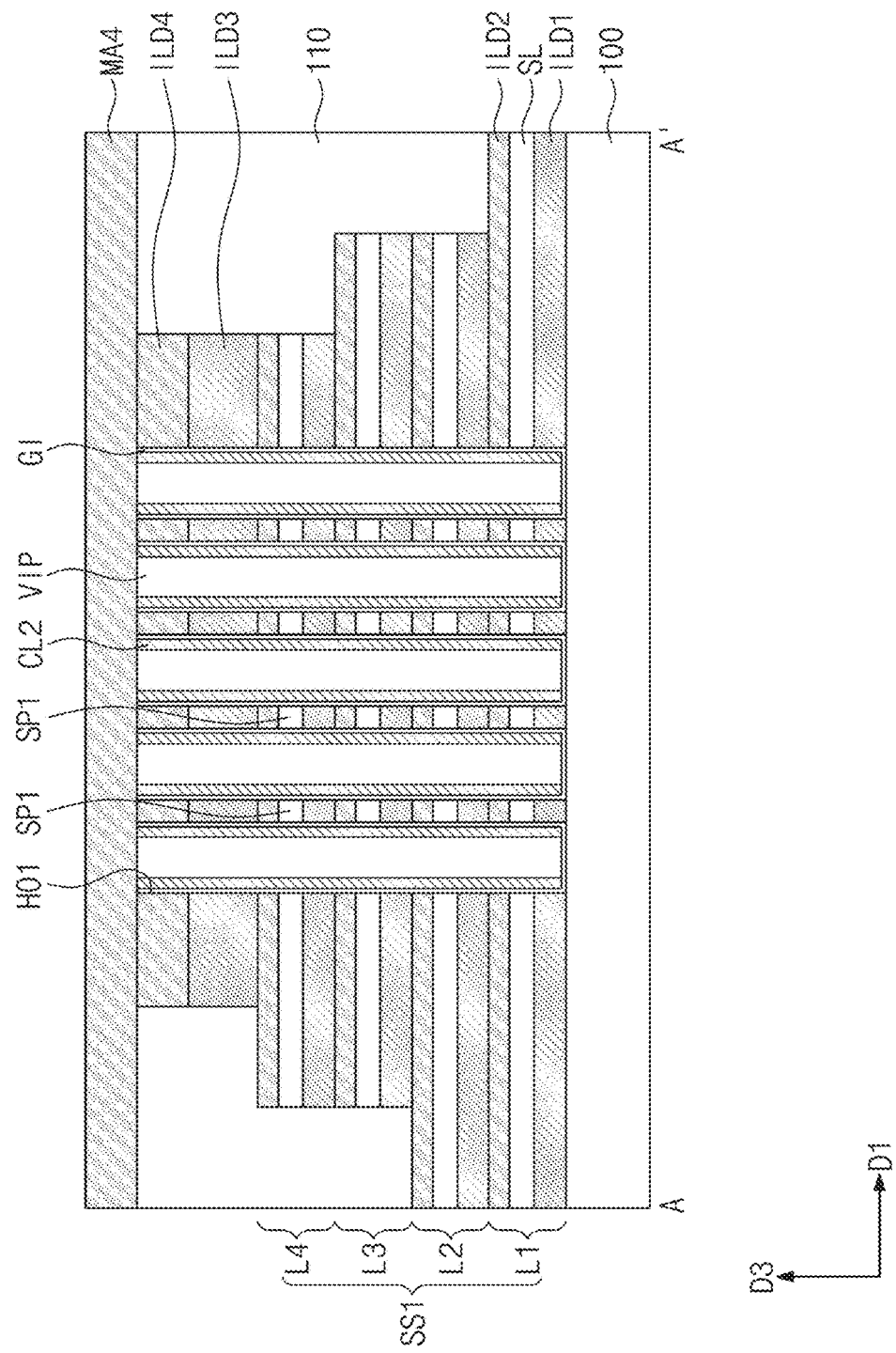
Figure 11C:
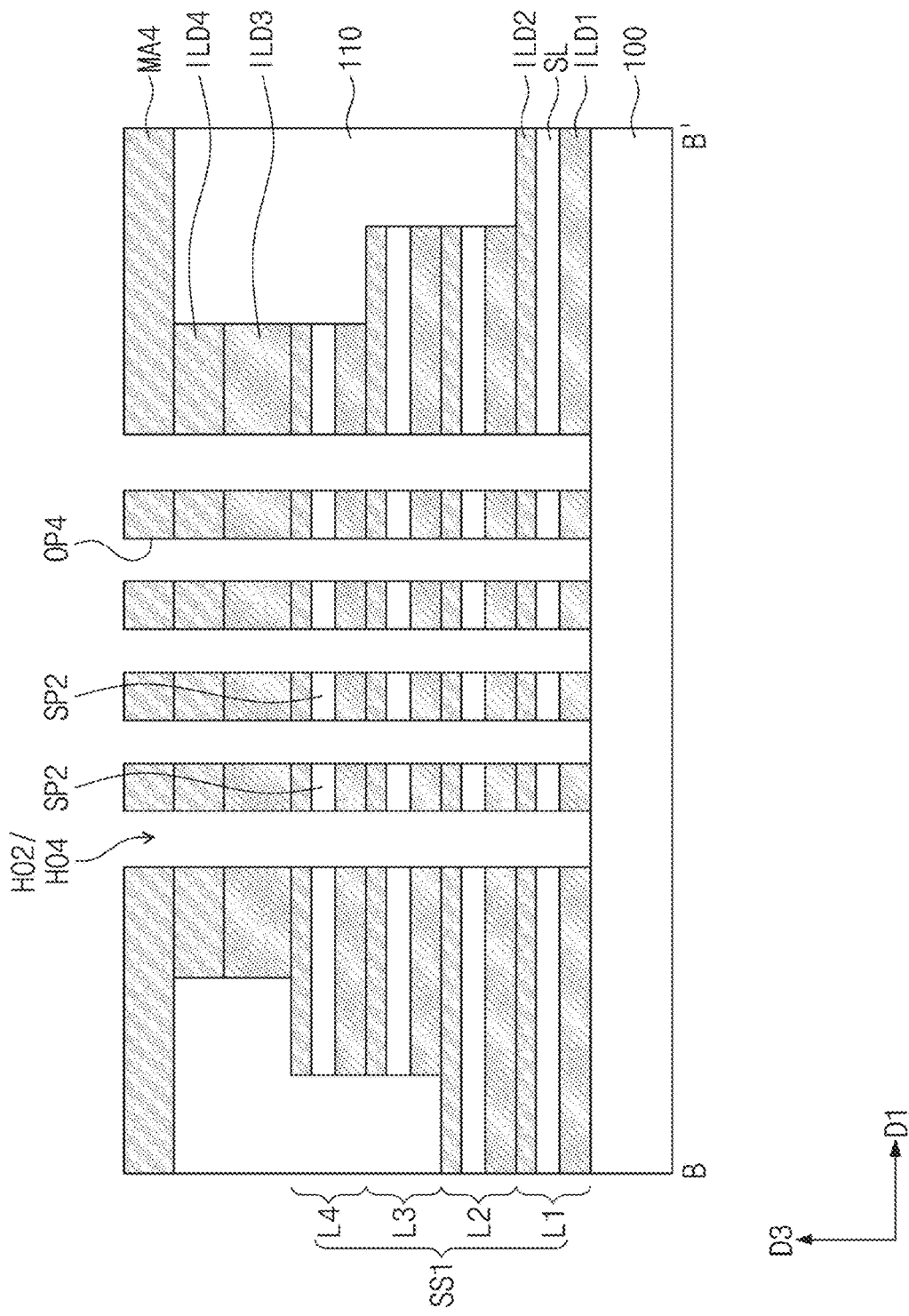
Figure 11D:
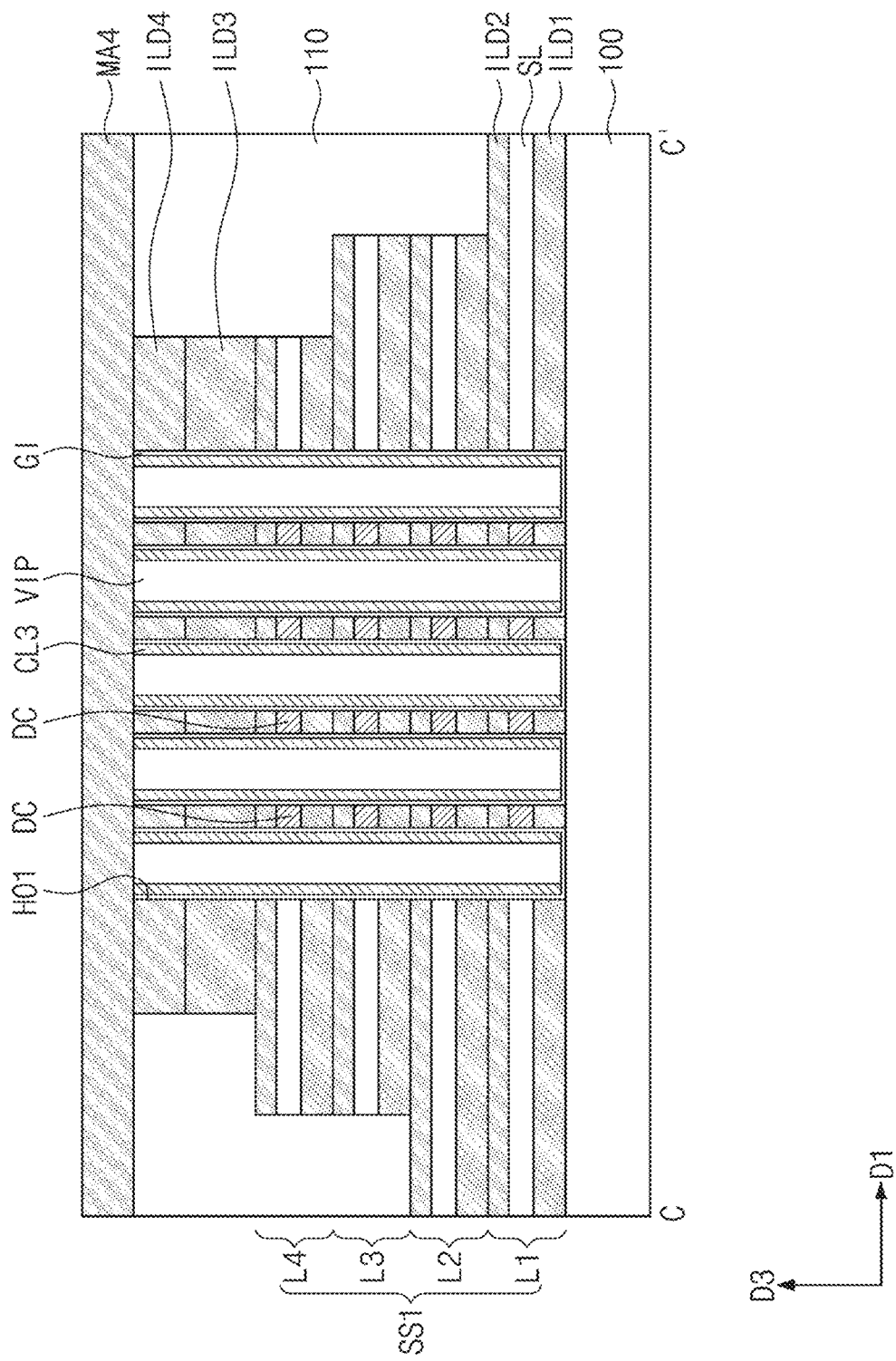
Figure 11E:
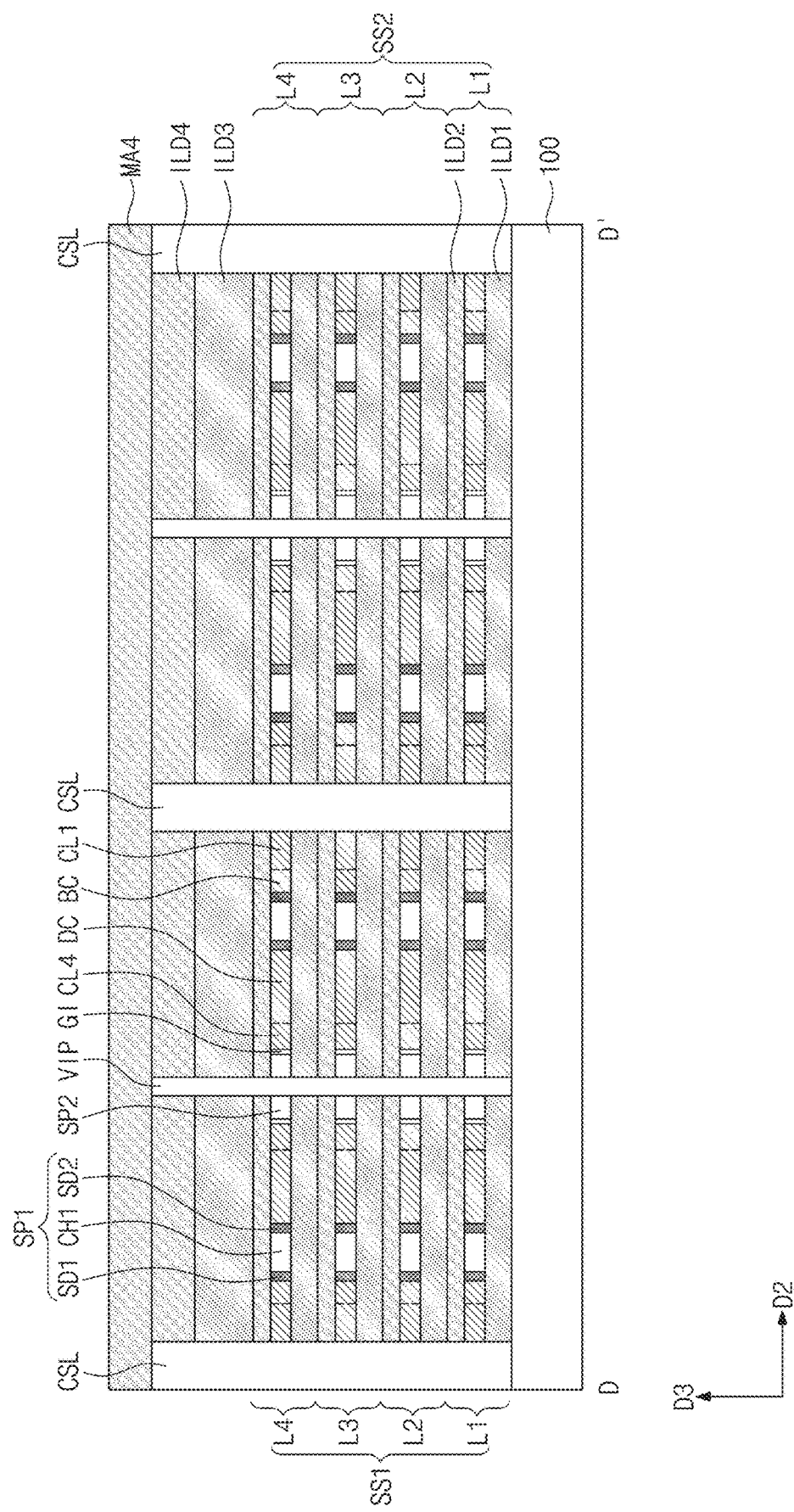
Figure 11F:
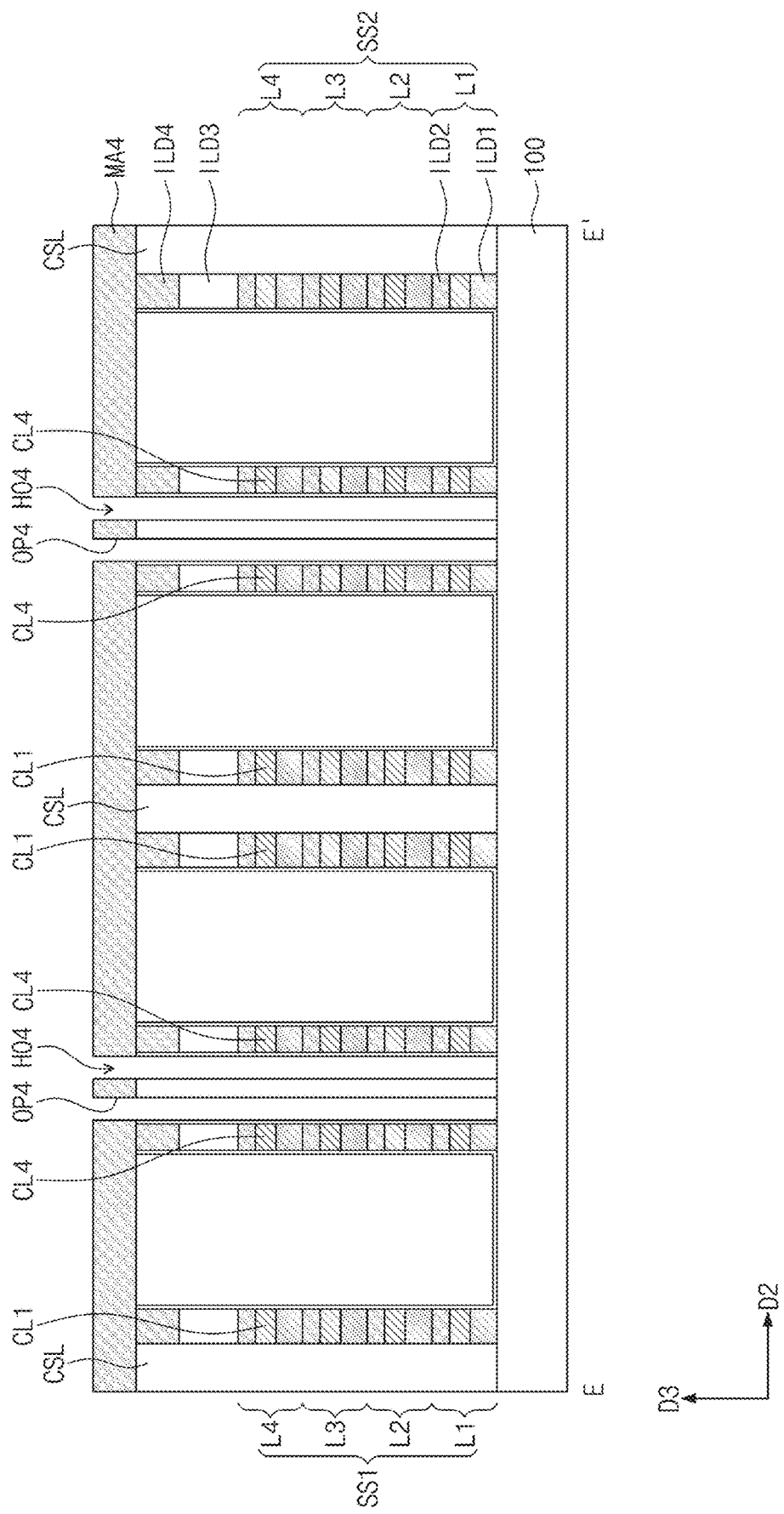
Figure 11G:
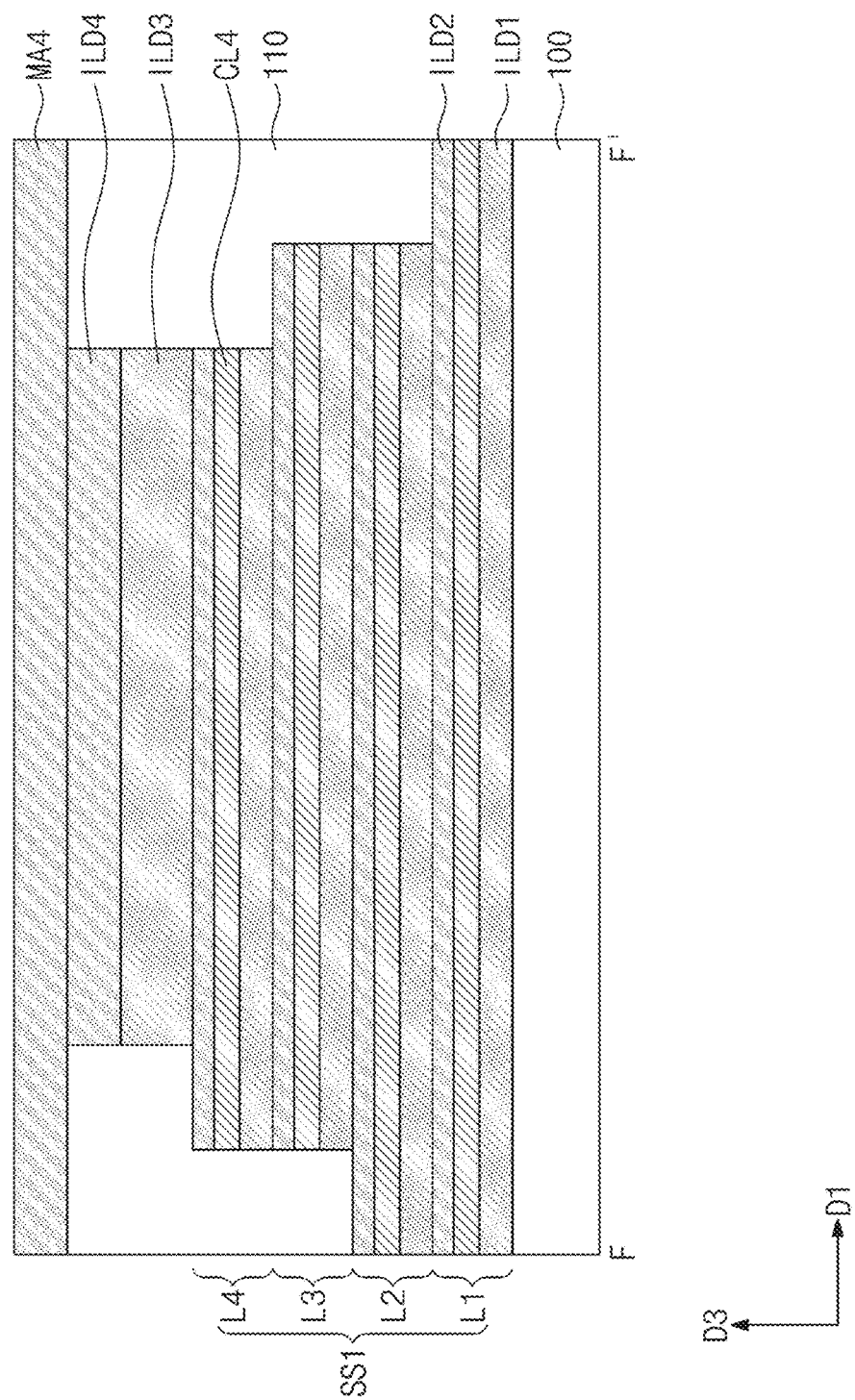

FIGS. 4A, 5A, 6A, 7A, 8A, 9A, 10A, and 11A illustrate plan views showing a method of fabricating a three-dimensional semiconductor memory device according to some example embodiments. FIGS. 4B, 5B, 6B, 7B, 8B, 9B, 10B, and 11B illustrate cross-sectional views taken along line A-A' of FIGS. 4A, 5A, 6A, 7A, 8A, 9A, 10A, and 11A, respectively. FIGS. 5C, 6C, 7C, 8C, 9C, 10C, and 11C illustrate cross-sectional views taken along line B-B' of FIGS. 5A, 6A, 7A, 8A, 9A, 10A, and 11A, respectively. FIGS. 7D, 8D, 9D, 10D, and 11D illustrate cross-sectional views taken along line C-C' of FIGS. 7A, 8A, 9A, 10A, and 11A, respectively. FIGS. 8E, 9E, 10E, and 11E illustrate cross-sectional views taken along line D-D' of FIGS. 8A, 9A, 10A, and 11A, respectively. FIGS. 8F, 9F, 10F, and 11F illustrate cross-sectional views taken along line E-E' of FIGS. 8A, 9A, 10A, and 11A, respectively. FIGS. 10G and 11G illustrate cross-sectional views taken along line F-F' of FIGS. 10A and 11A, respectively.

Figure 4A:
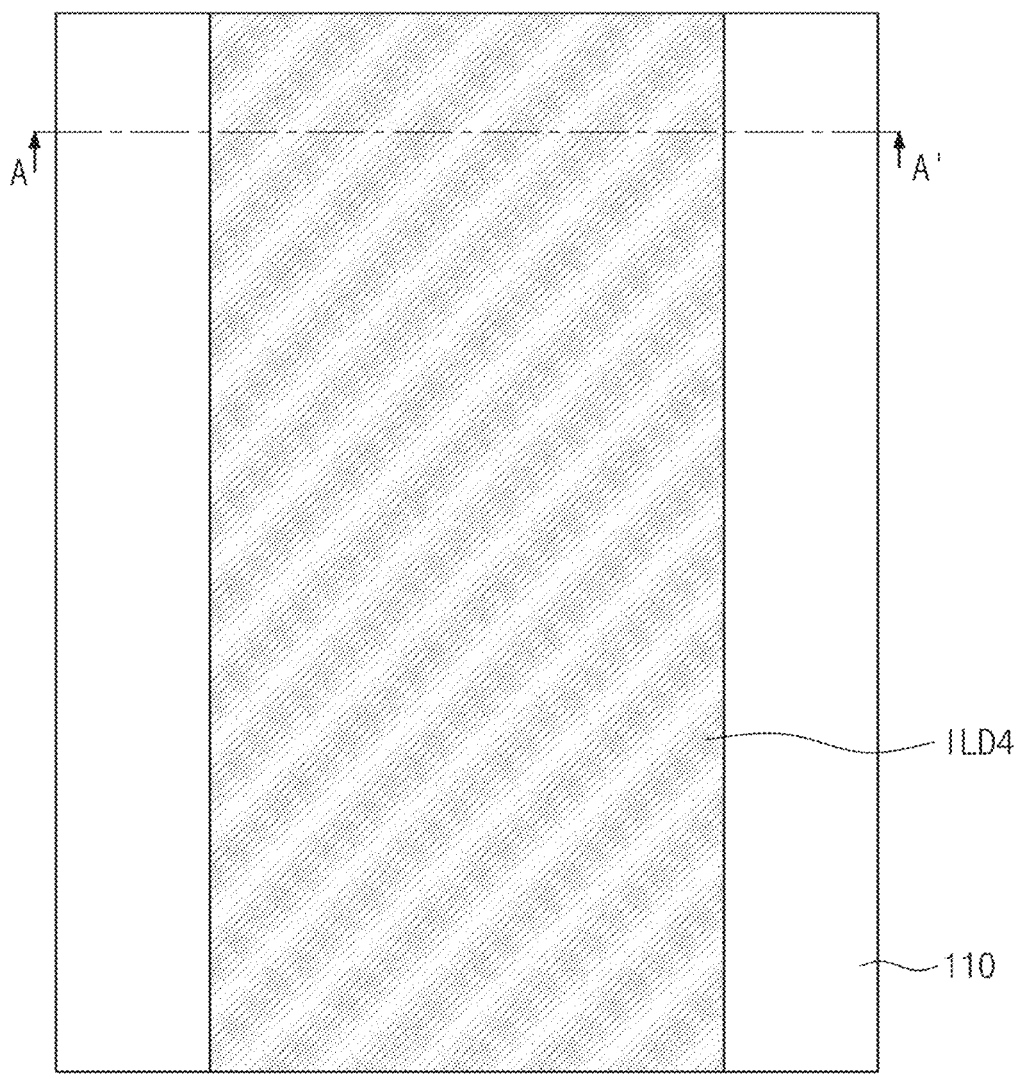
FIGS. 4A, 5A, 6A, 7A, 8A, 9A, 10A, and 11A illustrate plan views showing a method of fabricating a three-dimensional semiconductor memory device according to some example embodiments.
Figure 4B:
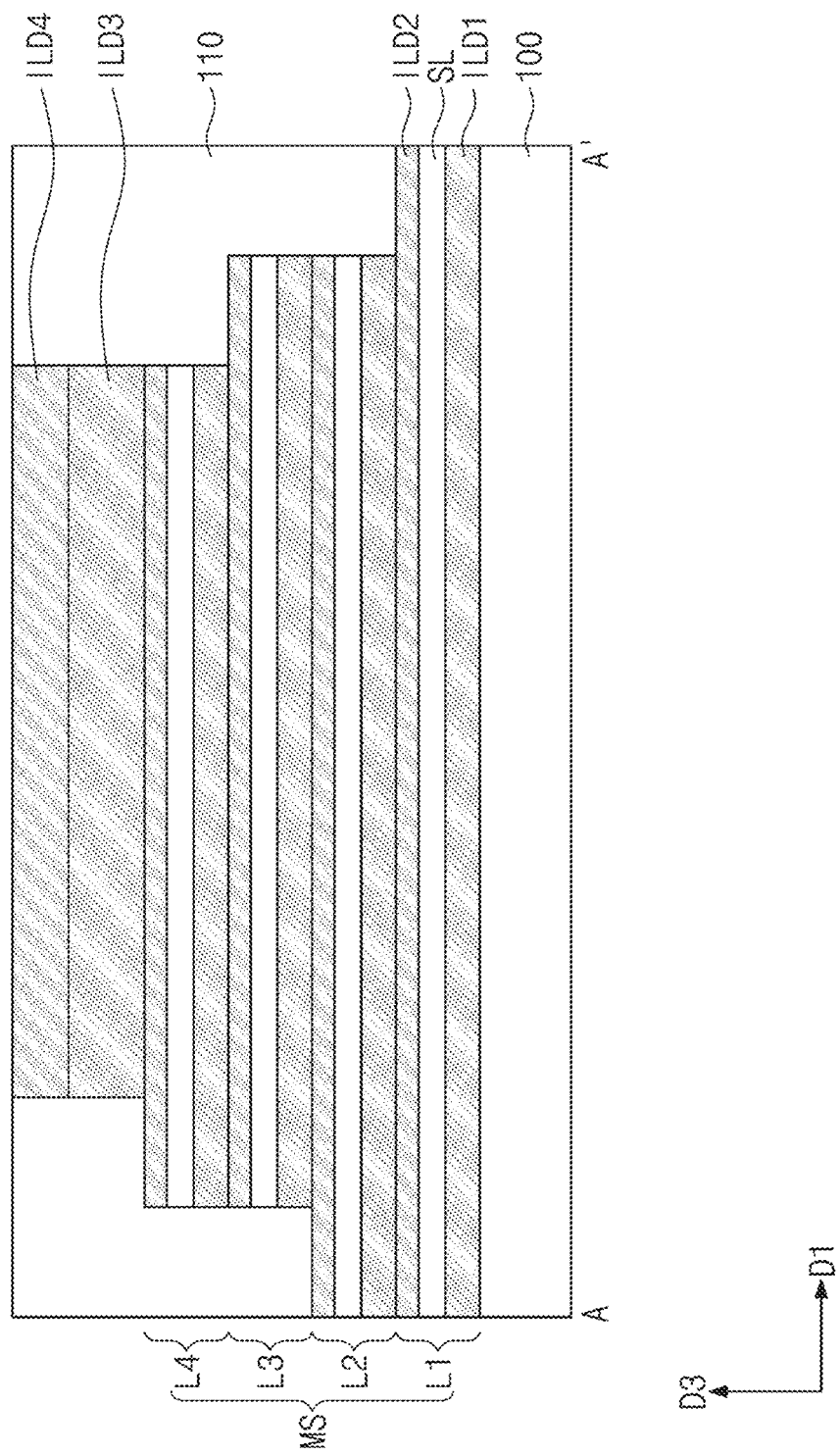

Referring to FIGS. 4A and 4B, a mold structure MS may be formed on a substrate 100. The formation of the mold structure MS may include forming first, second, third, and/or fourth layers L1, L2, L3, and/or L4 that are sequentially stacked. The mold structure MS may be formed to have stepwise structures at opposite ends thereof.

The substrate 100 may include a semiconductor material. For example, the substrate 100 may include silicon, germanium, and/or silicon-germanium. Each of the first, second, third, and/or fourth layers L1, L2, L3, and/or L4 may include a first insulating layer ILD1, a semiconductor layer SL, and/or a second insulating layer ILD2. The first insulating layer ILD1, the semiconductor layer SL, and the second insulating layer ILD2 may be sequentially formed. The semiconductor layer SL may include a semiconductor material. The first and second insulating layers ILD1 and ILD2 may include different dielectric materials from each other. One of the first and/or second insulating layers ILD1 and/or ILD2 may have an etch selectivity with respect to the other of the first and second insulating layers ILD1 and ILD2. The first and second insulating layers ILD1 and ILD2 may independently include one or more of a silicon oxide layer, a silicon nitride layer, a silicon oxynitride layer, a carbon-containing silicon oxide layer, a carbon-containing silicon nitride layer, and/or a carbon-containing silicon oxynitride layer. For example, the first insulating layer ILD1 may be formed of a carbon-containing silicon oxide layer (e.g., SiOC), and/or the second insulating layer ILD2 may be formed of a silicon nitride layer (e.g., SiN).

A third insulating layer ILD3 and a fourth insulating layer ILD4 may be formed on the mold structure MS. One of the third and fourth insulating layers ILD3 and ILD4 may have an etch selectivity with respect to the other of the third and fourth insulating layers ILD3 and ILD4. An interlayer dielectric layer 110 may be formed to cover the mold structure MS. The interlayer dielectric layer 110 may have a top surface coplanar with that of the fourth insulating layer ILD4. The interlayer dielectric layer 110 may be formed of one or more of a silicon oxide layer, a silicon nitride layer, and/or a silicon oxynitride layer.

Figure 5A:
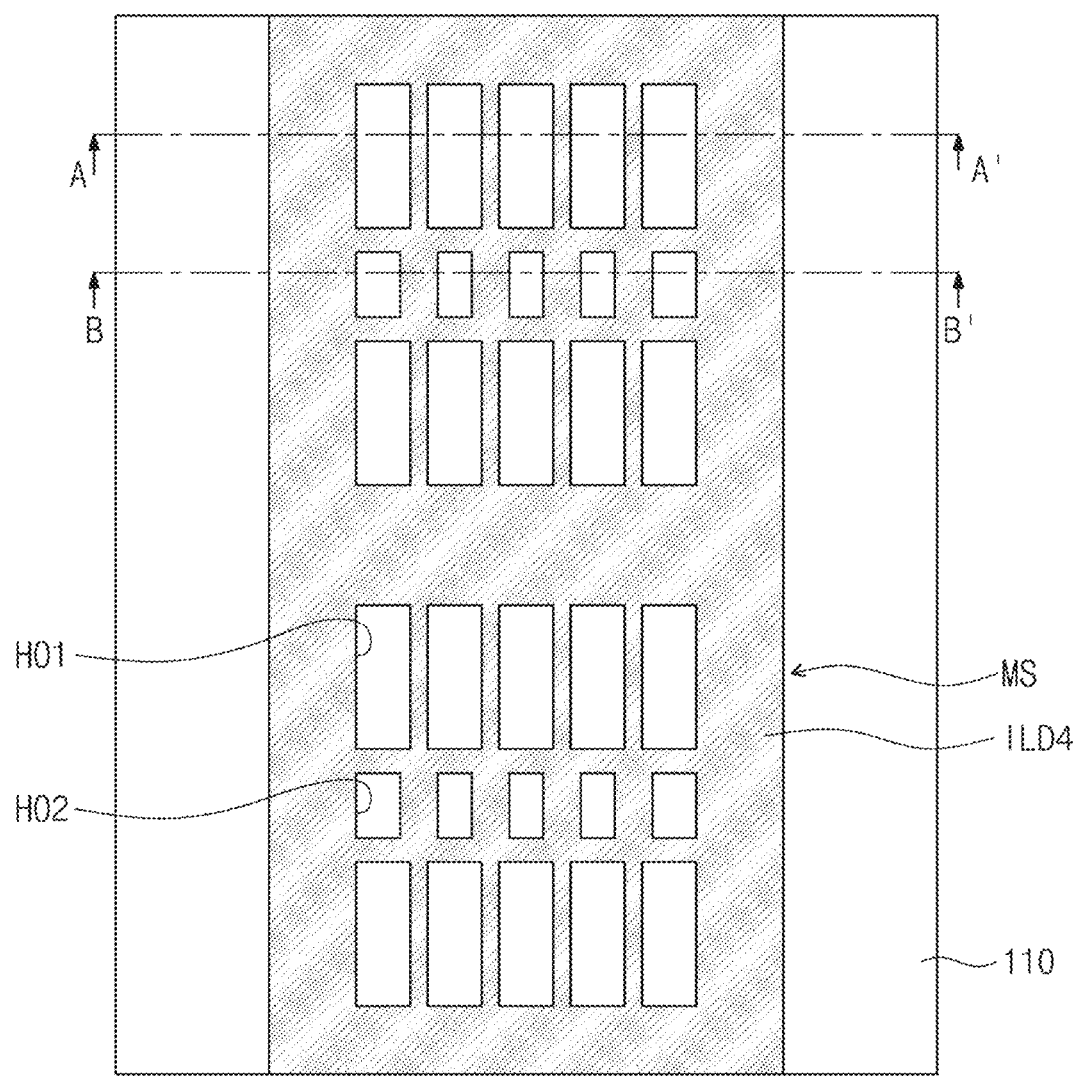
Figure 5B:
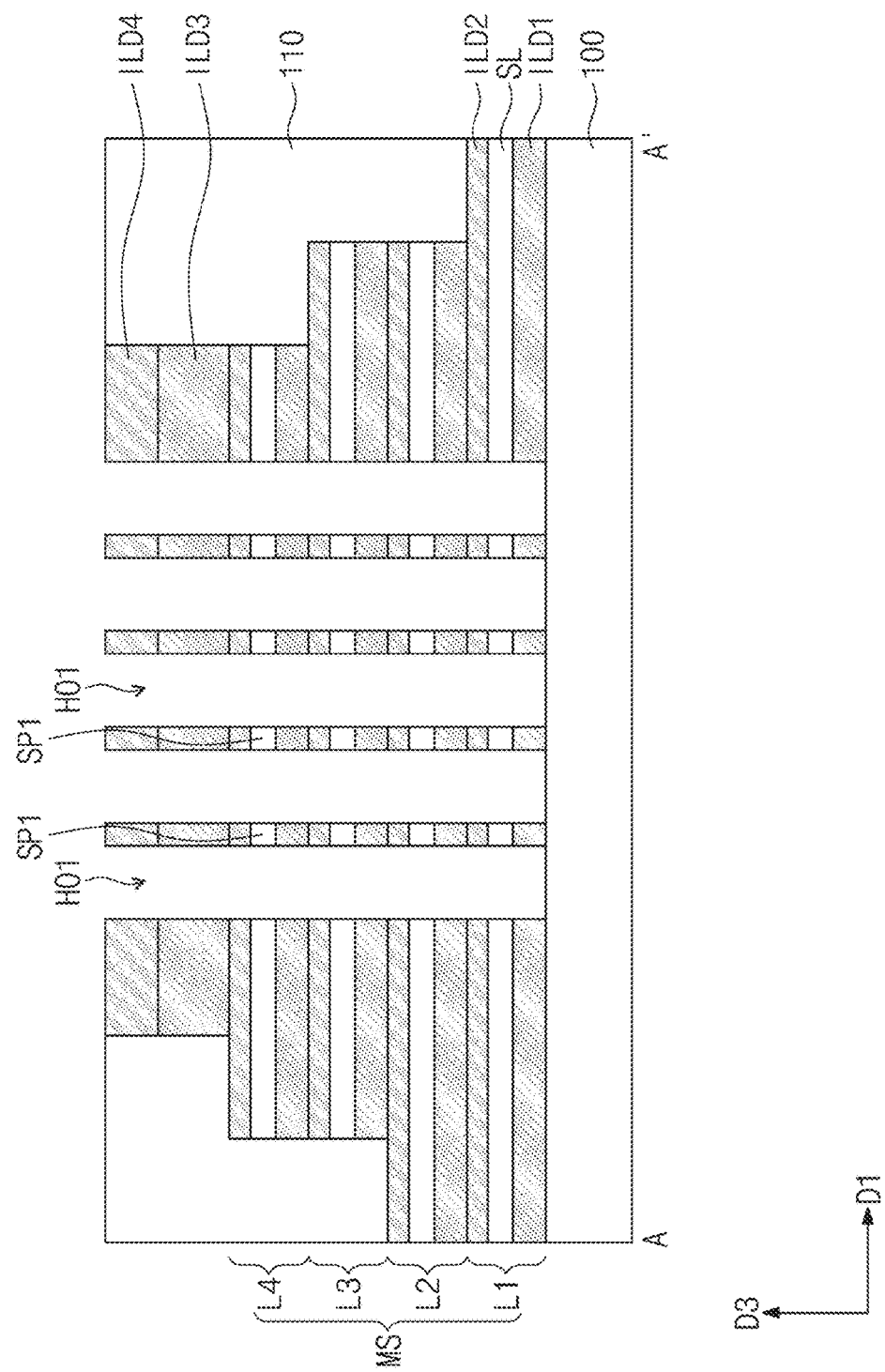
Figure 5C:
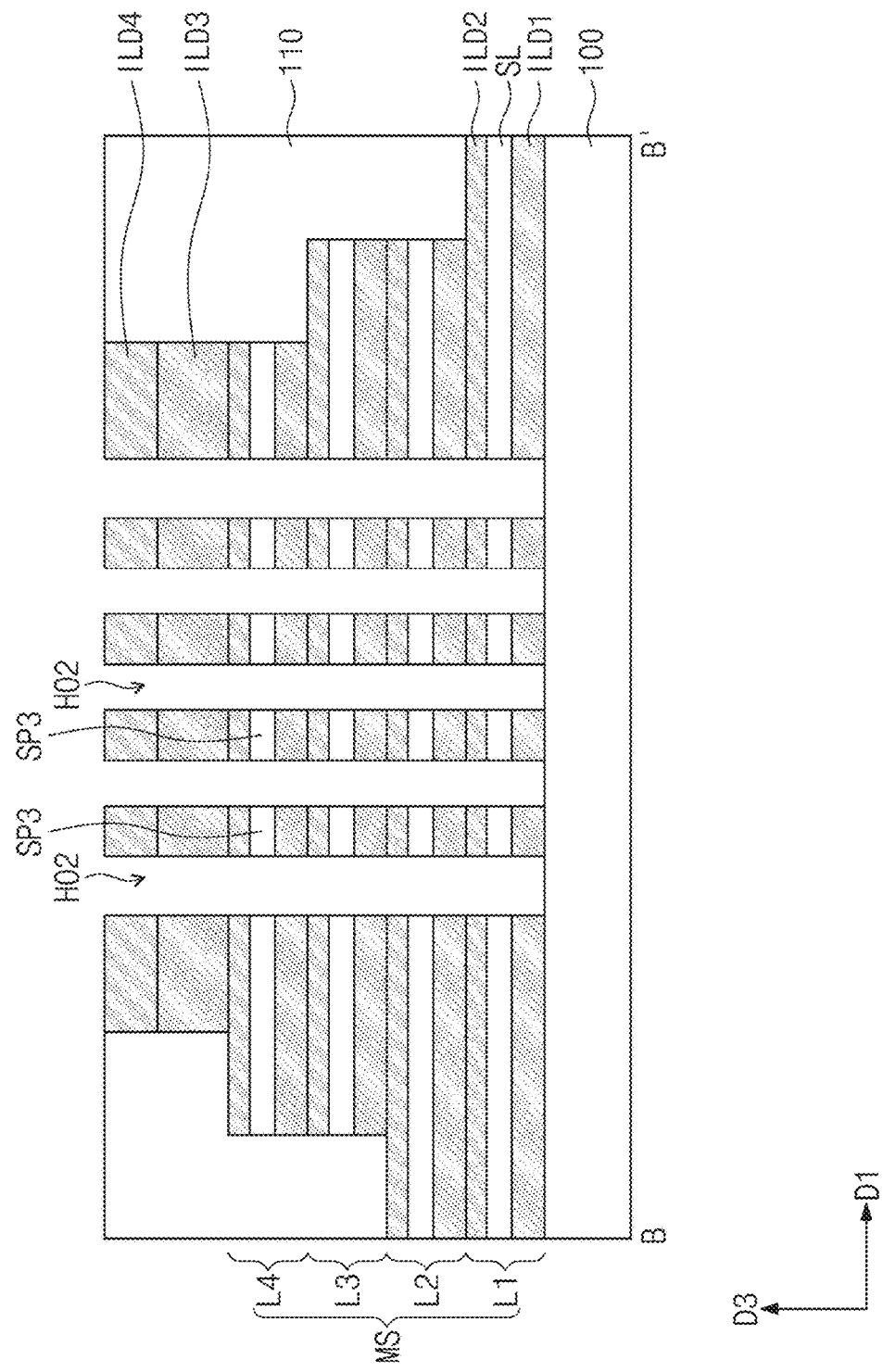

Referring to FIGS. 5A, 5B, and 5C, the mold structure MS may be patterned to form first holes HO1 and/or second holes HO2 that penetrate the first, second, third, and/or fourth layers L1, L2, L3, and/or L4. The first and/or second holes HO1 and/or HO2 may expose a top surface of the substrate 100. Each of the first and/or second holes HO1 and/or HO2 may have a linear or bar shape extending in a second direction D2. The first holes HO1 may be arranged spaced apart from each other along a first direction D1. The second holes HO2 may be arranged spaced apart from each other along the first direction D1. For example, for the mold structure MS, a first row may be defined to include the first holes HO1 arranged along the first direction D1, a second row may be defined to include the first holes HO1 arranged along the first direction D1, and a third row may be defined to include the second holes HO2 arranged along the first direction D1. The third row may be disposed between the first and second rows. The first and/or second holes HO1 and HO2 may extend in a third direction D3 (or a direction opposite thereof) to penetrate the first, second, third, and/or fourth layers L1, L2, L3, and/or L4.

The first holes HO1 may define first semiconductor patterns SP1 to each of the semiconductor layers SL. The first holes HO1 may be spaced apart from each other in the first direction D1 across the first semiconductor pattern SP1.

The second holes HO2 may define third semiconductor patterns SP3 to each of the semiconductor layers SL. The second holes HO2 may be spaced apart from each other in the first direction D1 across the third semiconductor pattern SP3.

A fourth semiconductor pattern (see SP4 of FIG. 8E) may be defined between the first and third semiconductor patterns SP1 and SP3 adjacent to each other. The fourth semiconductor patterns SP4 may extend in the first direction D1. The fourth semiconductor pattern SP4 may define a location in which is formed a fourth conductive line CL4 which will be discussed. One fourth semiconductor pattern SP4 may be connected to a plurality of first semiconductor patterns SP1 and/or a plurality of third semiconductor patterns SP3. A plurality of third semiconductor patterns SP3 may be interposed between two fourth semiconductor patterns SP4 parallel to each other.

Figure 6A:
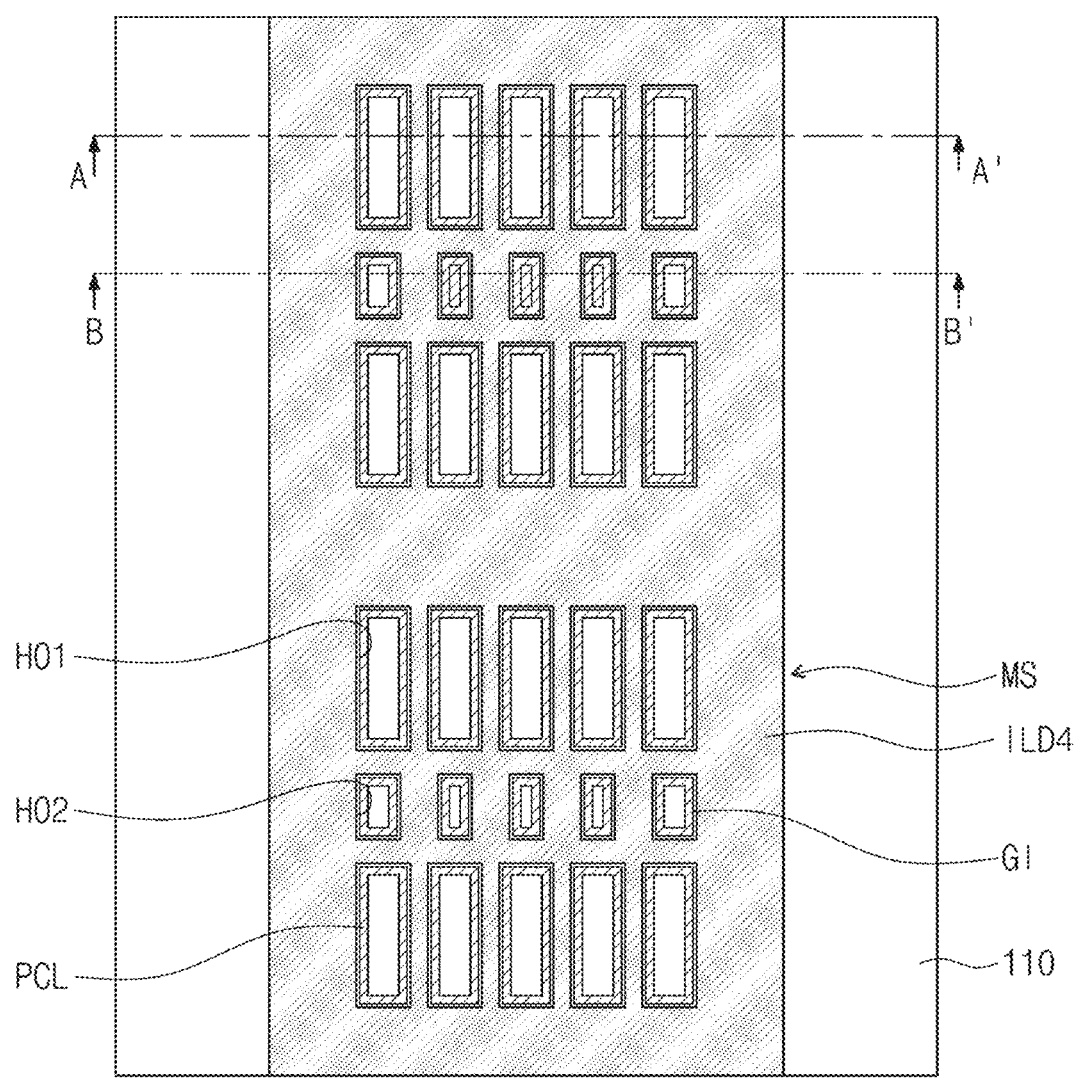
Figure 6A:
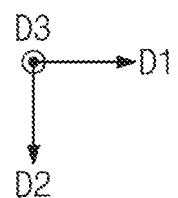
Figure 6B:
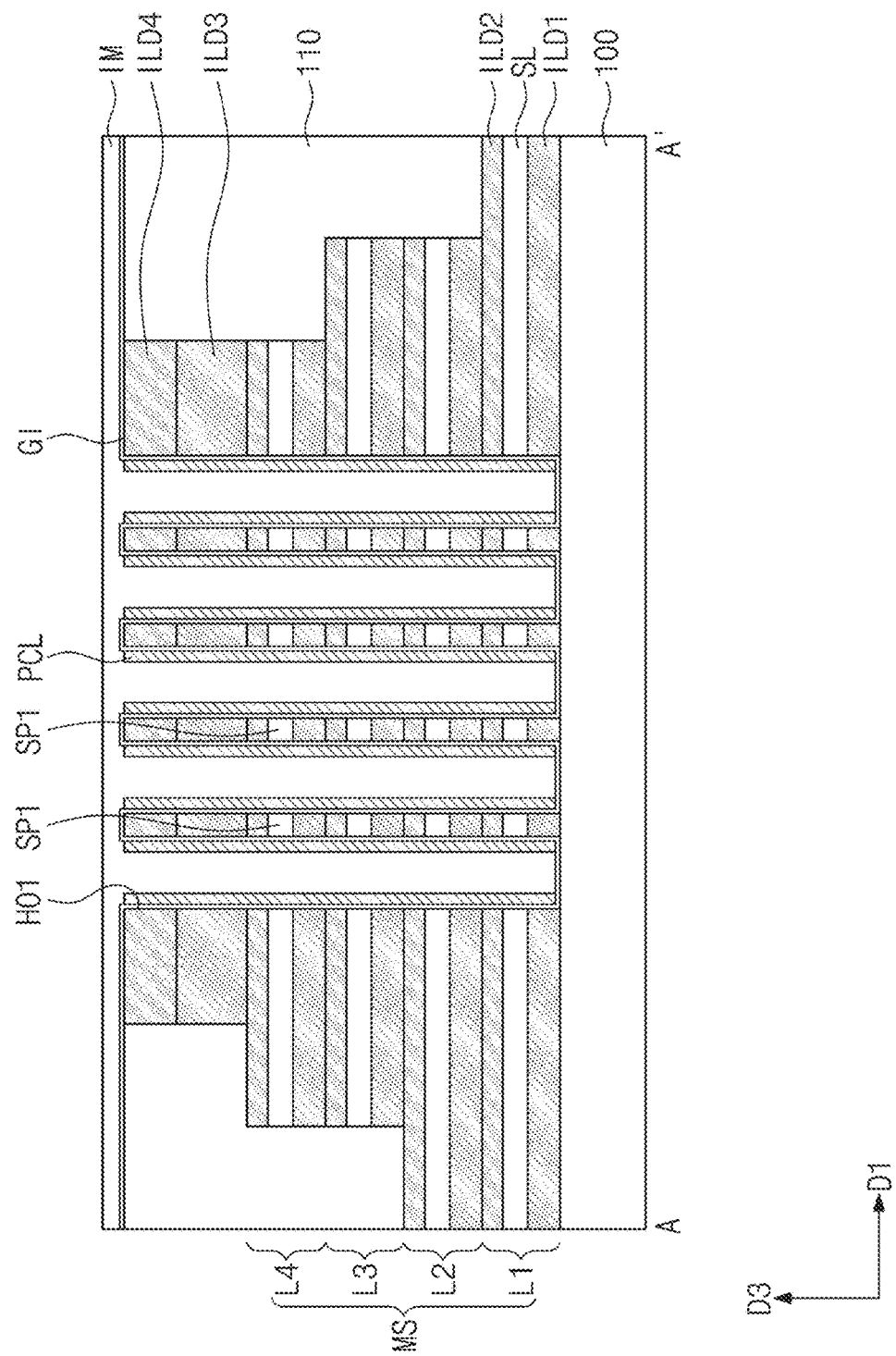
Figure 6C:
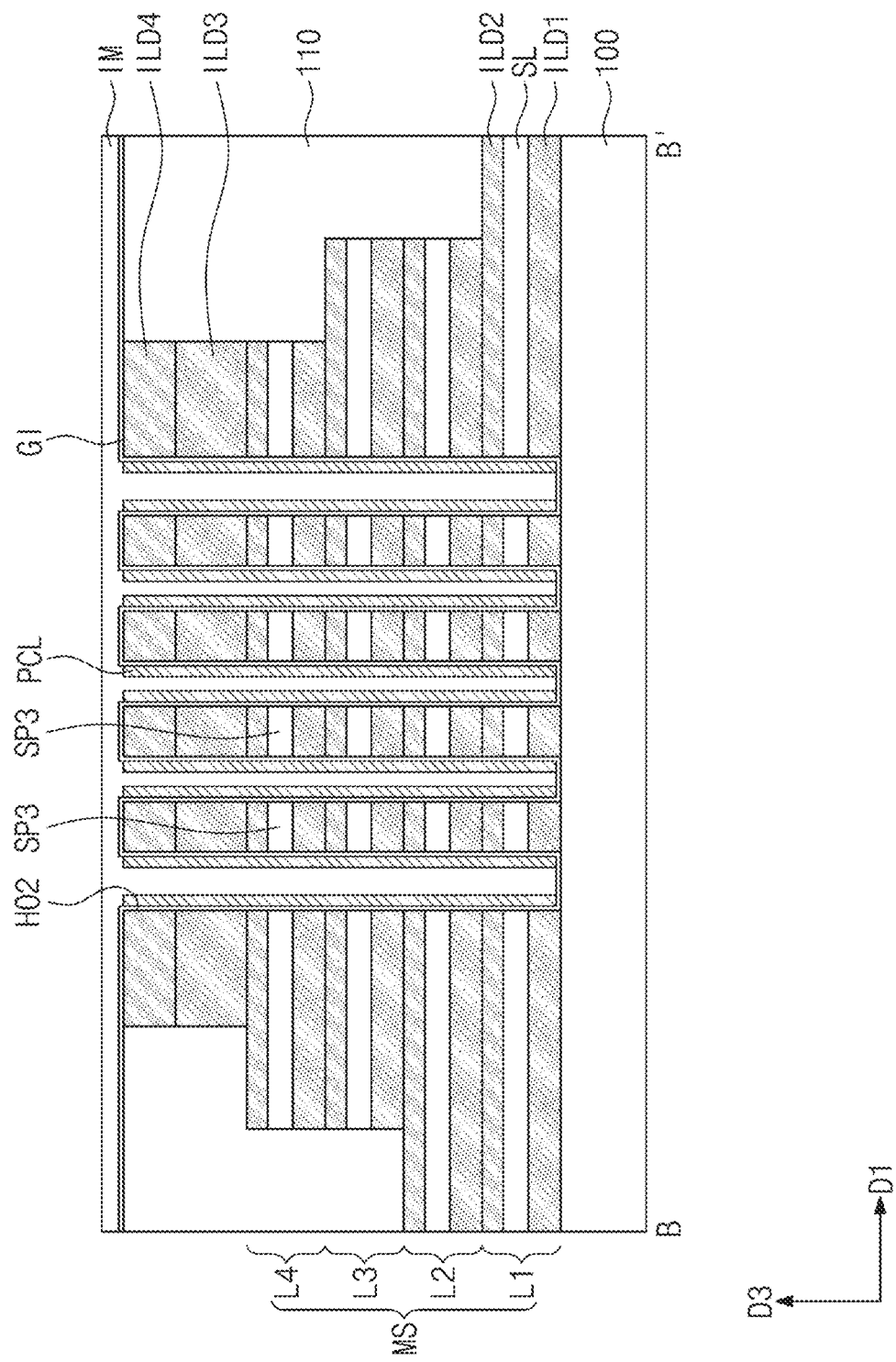
Figure 7A:
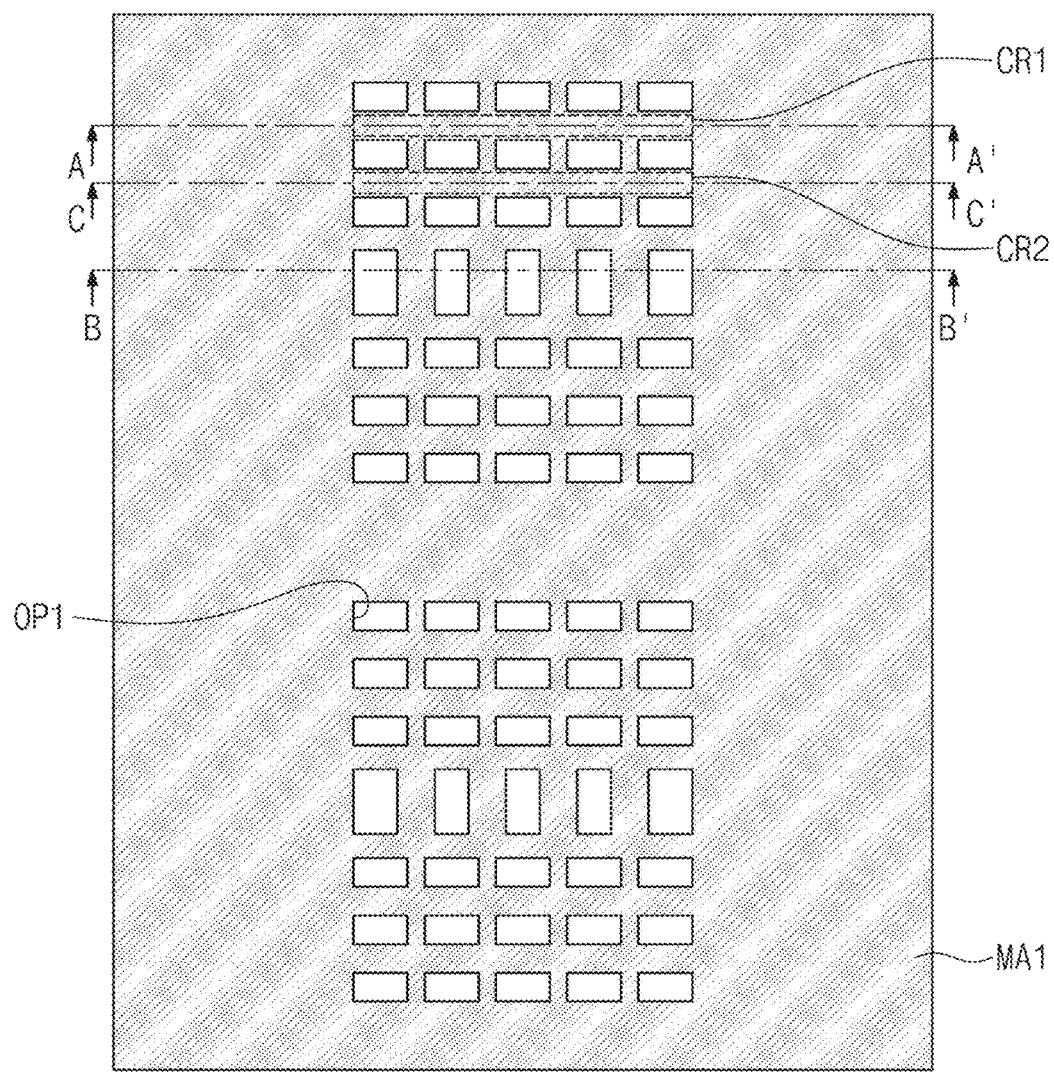
Figure 7B:
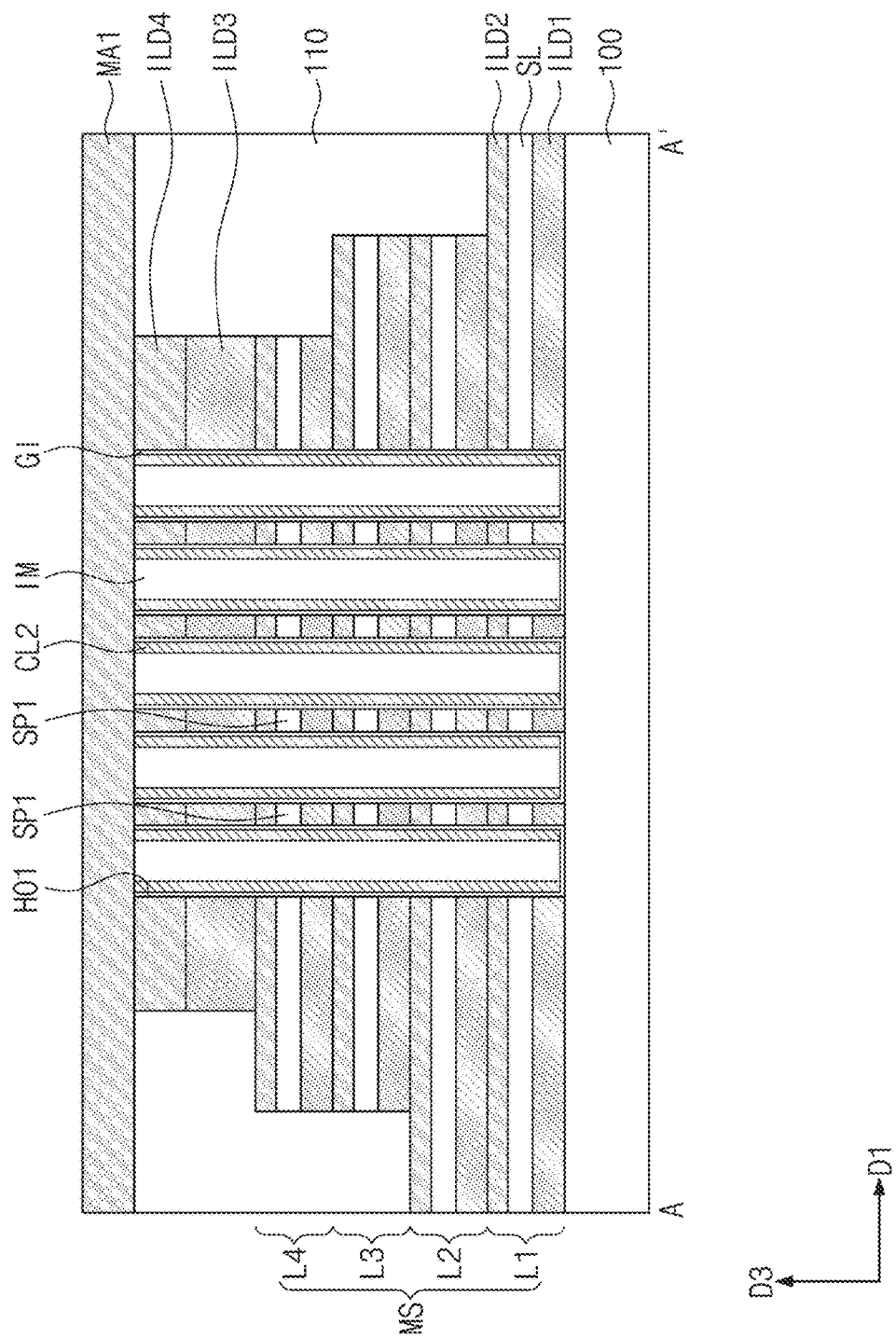
Figure 7C:
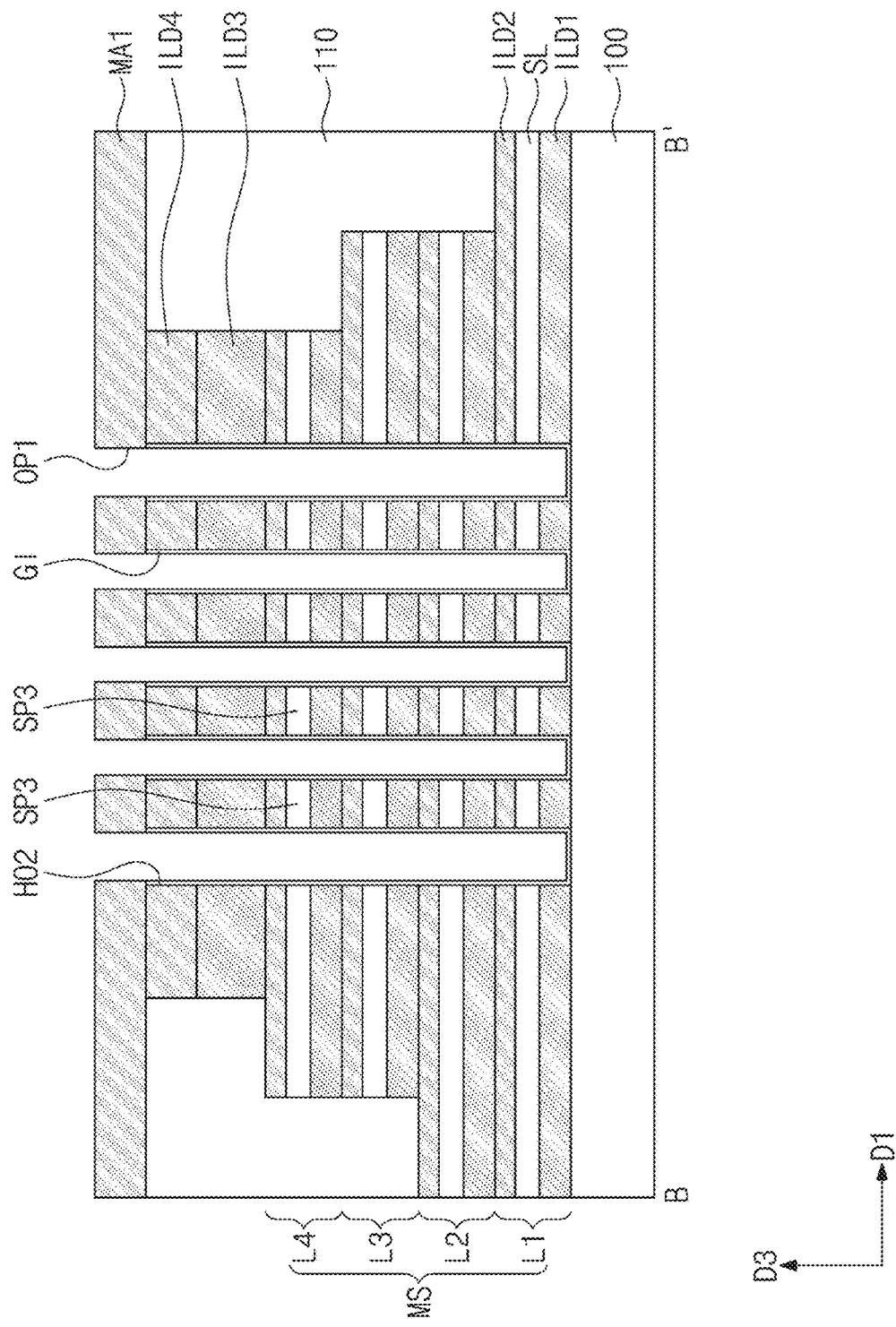
Figure 7D:
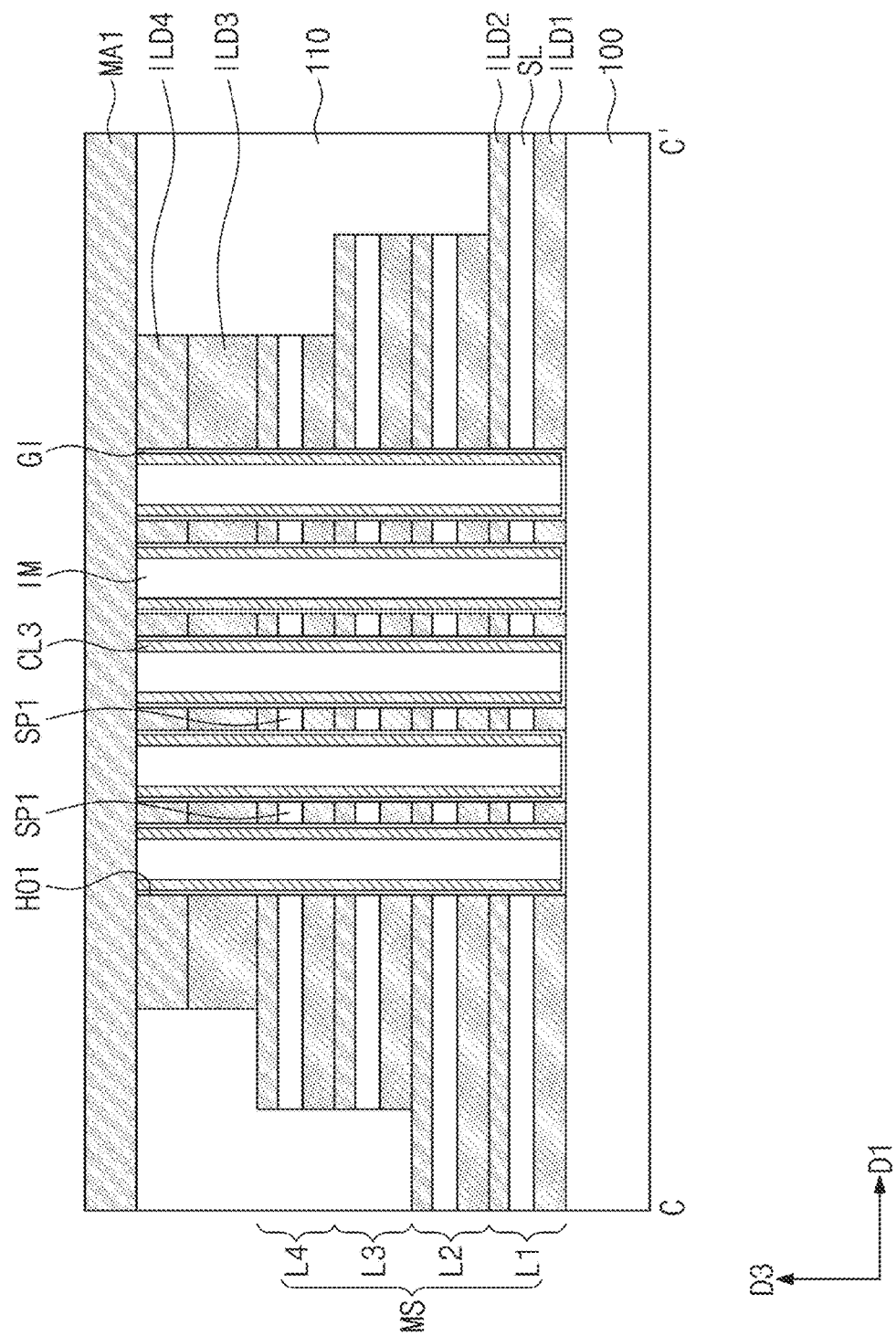
Figure 8A:
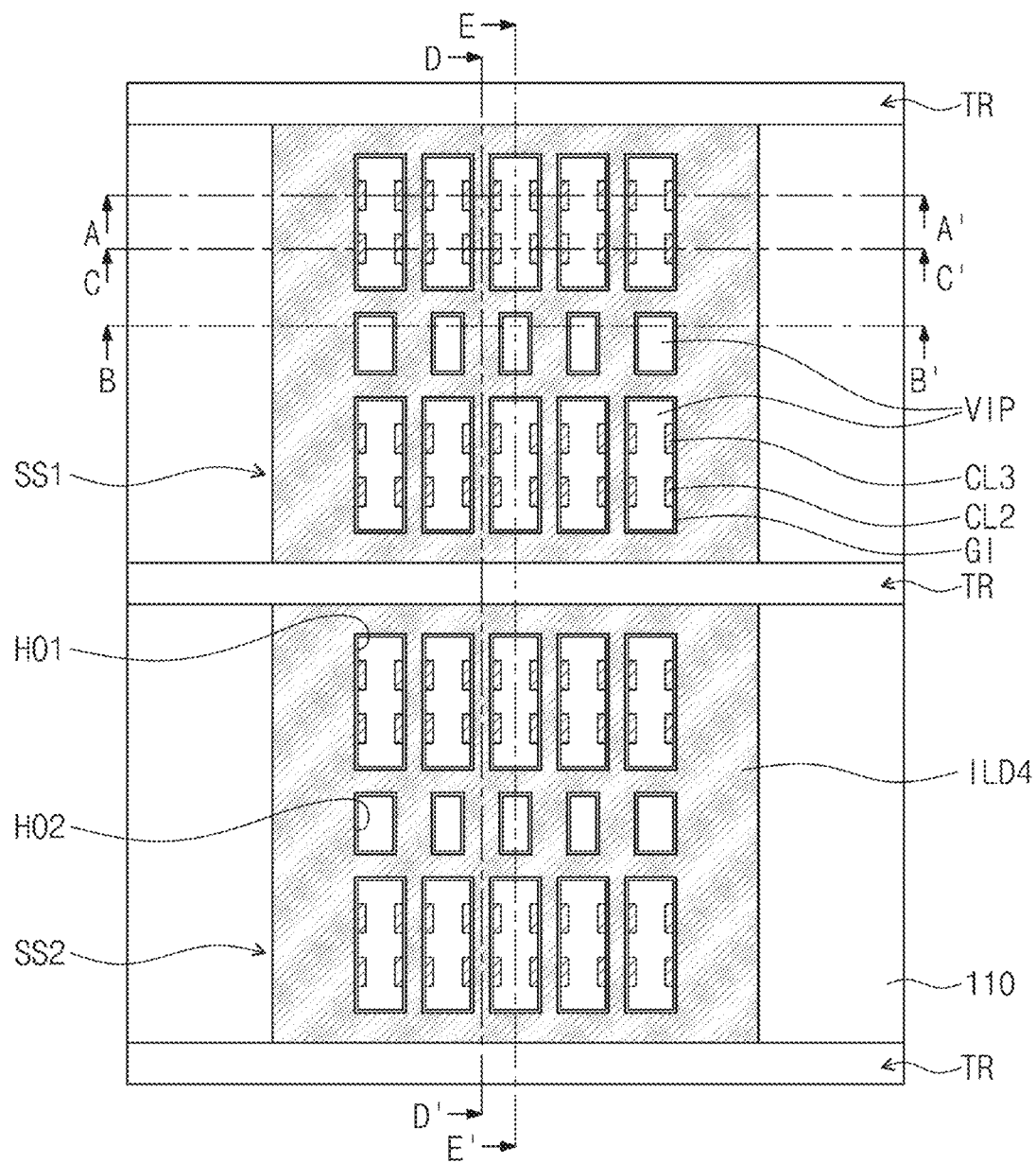
Figure 8A:
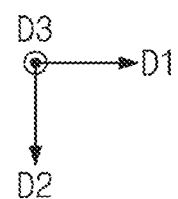
Figure 8B:
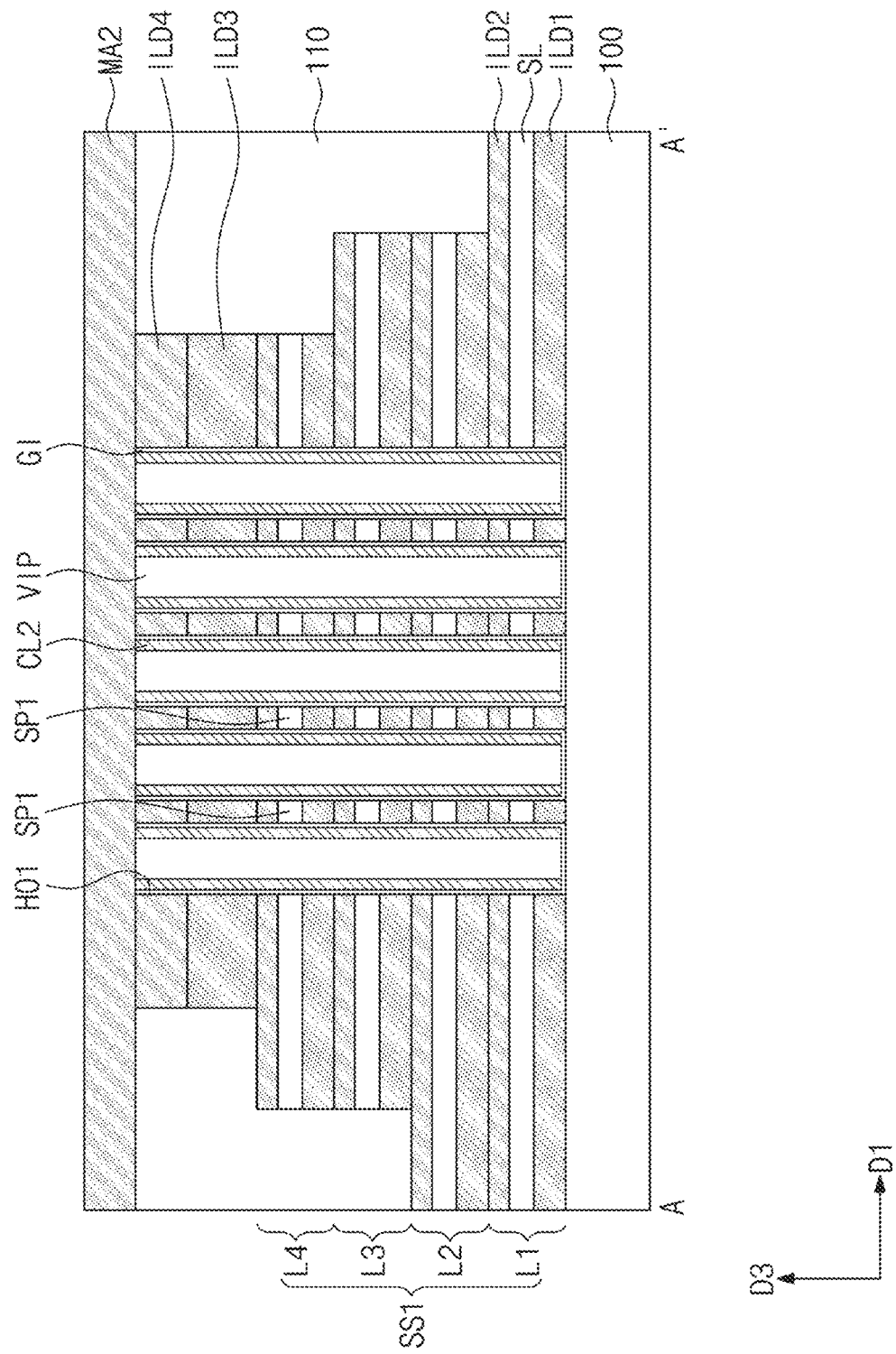
Figure 8D:
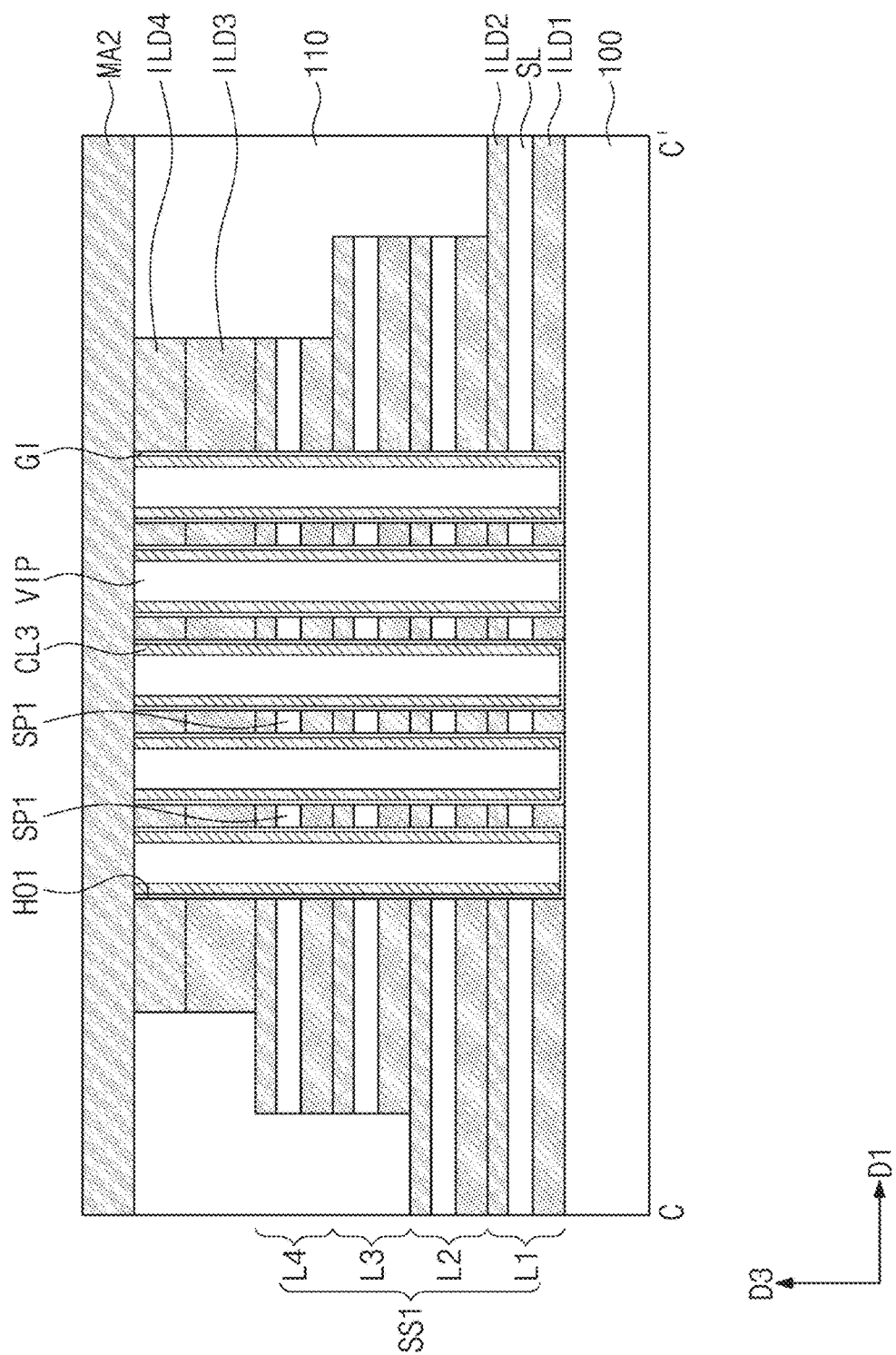
Figure 8F:
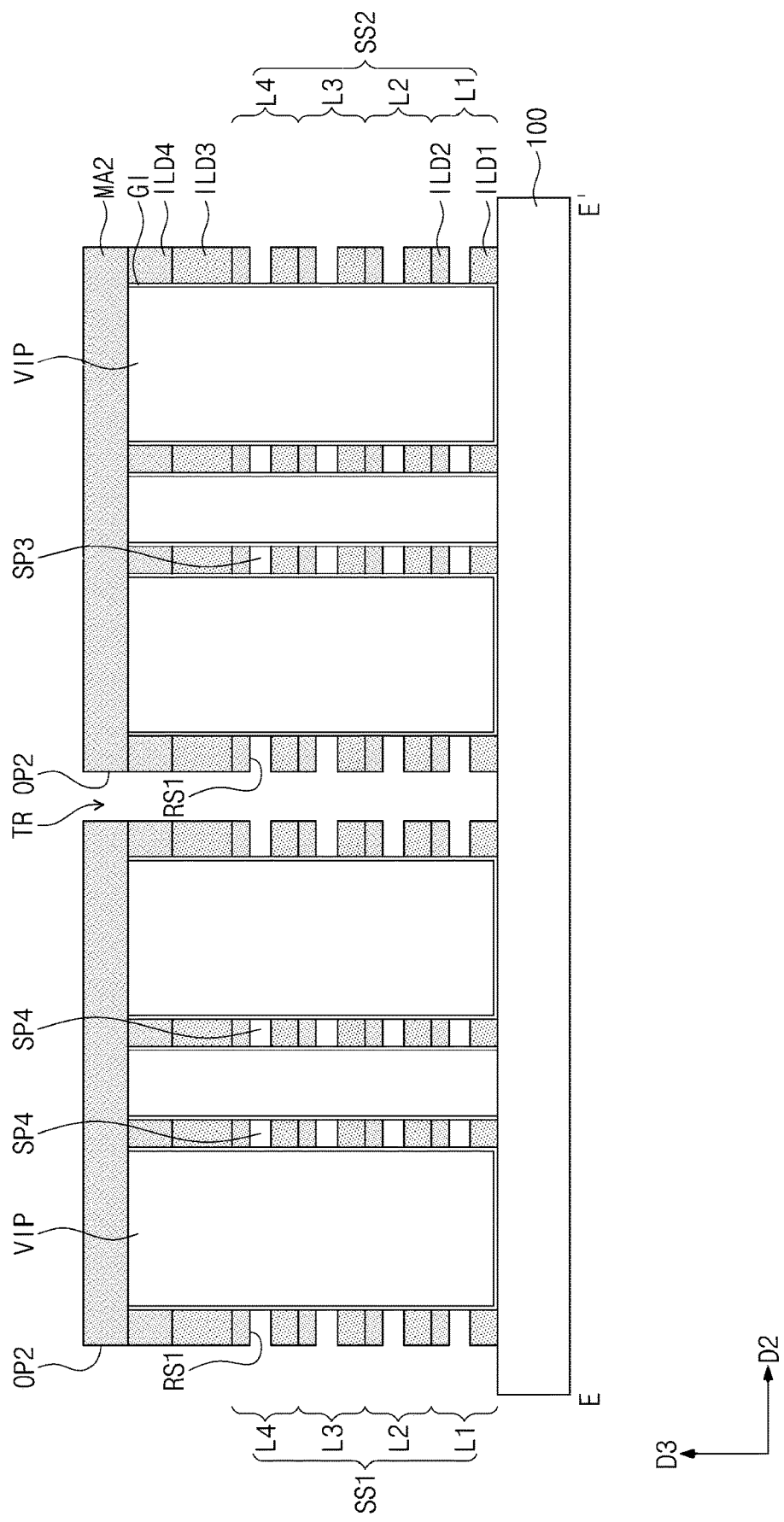
Figure 9A:
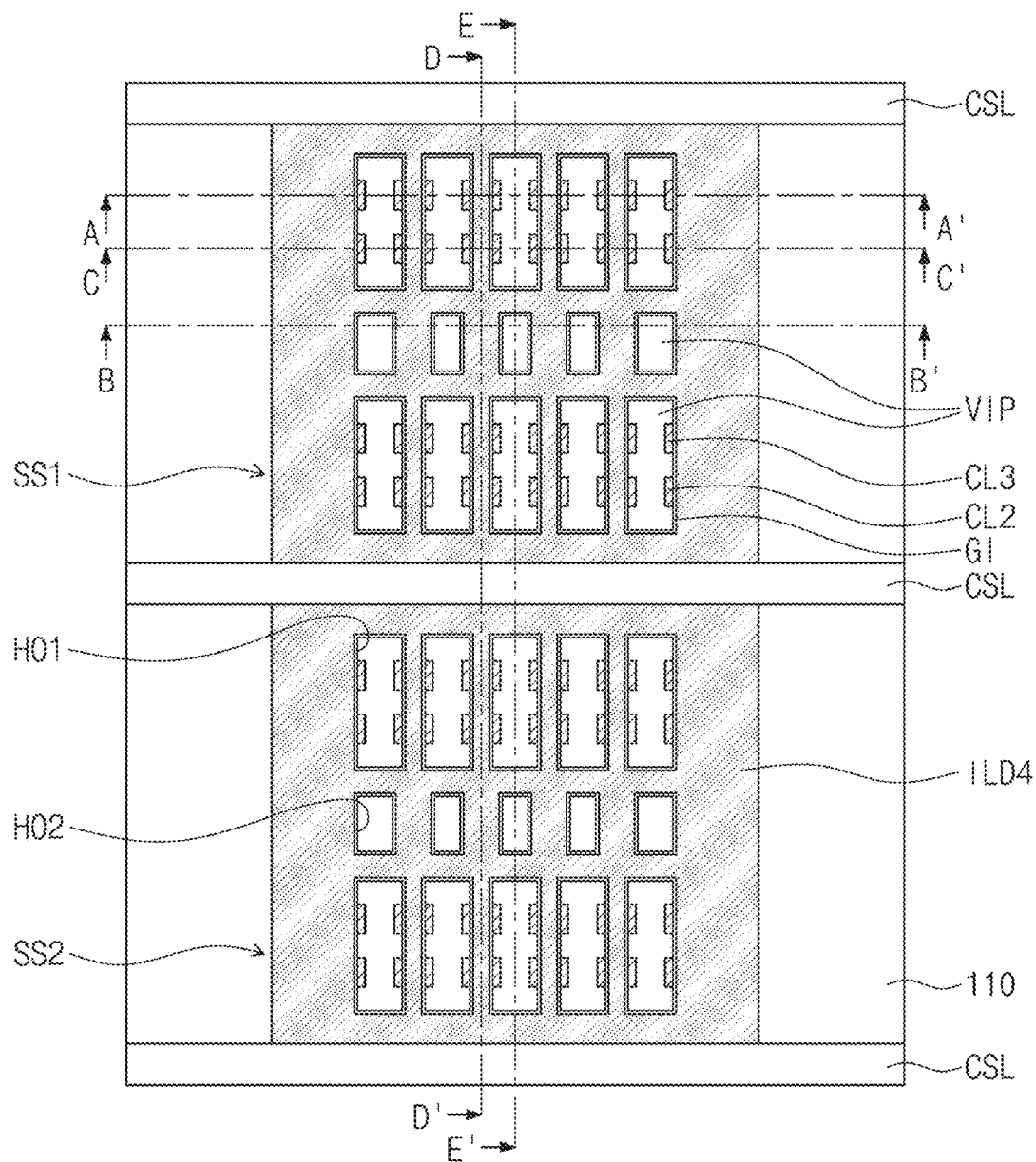
Figure 9C:
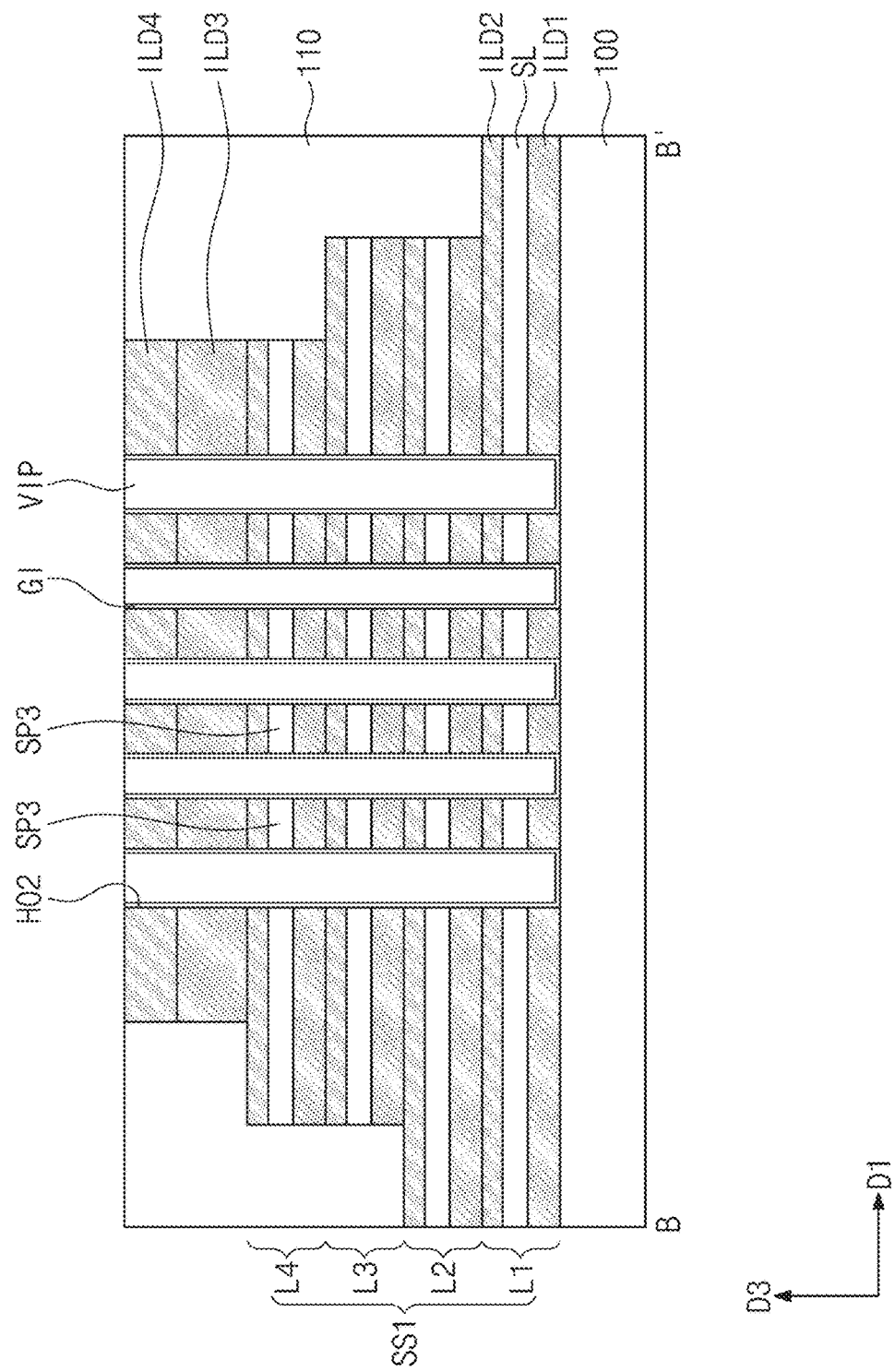
Figure 9E:
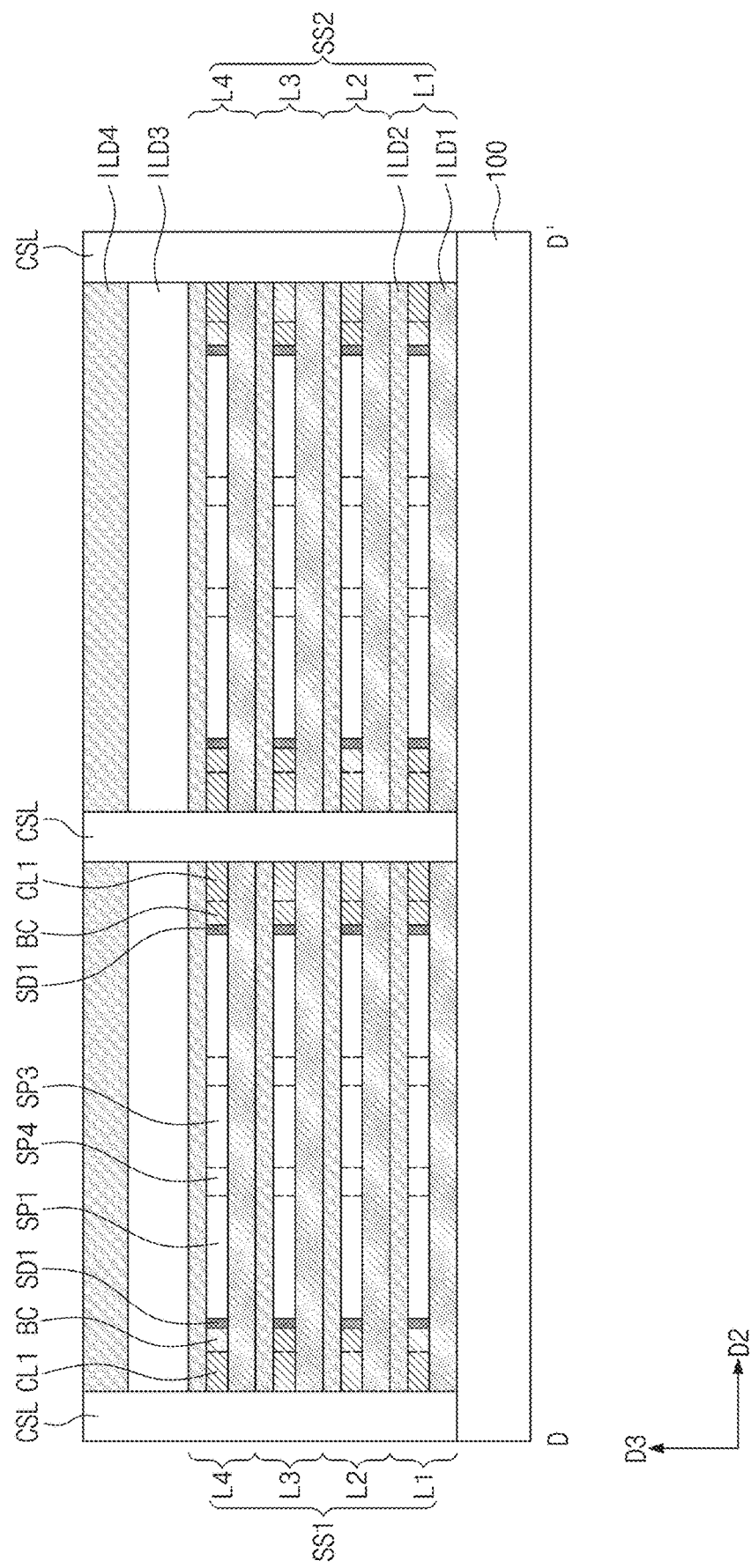
Figure 10A:
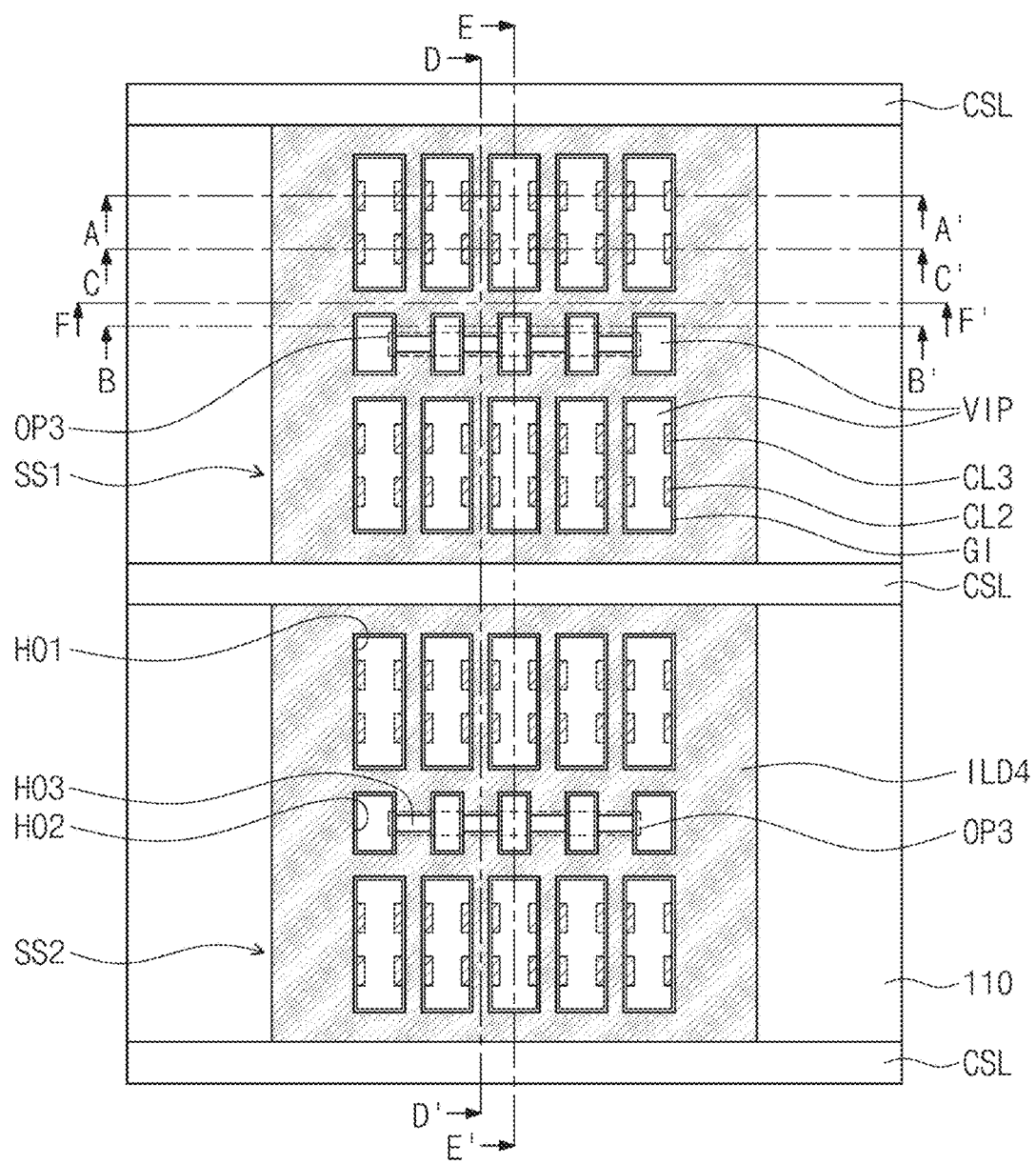
Figure 10A:
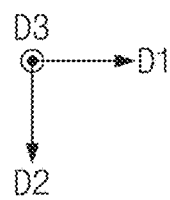
Figure 10B:
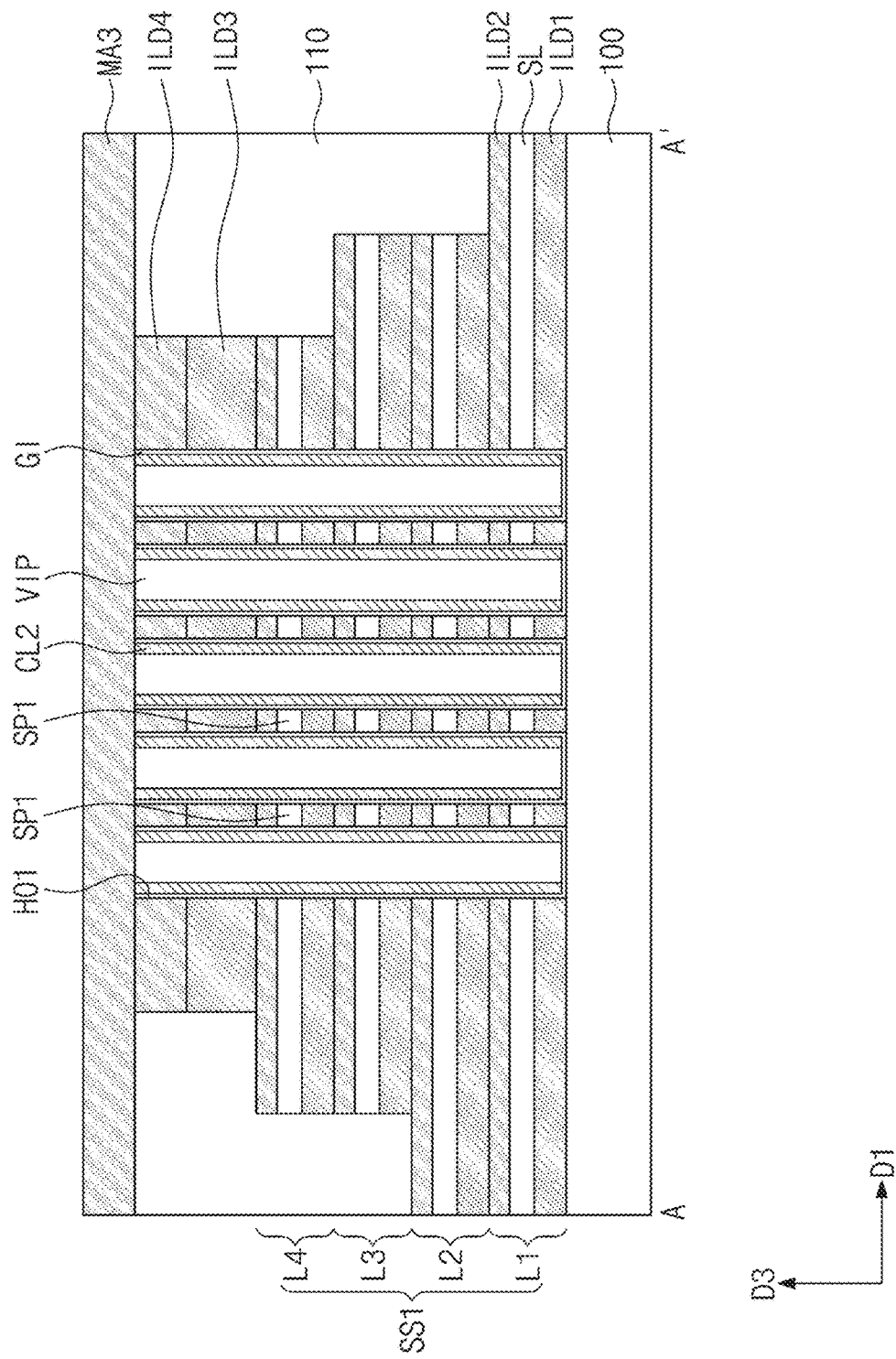
Figure 10C:
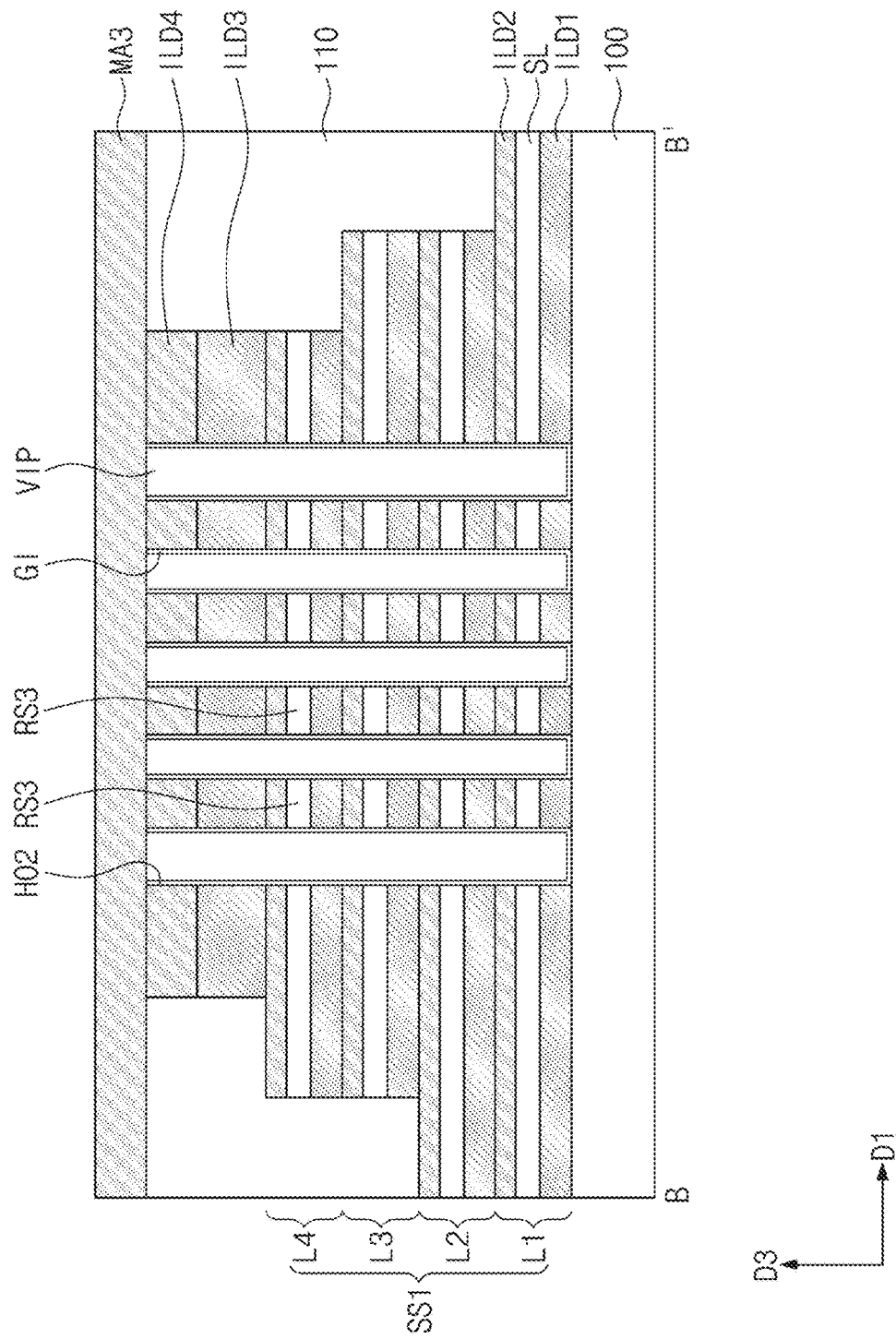
Figure 10D:
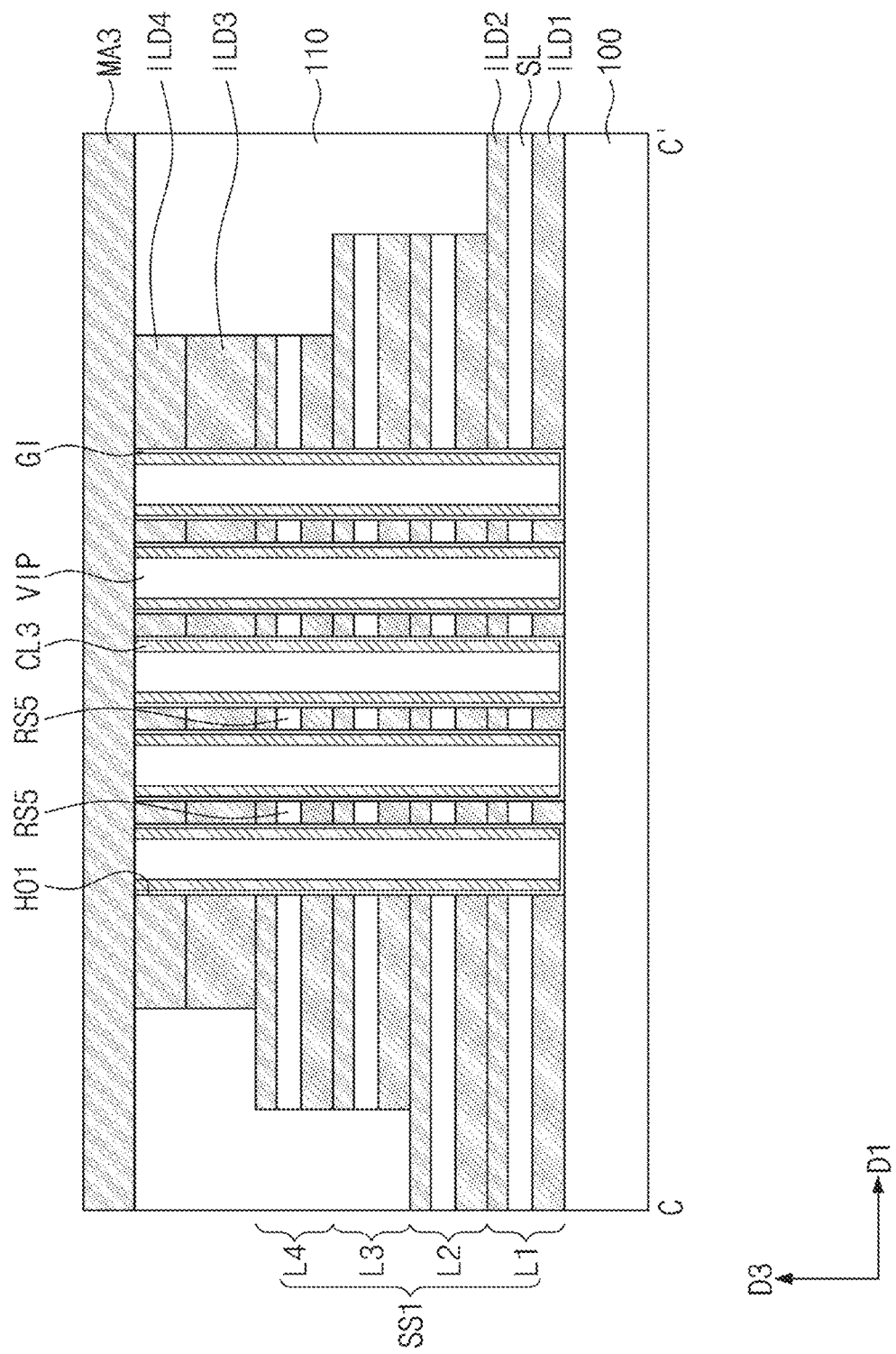
Figure 10E:
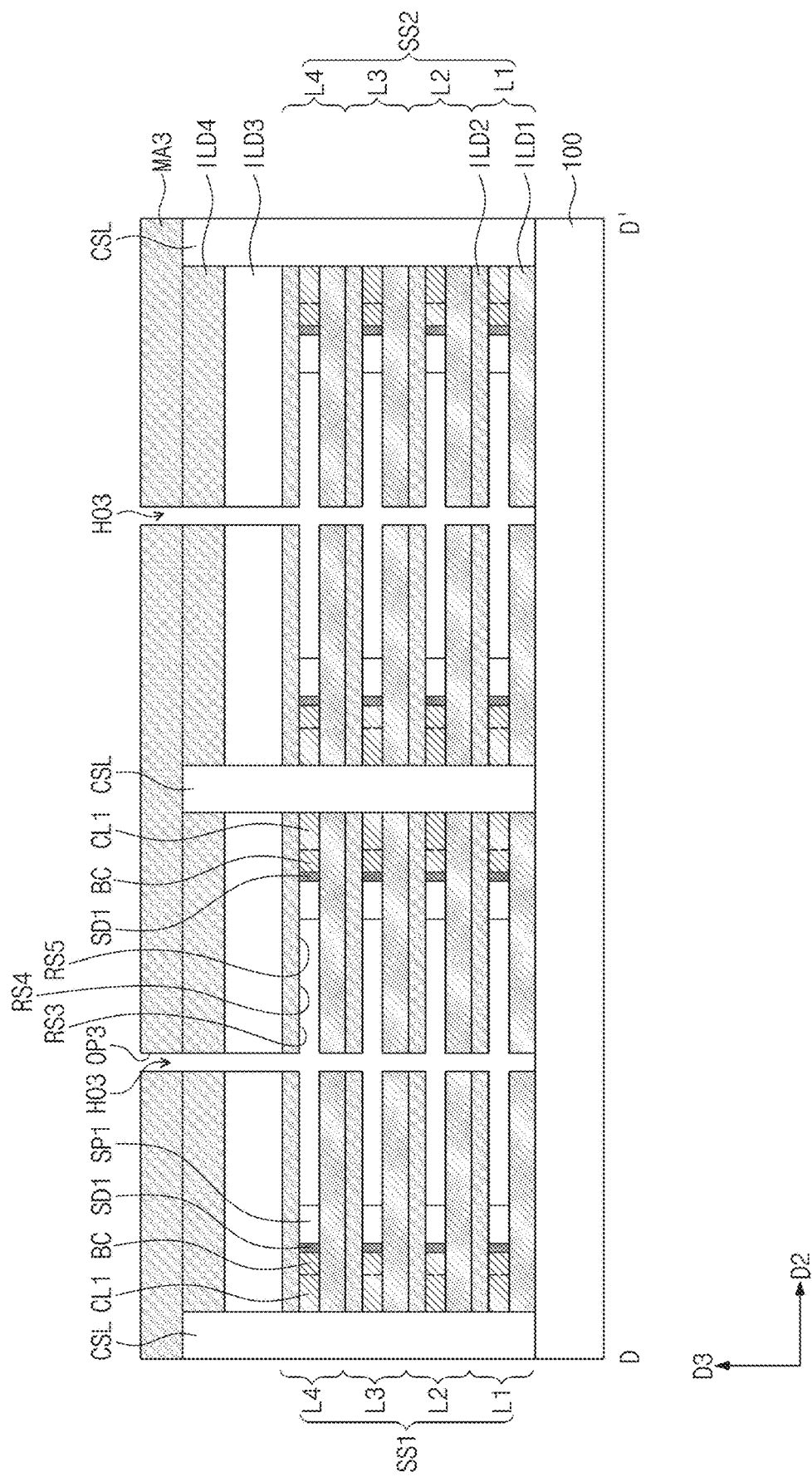

Referring to FIGS. 6A, 6B, and 6C, a gate insulating layer GI may be conformally formed on sidewalls of the mold structure MS that are exposed to the first and/or second holes HO1 and/or HO2. For example, a high-k dielectric material may be used to conformally form the gate insulating layer GI.

Preliminary conductive lines PCL may be formed to partially fill the first and/or second holes HO1 and/or HO2. The preliminary conductive lines PCL may be formed on the sidewalls of the mold structure MS that are exposed to the first and/or second holes HO1 and/or HO2.

The formation of the preliminary conductive lines PCL may include conformally forming a conductive layer on the gate insulating layer GI and performing an anisotropic etching process on the conductive layer. The conductive layer may be formed of metal (e.g., tungsten, titanium, tantalum, etc.).

After the preliminary conductive lines PCL are formed, a dielectric material IM may be deposited. The dielectric material IM may be formed to completely fill the first and/or second holes HO1 and/or HO2. The dielectric material IM may include one or more of silicon oxide, silicon nitride, and/or silicon oxynitride.

Referring to FIGS. 7A, 7B, 7C, and 7D, a planarization process may be performed on the dielectric material IM and/or the gate insulating layer GI until the interlayer dielectric layer 110 and/or the fourth insulating layer ILD4 are exposed on their top surfaces.

A first mask pattern MA1 including first openings OP1 may be formed on the interlayer dielectric layer 110 and/or the fourth insulating layer ILD4. When viewed in plan, the first openings OP1 may overlap the first and/or second holes HO1 and/or HO2.

The first mask pattern MA1 may include first closed regions CR1 and/or second closed regions CR2. The first and/or second closed regions CR1 and/or CR2 may be areas between the first openings OP1 adjacent to each other. The first and/or second closed regions CR1 and/or CR2 may extend in the first direction D1. The first closed regions CR1 may define locations in which are formed second conductive lines CL2 which will be discussed below. The second closed regions CR2 may define locations in which are formed third conductive lines CL3 which will be discussed below.

A removal process may be performed on the dielectric material IM exposed to the first openings OP1. The dielectric material IM may be removed by an anisotropic etching process. Accordingly, the dielectric material IM may not be removed but may remain below the first and/or second closed portions CR1 and/or CR2 of the first mask pattern MA1.

The preliminary conductive lines PCL exposed to the first openings OP1 may be removed to form second and/or third conductive lines CL2 and/or CL3. The preliminary conducive lines PCL may be removed by an anisotropic etching process. Accordingly, the preliminary conductive lines PCL may not be removed but may remain below the first and second closed portions CR1 and CR2 of the first mask pattern MA1. The remaining preliminary conductive lines PCL may constitute the second and/or third conductive lines CL2 and/or CL3. The anisotropic etching process may form the second conductive lines CL2 spaced apart from each other and also form the third conductive lines CL3 spaced apart from each other. Each of the second and/or third conductive lines CL2 and/or CL3 may have a linear shape extending in a vertical direction (e.g., the third direction D3). The remaining dielectric material IM may be interposed between a pair of second conductive lines CL2 adjacent to each other. The remaining dielectric material IM may be interposed between a pair of third conductive lines CL3 adjacent to each other.

Referring to FIGS. 8A, 8B, 8C, 8D, 8E, and 8F, the first mask pattern MA1 may be removed. An empty space in each of the first and/or second holes HO1 and/or HO2 may be additionally deposited with a dielectric material to form a vertical insulating pattern VIP filling each of the first and/or second holes HO1 and/or HO2. A planarization process may be performed to remove the dielectric material deposited on the interlayer dielectric layer 110 and/or the fourth insulating layer ILD4. For example, the additionally deposited dielectric material may include the same material or similar materials as that of the remaining dielectric material IM. For another example, the additionally deposited dielectric material may include a different material from that of the remaining dielectric material IM, but some example embodiments are not limited thereto.

The vertical insulating pattern VIP may be interposed between a pair of first semiconductor patterns SP1 adjacent to each other. The vertical insulating pattern VIP may be interposed between a pair of second conductive lines CL2 adjacent to each other. The vertical insulating pattern VIP may be interposed between a pair of third conductive lines CL3 adjacent to each other. The vertical insulating pattern VIP may be interposed between a pair of third semiconductor patterns SP3 adjacent to each other.

A second mask pattern MA2 may be formed on the mold structure MS. The second mask pattern MA2 may include second openings OP2 each of which has a linear shape extending in the first direction D1.

A patterning process may be performed in which the second mask pattern MA2 is used as an etching mask to pattern the mold structure MS to form a plurality of stack structures SS1 and SS2. For example, the mold structure MS may be patterned to form a first stack structure SS1 and a second stack structure SS2. The patterning process may define trenches TR between the stack structures SS1 and SS2. Each of the trenches TR may partially expose the top surface of the substrate 100. When viewed in plan, each of the trenches TR may have a linear shape extending in the first direction D1.

The trenches TR may expose sidewalls of the first and second stack structures SS1 and SS2. The semiconductor layer SL exposed to the trenches TR may be selectively etched to form first recesses RS1 and/or second recesses RS2. The selective etching of the semiconductor layer SL may be performed by an isotropic etching process that uses an etchant capable of selectively etching the semiconductor layer SL.

The isotropic etching process may include forming the first recesses RS1 by etching the semiconductor layer SL exposed to the trenches TR and/or forming the second recesses RS2 by etching the first semiconductor patterns SP1 exposed to the first recesses RS1.

The first recesses RS1 may extend in the first direction D1. The first recess RS1 may define a location in which is formed a first conductive line CL1 which will be discussed. One first recess RS1 may expose a plurality of first semiconductor patterns SP1.

The second recesses RS2 may be spaced apart in the first direction D1 from each other across the vertical insulating pattern VIP. The second recess RS2 may define a location in which is formed a bit contact BC which will be discussed below. A plurality of second recesses RS2 may be spatially connected to one first recess RS1. One second recess RS2 may expose one first semiconductor pattern SP1. The second recess RS2 may reduce a width in the second direction D2 of the first semiconductor pattern SP1.

Referring to FIGS. 9A, 9B, 9C, 9D, 9E, and 9F, first impurity regions SD1 may be formed by doping impurities into sidewalls of the first semiconductor patterns SP1, which sidewalls are exposed to the trenches TR, the first recesses RS1, and/or the second recesses RS2.

Bit contacts BC may be formed in the second recesses RS2. The bit contacts BC may be formed to fill corresponding second recesses RS2.

First conductive lines CL1 may be formed in the first recesses RS1. The first conductive lines CL1 may be formed to fill corresponding first recesses RS1. One first conductive line CL1 may be connected to a plurality of bit contacts BC.

The bit contacts BC and the first conductive lines CL1 may be formed at the same time or contemporaneously. For example, the formation of the bit contacts BC and the first conductive lines CL1 may include forming a conductive layer to fill the first and second recesses RS1 and RS2 and performing an isotropic etching process to selectively etch the conductive layer.

Common source lines CSL may be formed to fill the trenches TR. The common source line CSL may be interposed between the first and second stack structures SS1 and SS2. Each of the common source lines CSL may have a linear shape extending in the first direction D1. One common source line CSL may be connected to a plurality of first conductive lines CL1.

Referring to FIGS. 10A, 10B, 10C, 10D, 10E, 10F, and 10G, a third mask pattern MA3 including third openings OP3 may be formed on the first and/or second stack structures SS1 and/or SS2. Each of the third openings OP3 may have a linear or bar shape extending in the first direction D1. When viewed in plan, the third openings OP3 may run across the third semiconductor patterns SP3 of the stack structures SS1 and/or SS2.

An etching process may be performed in which the third mask pattern MA3 is used as an etching mask to etch the first and second stack structures SS1 and SS2. The etching process may selectively etch the fourth insulating layer ILD4, the third insulating layer ILD3, the second insulating layer ILD2, the first insulating layers ILD1, and/or the third semiconductor patterns SP3.

Third holes HO3 may be formed by the etching process using the third mask pattern MA3. The third holes HO3 may expose the top surface of the substrate 100. The third holes HO3 may be formed between the vertical insulating patterns VIP adjacent to each other in the first direction D1. The third hole HO3 may divide one third semiconductor patterns SP3 into two fifth semiconductor patterns. The third hole HO3 may be disposed between the two fifth semiconductor patterns spaced apart from each other in the second direction D2. The third holes HO3 may expose sidewalls of the fifth semiconductor patterns.

The semiconductor layer SL exposed to the third holes HO3 may be selectively etched to form third recesses RS3, fourth recesses RS4, and/or fifth recesses RS5.

The formation of the third, fourth, and/or fifth recesses RS3, RS4, and/or RS5 may include forming the third recesses RS3 by etching the fifth semiconductor patterns exposed to the third holes HO3, forming the fourth recesses RS4 by etching the fourth semiconductor patterns SP4 exposed to the third recesses RS3, and/or forming the fifth recesses RS5 by etching the first semiconductor patterns SP1 exposed to the fourth recesses RS4. A plurality of third recesses RS3 may be spatially connected to one fourth recess RS4. A plurality of fifth recesses RS5 may be spatially connected to one fourth recess RS4.

The third recesses RS3 may be spaced apart in the first direction D1 from each other across the vertical insulating pattern VIP. The third recess RS3 may define a location in which is formed a second semiconductor pattern SP2 which will be discussed.

The fourth recesses RS4 may extend in the first direction D1. The fourth recess RS4 may define a location in which is formed a fourth conductive line CL4 which will be discussed.

The fifth recesses RS5 may be spaced apart in the first direction D1 from each other across the vertical insulating pattern VIP. The fifth recess RS5 may define a location in which is formed a drain contact DC which will be discussed below. The fifth recess RS5 may reduce the width in the second direction D2 of the first semiconductor pattern SP1.

Referring to FIGS. 11A, 11B, 11C, 11D, 11E, 11F, and 11G, second impurity regions SD2 may be formed by doping impurities into sidewalls of the first semiconductor patterns SP1, which sidewalls are exposed to the third holes HO3, the third recesses RS3, the fourth recesses RS4, and/or the fifth recesses RS5. A first channel CH1 may be defined between the first and second impurity regions SD1 and SD2.

Drain contacts DC may be formed in the fifth recesses RS5. The drain contacts DC may be formed to fill corresponding fifth recesses RS5.

Fourth conductive lines CL4 may be formed in the fourth recesses RS4. The fourth conductive lines CL4 may be formed to fill corresponding fourth recesses RS4.

The drain contacts DC and the fourth conductive lines CL4 may be formed at the same time or contemporaneously. For example, the formation of the drain contacts DC and the fourth conductive lines CL4 may include forming a conductive layer to fill the fourth and fifth recesses RS4 and RS5 and performing an isotropic etching process to selectively etch the conductive layer.

A gate insulating layer GI may be formed on each lateral surface of the fourth conductive lines CL4 that is exposed to the third recess RS3.

Second semiconductor patterns SP2 may be formed in the third recesses RS3. The second semiconductor patterns SP2 may be formed to fill corresponding third recesses RS3.

An empty space of each of the third holes HO3 may be deposited with a dielectric material to form a vertical insulating pattern VIP filling the each of the third hole HO3.

A fourth mask pattern MA4 including fourth openings OP4 may be formed on the first and/or second stack structures SS1 and/or SS2. Each of the fourth openings OP4 may have a linear or bar shape extending in the first direction D1.

When viewed in plan, the fourth openings OP4 may run across the second semiconductor patterns SP2 of the stack structures SS1 and/or SS2.

An etching process may be performed in which the fourth mask pattern MA4 is used as an etching mask to etch the first and/or second stack structures SS1 and/or SS2. The etching process may selectively etch the vertical insulating pattern VIP and/or the gate insulating layer GI.

Fourth holes HO4 may be formed by the etching process using the fourth mask pattern MA4. The fourth holes HO4 may expose the top surface of the substrate 100. Two fourth holes HO4 adjacent to each other in the second direction D2 may be spaced apart across the vertical insulating pattern VIP. Two fourth holes HO4 adjacent to each other in the first direction D1 may be spaced apart across the second semiconductor pattern SP2. The fourth holes HO4 may expose sidewalls of the second semiconductor patterns SP2.

Referring back to FIGS. 3A, 3B, 3C, 3D, 3D, 3E, 3F, and 3G, third impurity regions SD3 and fourth impurity regions SD4 may be formed by doping impurities into the sidewalls of the second semiconductor patterns SP2, which sidewalls are exposed to the fourth holes HO4. A second channel CH2 may be defined between the third and fourth impurity regions SD3 and SD4.

Fifth conductive lines CL5 may be formed on opposite sidewalls of each of the second semiconductor patterns SP2. The formation of the fifth conductive lines CL5 may include forming preliminary conductive lines in the fourth holes HO4 and/or using a mask pattern to remove the preliminary conductive lines except for the fifth conductive lines CL5.

The fifth conductive lines CL5 may be formed spaced apart from each other. Each of the fifth conductive lines CL5 may have a linear shape extending in a vertical direction (e.g., the third direction D3). A vertical insulating pattern VIP may be formed to completely fill the fourth hole HO4. The vertical insulating pattern VIP may be interposed between a pair of fifth conductive lines CL5 adjacent to each other.

Figure 12A:
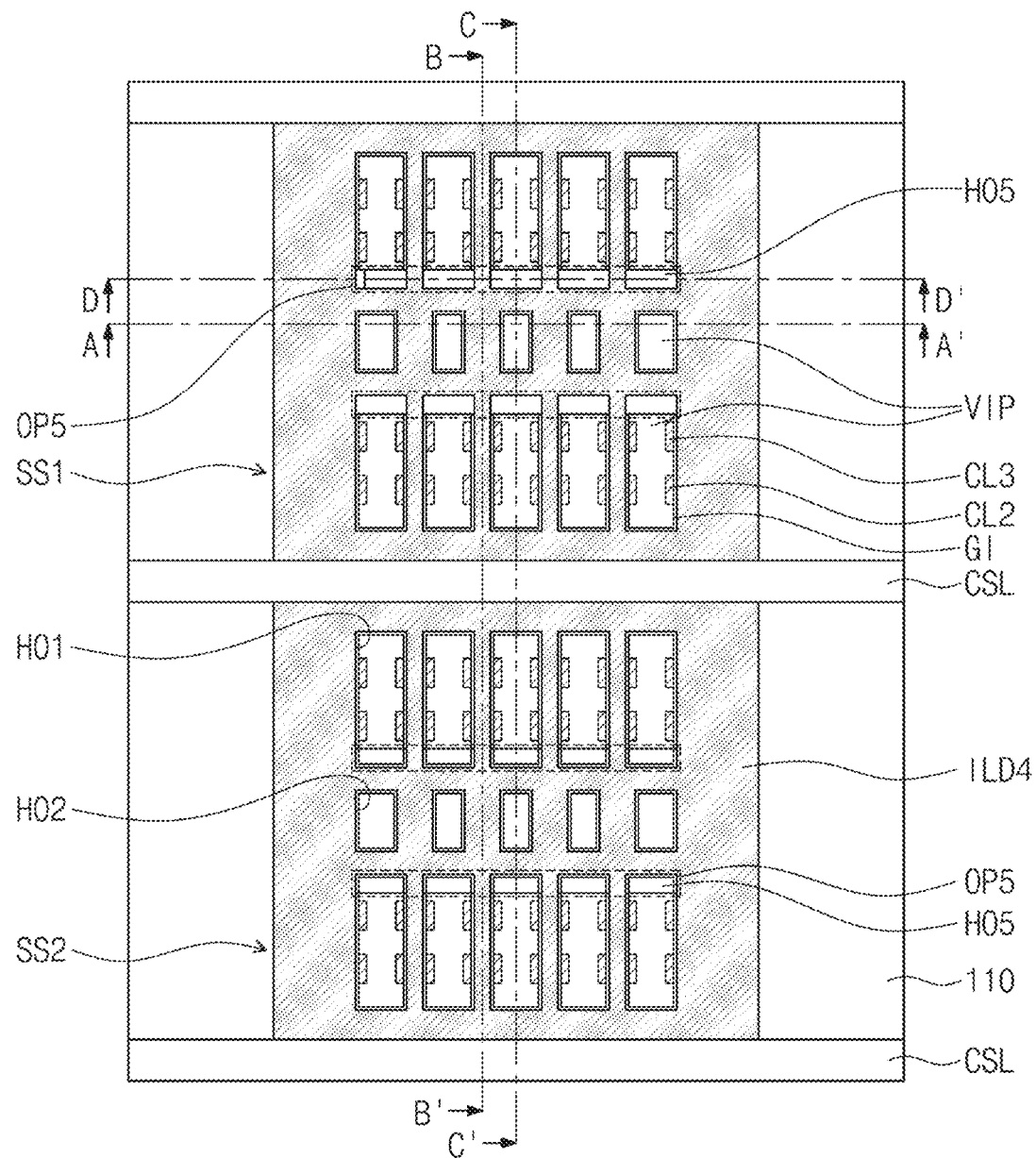
FIG. 12A illustrates a plan view showing a three-dimensional semiconductor memory device according to some example embodiments.
Figure 12A:
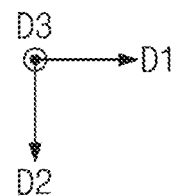
Figure 12B:
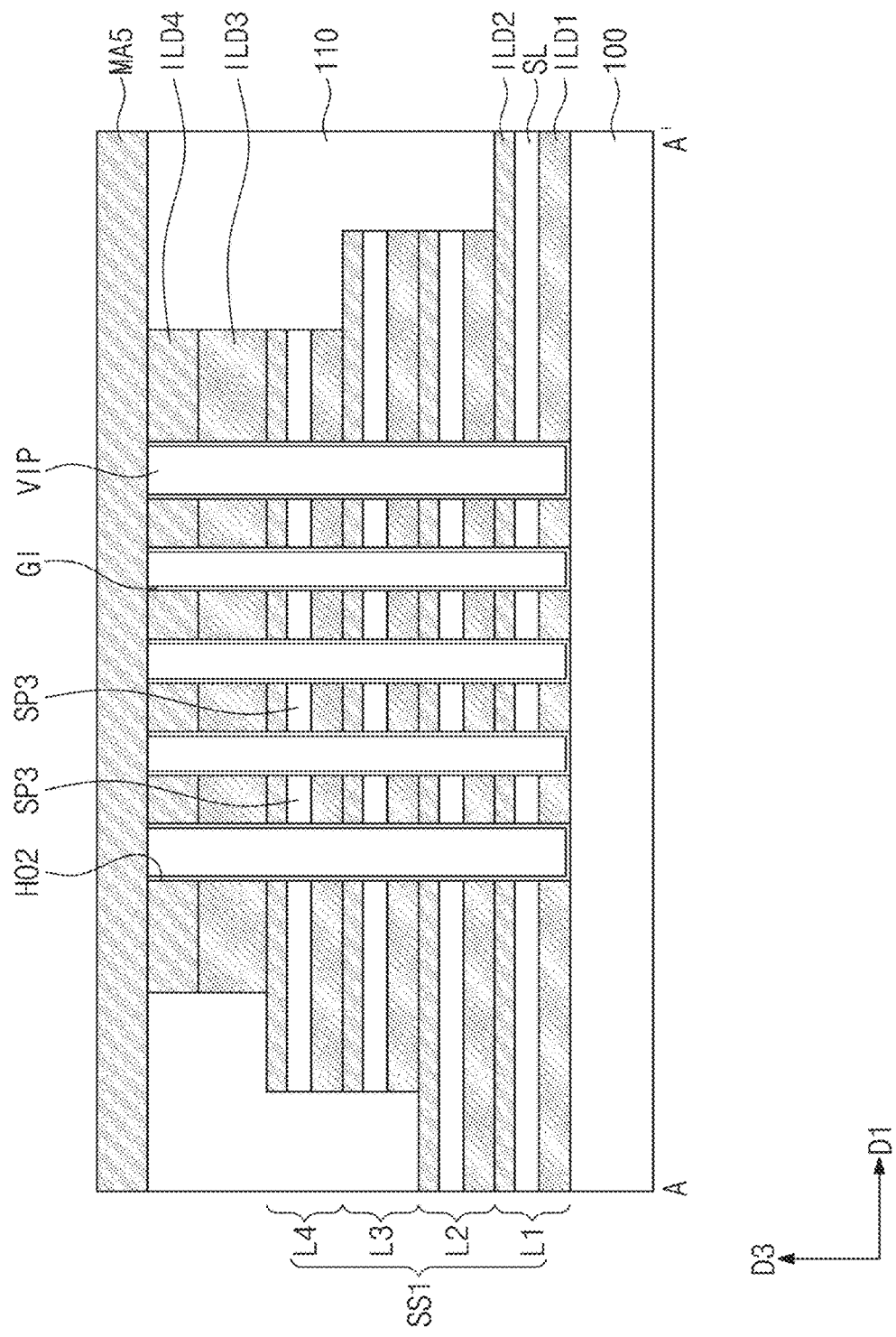
Figure 12C:
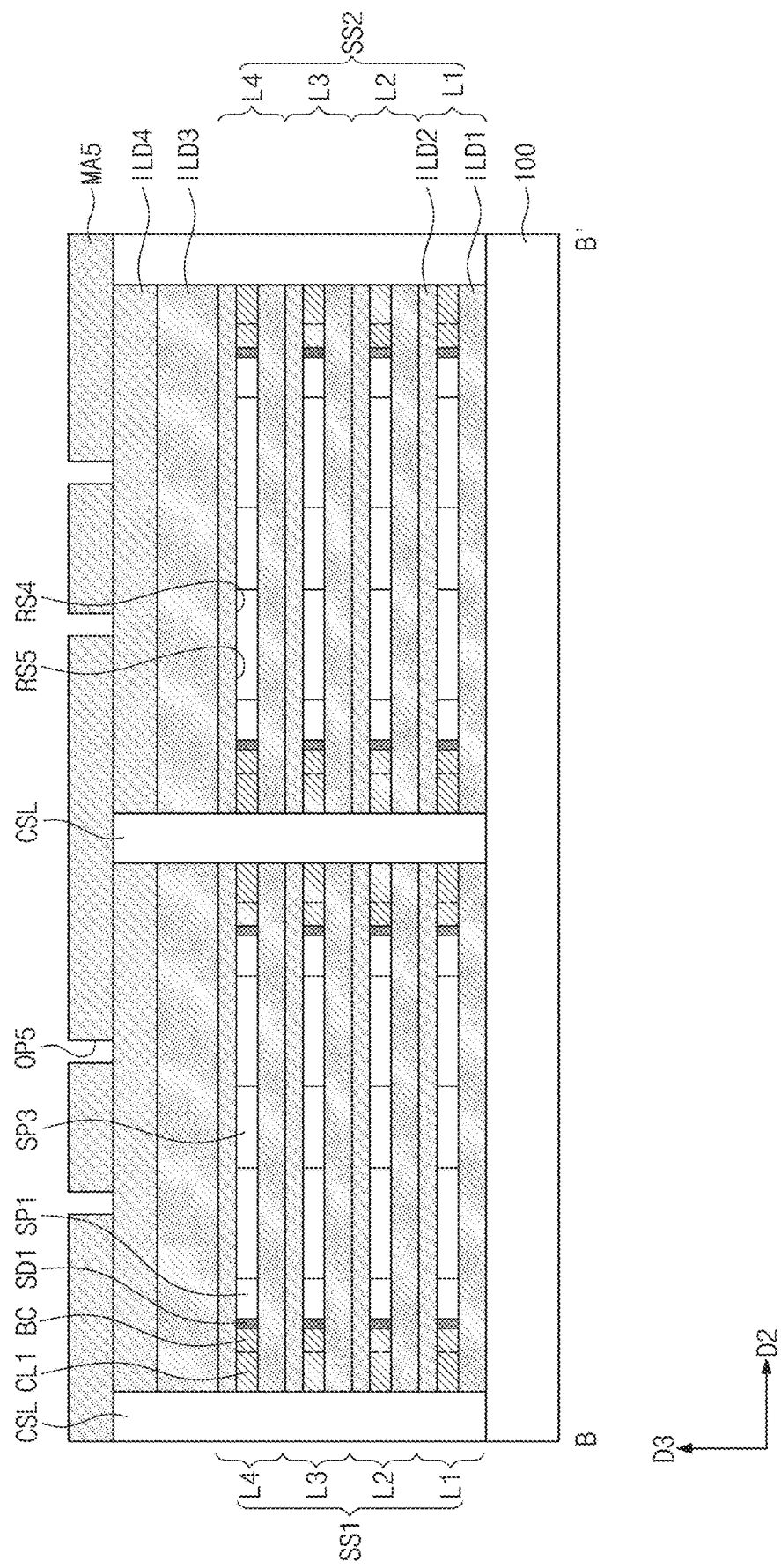
Figure 12D:
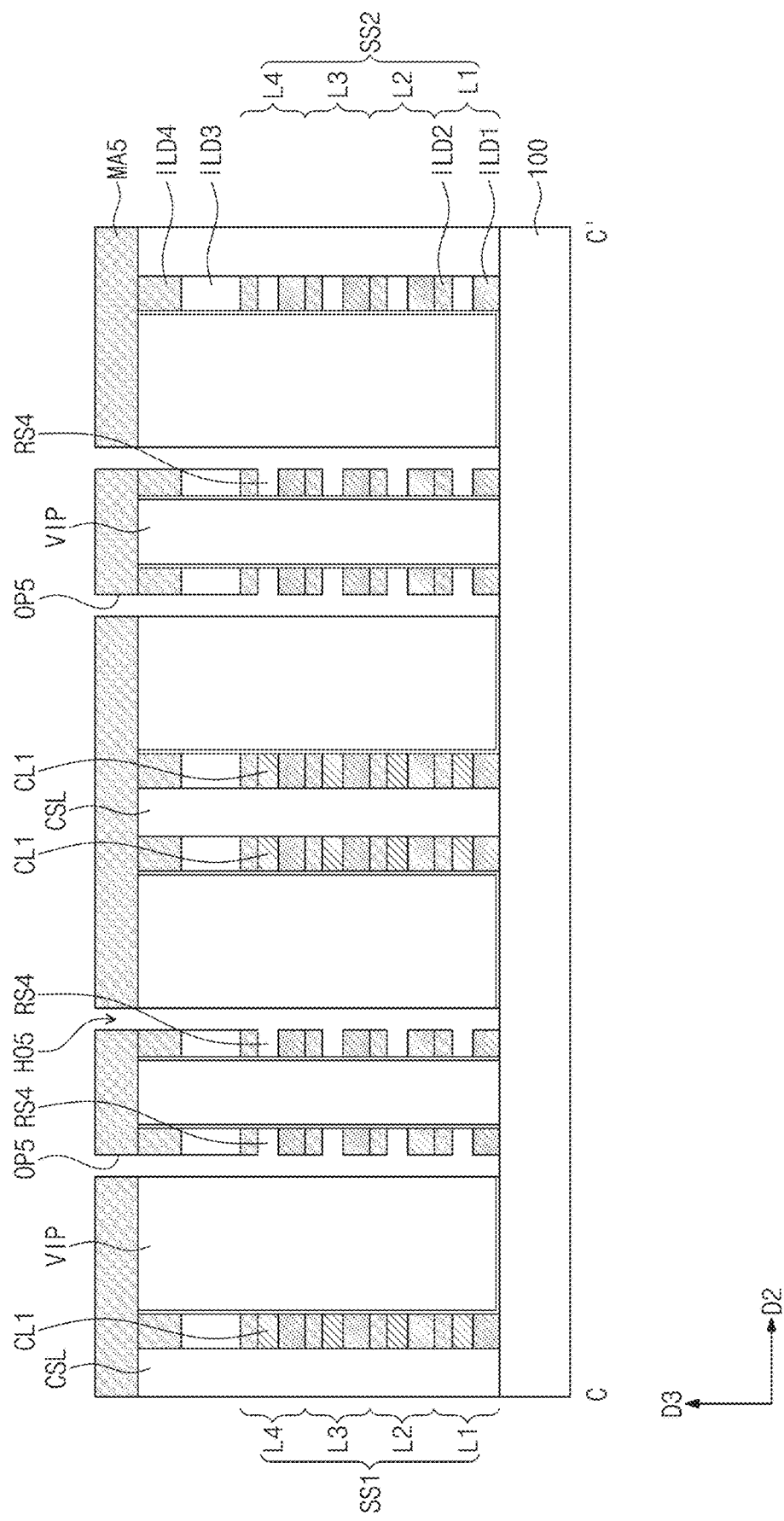

FIG. 12A illustrates a plan view showing a three-dimensional semiconductor memory device according to some example embodiments. FIGS. 12B, 12C, 12D, and 12E illustrate cross-sectional views respectively taken along lines A-A', B-B', C-C', and D-D' of FIG. 12A.

Referring to FIGS. 12A, 12B, 12C, 12C, 12D, and 12E, a fifth mask pattern MA5 including fifth openings OP5 may be formed on the first and/or second stack structures SS1 and/or SS2 that are formed as discussed above with reference to FIGS. 9A, 9B, 9C, 9D, 9E, and 9F. Each of the fifth openings OP5 may have a linear or bar shapes extending in the first direction D1. When viewed in plan, the fifth openings OP5 may run across the first semiconductor patterns SP1 of the stack structures SS1 and/or SS2.

An etching process may be performed in which the fifth mask pattern MA5 is used as an etching mask to etch the first and/or second stack structures SS1 and/or SS2. The etching process may selectively etch the vertical insulating pattern VIP and/or the gate insulating layer GI.

Fifth holes HO5 may be formed by the etching process using the fifth mask pattern MA5. The fifth holes HO5 may expose the top surface of the substrate 100. The fifth hole HO5 may overlap a portion of the first hole HO1. For example, the formation of the fifth hole HO5 may remove the vertical insulating pattern VIP and/or the gate insulating layer GI from the first hole HO1, with the result that the first hole HO1 may be opened again.

The fifth holes HO5 may expose sidewalls of the fourth semiconductor patterns SP4 and/or sidewalls of the first semiconductor patterns SP1.

The semiconductor layer SL exposed to the fifth holes HO5 may be selectively etched to form fourth recesses RS4 and/or fifth recesses RS5.

The formation of the fourth and/or fifth recesses RS4 and RS5 may include forming the fourth recesses RS4 by etching the fourth semiconductor patterns SP4 exposed to the fifth holes HO5 and/or forming the fifth recesses RS5 by etching the first semiconductor patterns SP1 exposed to the fifth holes HO5.

The fourth recesses RS4 may extend in the first direction D1. The fourth recess RS4 may define a location in which is formed a fourth conductive line CL4 which will be discussed. One fourth recess RS4 may be spatially connected to a plurality of fifth holes HO5. The fourth recesses RS4 may expose sidewalls of the third semiconductor patterns SP3.

The fifth recesses RS5 may be spaced apart in the first direction D1 from each other across the vertical insulating pattern VIP. The fifth recesses RS5 may be spaced apart in the first direction D1 from each other across the fifth hole HO5 (see FIG. 12E). The fifth recess RS5 may define a location in which is formed a drain contact DC which will be discussed below. A plurality of fifth recesses RS5 may be spatially connected to one fourth recess RS4. The fifth recess RS5 may reduce the width in the second direction D2 of the first semiconductor pattern SP1.

Referring back to FIGS. 3B, 3C, 3D, 3E, 3F, and 3G, second impurity regions SD2 may be formed by doping impurities into the sidewalls of the first semiconductor patterns SP1. A gate insulating layer GI may be formed on sidewalls of the third semiconductor patterns SP3. A drain contact DC may be formed to fill the fifth recess RS5. A fourth conductive line CL4 may be formed to fill the fourth recess RS4. The third semiconductor pattern SP3 may be patterned into two second semiconductor patterns SP2. The second semiconductor patterns SP2 may be exposed on their sidewalls. Third and/or fourth impurity regions SD3 and/or SD4 may be formed by doping impurities into the sidewalls of the second semiconductor patterns SP2. Fifth conductive lines CL5 may be formed on the sidewalls of the second semiconductor patterns SP2.

Spatially relative terms, such as "beneath," "below," "lower," "above," "upper," "vertical," "side," and the like, may be used herein for ease of description to describe one element or feature's relationship to another element(s) or feature(s) as illustrated in the figures. For example, as used herein, the terms "upper," "higher," "on" and/or "top" may refer to an element or feature further in the third direction D3 with respect to another element or feature, and the terms "lower" and/or "below" may refer to an element or feature further in a direction opposite the third direction D3 with respect to another element or feature. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it can be directly connected or coupled to the other element or intervening elements may be present. As used herein the term "and/or" includes any and all combinations of one or more of the associated listed items.

Some example embodiments are described herein with reference to cross-sectional illustrations that are schematic illustrations of idealized examples (and intermediate structures) of some example embodiments. As such, variations from the shapes of the illustrations as a result, for example, of manufacturing techniques and/or tolerances, are to be expected. Thus, some example embodiments should not be construed as limited to the particular shapes of regions illustrated herein but are to include deviations in shapes that result, for example, from manufacturing.

According to some example embodiments, a three-dimensional semiconductor memory device may include memory cell transistors three-dimensionally stacked on a substrate. Therefore, the three-dimensional semiconductor memory device may increase in integration. The three-dimensional semiconductor memory device according to some example embodiments may be applicable to cryogenic computing performed at a temperature below about 100K.

Although some example embodiments have been discussed with reference to accompanying figures, it will be understood that various changes in form and details may be made therein without departing from the spirit and scope of some example embodiments. It therefore will be understood that the some example embodiments described above are just illustrative but not limitative in all aspects.

What is claimed is:

1. A semiconductor memory device, comprising:
   a stack structure including a plurality of layers vertically stacked on a substrate, each of the plurality of layers including,
      a first bit line extending in a first direction,
      a gate line extending in the first direction,
      a first semiconductor pattern extending in a second direction between the first bit line and the gate line, the second direction intersecting the first direction, and
      a second semiconductor pattern adjacent to the gate line across a first gate insulating layer, the second semiconductor pattern extending in the first direction;
   a first word line adjacent to a side of the first semiconductor pattern and vertically extending in a third direction from the substrate, the third direction being perpendicular to the first and the second directions;
   a second bit line connected to a first end of the second semiconductor pattern and vertically extending in the third direction from the substrate; and
   a second word line connected to a second end of the second semiconductor pattern and vertically extending in the third direction, the second end being opposite to the first end.

2. The semiconductor memory device of claim 1, wherein the first bit line is connected through a bit contact to the first semiconductor pattern.

3. The semiconductor memory device of claim 1, wherein the gate line is connected through a drain contact to the first semiconductor pattern.

4. The semiconductor memory device of claim 1, wherein the first word line is spaced apart from the first semiconductor pattern with a second gate insulating layer therebetween.

5. The semiconductor memory device of claim 1, wherein the second bit line is in contact with the second semiconductor pattern.

6. The semiconductor memory device of claim 1, wherein the second word line is in contact with the second semiconductor pattern.

7. The semiconductor memory device of claim 1, further comprising:
   a capacitor electrode vertically extending in the third direction between the first word line and the gate line.

8. A semiconductor memory device, comprising:
   a stack structure including a plurality of layers vertically stacked on a substrate, each of the plurality of layers including,
      a first bit line extending in a first direction,
      a gate line extending in the first direction,
      a first semiconductor pattern connected to the first bit line and the gate line, and
      a second semiconductor pattern adjacent to the gate line across a first gate insulating layer;
   a first word line adjacent to a side of the first semiconductor pattern across a second gate insulating layer, the first word line vertically extending from the substrate;
   a capacitor electrode adjacent to a contact across a dielectric layer, the capacitor electrode vertically extending from the substrate, the contact connected to the first semiconductor pattern;
   a second bit line connected to a first end of the second semiconductor pattern and vertically extending from the substrate; and
   a second word line connected to a second end of the second semiconductor pattern and vertically extending from the substrate, the second end being opposite to the first end.

9. The semiconductor memory device of claim 8, further comprising:
   a pair of first word lines including the first word line, the pair of first word lines being provided on opposite sides of the first semiconductor pattern.

10. The semiconductor memory device of claim 8, further comprising:
    a pair of stack structures including the stack structure; and
    a common source line between the pair of stack structures adjacent to each other, the common source line connected to the first bit line.

11. The semiconductor memory device of claim 8, wherein
    the first semiconductor pattern includes a first impurity region, a second impurity region, and a first channel between the first and second impurity regions;
    the first bit line is connected to the first impurity region; and
    the gate line is connected to the second impurity region.

12. The semiconductor memory device of claim 8, wherein
    the second semiconductor pattern includes a third impurity region, a fourth impurity region, and a second channel between the third and fourth impurity regions;
    the second bit line is connected to the third impurity region; and
    the second word line is connected to the fourth impurity region.

13. The semiconductor memory device of claim 8, wherein
    each of the plurality of layers further includes a first insulating layer and a second insulating layer spaced apart from each other; and
    the first bit line, the gate line, and the first and second semiconductor patterns are interposed between the first insulating layer and the second insulating layer.

14. The semiconductor memory device of claim 8, wherein the dielectric layer and the second gate insulating layer include a same material.

15. A semiconductor memory device, comprising:
a stack structure including a plurality of layers vertically stacked on a substrate, each of the plurality of layers including,
a first conductive line extending in a first direction,
a second conductive line extending in the first direction,
first semiconductor patterns extending in a second direction between the first and second conductive lines, the second direction intersecting the first direction, each of the first semiconductor patterns disposed in the first direction, and
second semiconductor patterns adjacent to the second conductive line, each of the second semiconductor patterns disposed in the first direction; and
third conductive lines between the first and second conductive lines and vertically extending in a third direction from the substrate, the third direction being perpendicular to the first and the second directions, a pair of the third conductive lines provided on opposite sides of one of the first semiconductor patterns therebetween.

16. The semiconductor memory device of claim 15, further comprising:
a pair of fourth conductive lines vertically extending from the substrate and provided on opposite sides of one of the first semiconductor patterns.

17. The semiconductor memory device of claim 16, further comprising:
a pair of fifth conductive lines vertically extending from the substrate and provided on opposite sides of one of the second semiconductor patterns.

18. The semiconductor memory device of claim 15, further comprising:
a pair of stack structures including the stack structure; and
a common source line between the pair of stack structures adjacent to each other.

19. The semiconductor memory device of claim 15, wherein the first conductive line is connected through a bit contact to the first semiconductor patterns.

20. The semiconductor memory device of claim 15, wherein the second conductive line is connected through a drain contact to the first semiconductor patterns.

* * * * *